(12) United States Patent
Mitsuda et al.

(10) Patent No.: US 7,087,474 B2
(45) Date of Patent: Aug. 8, 2006

(54) SEMICONDUCTOR DEVICE AND A METHOD OF MANUFACTURING THE SAME

(75) Inventors: Katsuhiro Mitsuda, Koganei (JP); Mitsuharu Honda, Ome (JP); Akira Iizuka, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 178 days.

(21) Appl. No.: 10/739,319

(22) Filed: Dec. 19, 2003

(65) Prior Publication Data

US 2004/0132249 A1 Jul. 8, 2004

(30) Foreign Application Priority Data

Dec. 19, 2002 (JP) ............................. 2002-368298
Aug. 29, 2003 (JP) ............................. 2003-306388

(51) Int. Cl.
*H01L 21/336* (2006.01)
*H01L 21/8234* (2006.01)

(52) U.S. Cl. ..................... 438/197; 438/603; 438/604

(58) Field of Classification Search ............... 438/197, 438/149, 167, 602, 603, 604, 680, 681, 685, 438/692, 700, 712, 933

See application file for complete search history.

(56) References Cited

U.S. PATENT DOCUMENTS

| | | | | |
|---|---|---|---|---|
| 5,382,809 A | * | 1/1995 | Nishibayashi et al. | ......... 257/77 |
| 6,437,406 B1 | * | 8/2002 | Lee | ............................. 257/349 |
| 6,682,965 B1 | * | 1/2004 | Noguchi et al. | ............. 438/199 |
| 6,955,973 B1 | * | 10/2005 | Niwa | .......................... 438/431 |

FOREIGN PATENT DOCUMENTS

JP 2000-082678 3/2000

* cited by examiner

*Primary Examiner*—David Nhu
(74) *Attorney, Agent, or Firm*—Antonelli, Terry, Stout and Kraus, LLP.

(57) ABSTRACT

A method of manufacturing a semiconductor device having a field effect transistor with improved current driving performance (increase of drain current) includes the steps of ion implanting a group IV element from the main surface to the inside of a silicon layer serving as a semiconductor substrate to a level shallower than the implantation depth of the impurities in the step of forming the semiconductor region before the step of ion implanting impurities from the main surface to the inside of the silicon layer serving as a semiconductor substrate so as to form a semiconductor region which is aligned with the gate electrode.

18 Claims, 48 Drawing Sheets

COMPARISON OF As PROFILES FOR WITH AND WITHOUT PRE-ADDITION OF Ge

COMPARISON OF B PROFILES FOR WITH AND
WITHOUT PRE-ADDITION OF Ge ($BF_2$ IMPLANTATION)

COMPARISON OF B PROFILES FOR WITH AND
WITHOUT PRE-ADDITION OF Ge (B IMPLANTATION)

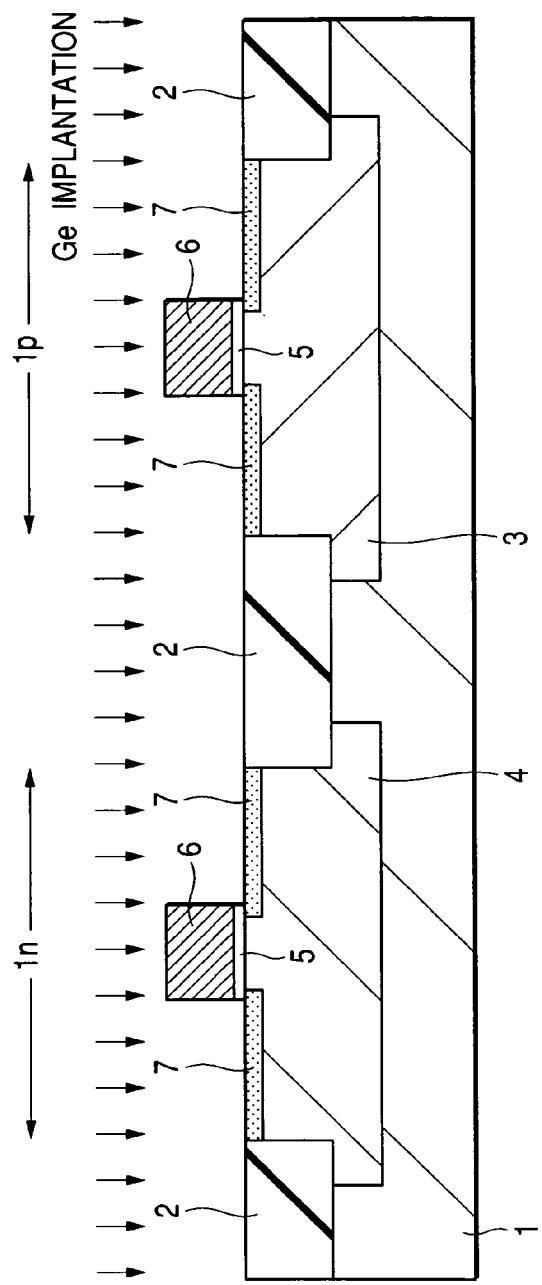
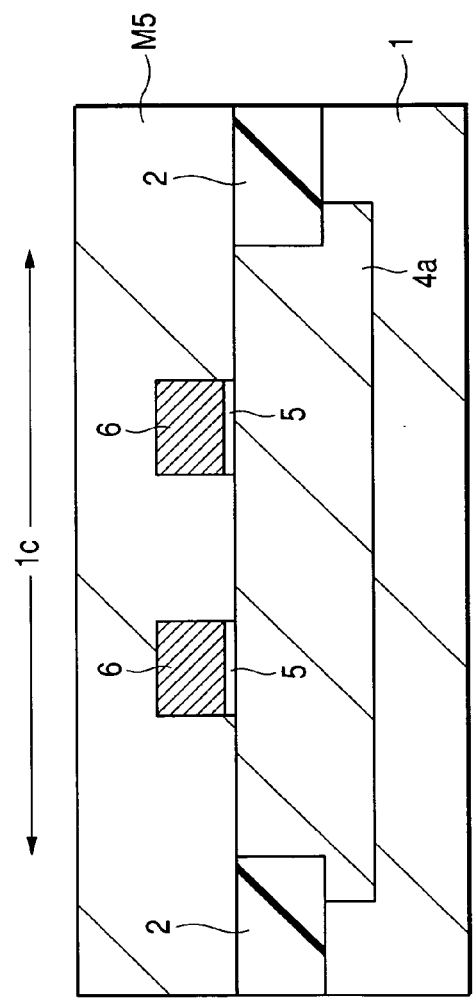
FIG. 27(a)
FIG. 27(b)

SEMICONDUCTOR DEVICE AND A METHOD OF MANUFACTURING THE SAME

BACKGROUND OF THE INVENTION

The present invention relates in general to a semiconductor device and a method of manufacturing the same; and, more particularly, it relates to a technique that is effective in the manufacture of semiconductor devices having field effect transistors.

As one example of field effect transistors that are mounted on semiconductor devices, insulated gate field effect transistors, referred to as MISFETs (Metal Insulator Semiconductor Field Effect Transistor), have been known. Since the MISFETs have the characteristic that they can be adapted easily for high integration, they have been used generally as transistor devices constituting integrated circuits.

A MISFET generally has a constitution comprising a channel forming region, a gate insulating film, a gate electrode, a source region and a drain region. The gate insulating film is disposed to a device forming region on the main surface (device forming surface, circuit forming surface) of a semiconductor substrate, and it is formed, for example, as a silicon oxide film. The gate electrode is disposed by way of the gate insulating film on the device forming region of the main surface of the semiconductor substrate, and it is formed, for example, as a polycrystal silicon film that has been introduced with impurities for reducing the resistance value. The channel forming region is disposed in a region of the semiconductor substrate opposing the gate electrode (region just below the gate electrode). The source region and the drain region are formed of a pair of semiconductor regions (impurity diffusion regions) disposed on both sides of the channel forming region in the direction of the channel length so that the channel forming region is disposed therebetween.

A MISFET having a gate insulating film made of a silicon oxide film is usually referred to as a MOSFET (Metal Oxide Semiconductor Field Effect Transistor). Further, the channel forming region is a region in which a current channel (channel) connecting the source region and the drain region is formed. Further, those devices in which current flows along the direction of the thickness (direction of depth) of the semiconductor substrate is referred to as a vertical type and those devices in which current flows in the direction of a plane (direction of surface) of the semiconductor substrate are referred to as a horizontal type. Further, those devices in which a channel for electrons (conduction channel) is formed to the channel forming region between the source region and the drain region are referred to as an n-channel conductivity type (simply as n-type), while those devices in which a channel for holes is formed thereto are referred to as a p-channel conductivity type (or simply as p-type). Further, those devices in which a drain current flows only when a voltage higher than a threshold voltage is applied to the gate electrode are referred to the an enhanced type (or E type or normally off-type), while those devices in which a drain current flows with no application of voltage to the gate electrode are referred to as depression type (or D type or normally on-type).

By the way, the size of a MISFET has become finer along with the trend toward high integration or multi-function use. In order to suppress the occurrence of a short channel effect or hot electrons along with refinement of the MISFET, an LDD structure, in which the density of impurities in the drain region on the side of the channel forming region is lowered, has been adopted in a MISFET of the sub-micron generation having a gate length of 1 ($\mu$m) or less. Since the LDD structure can decrease the amount of diffusion of the drain region to the side of the channel forming region and can ensure the size of the channel length, it can suppress the occurrence of the short channel effect. Further, since it can moderate the gradient of the impurity density distribution in the pn-junction portion that is formed between the drain region and the channel forming region to weaken the electric field intensity generated in the region, the amount of hot carriers being generated can be decreased.

A MISFET of the LDD structure is obtained mainly by forming a gate electrode by way of a gate insulating film on the main surface of a semiconductor substrate; then ion implanting impurities to the main surface of the semiconductor substrate, thereby forming a semiconductor region that is aligned with the gate electrode (extension region); then forming a side wall spacer to the side wall of the gate electrode; and then ion implanting impurities to the main surface of the semiconductor substrate so as to form a semiconductor region (contact region) being that is aligned with the side wall spacer.

On the other hand, refinement of the size of a MISFET results in an increase in the gate resistance due to a decrease of the gate length size, and an increase in the source resistance, drain resistance and contact resistance due to a shallowing of the source region and the drain region, whereby improvement for higher speed operation of a memory IC, (integrated circuits), logic IC and hybrid IC having a memory function and logic function is inhibited.

In view of the above, a technique for reducing the resistance by using a refractory metal silicide film for coping with refinement and higher speed operation has been proposed. Particularly, the use of a technique for reducing the resistance, which is referred to as a salicide technique (salicide: self-alignment silicide), is effective for attaining a hybrid IC.

As a known literature relevant to the present invention, the following Patent Document 1 (Japanese Unexamined Patent Publication No. 2000-82678) is mentioned. The Patent Document 1 discloses a technique of ion implanting germanium (Ge), thereby forming source-drain regions with less junction leakage, at a high concentration and with a shallow junction.

[Patent Document 1]
Japanese Unexamined Patent Publication No. 2000-82678.

SUMMARY OF THE INVENTION

In recent years, electronic equipment has been reduced in the size and weight, and more refinement has been demanded also for a MISFET. A problem encountered in the refinement of a MISFET concerns a decrease in the drain current Ids (current driving performance). For increasing the drain current Ids, a reduction of the resistance in the extension region is effective. For reducing the resistance in the extension region, it is necessary to ion implant impurities at an extremely high concentration to an extremely shallow region of a main surface of a semiconductor substrate.

However, in the prior art, even when it is intended for ionic implantation of a great amount of impurities, such as arsenic (As), phosphorus (P), boron (B), boron difluoride ($BF_2$), etc., in order to reduce the resistance, since activation of the implanted impurities in silicon (Si) crystals is low and, particularly, ion implantation into a shallow portion also generates self sputtering, etc., the ions do not enter the Si crystals even when they are implanted by more than a predetermined amount, whereby less improvement is achieved for reduction of the resistance of the extension region.

In a case of ion implanting impurities into Si crystals to form a semiconductor region, then forming a refractory metal film on the semiconductor region and then reacting Si and a refractory metal by a heat treatment to form a silicide layer on the semiconductor region, it has been confirmed that inactive impurities (unreacted impurities not bonded with Si) in the siliciding step hinder the silicidation due to increased density of the impurities.

On the other hand, it has been known in a MISFET that the drain current Ids changes depending on the direction of stresses exerted on the channel forming region. Specifically, in a case of applying a stress to the channel forming region in a direction identical with the direction of flow of the drain current (channel length direction), it has been known that (1) the drain current in the n-type MISFET decreases in response to compressive stress and increases in response to tensile strength, and (2) the drain current in the p-type MISFET increases in response to compressive stress and decreases in response to tensile strength.

As a method of applying stress to the channel forming region of a MISFET, there is a method, for example, of utilizing the film stress of an interlayer insulating film formed on a semiconductor substrate. However, in a case of forming an interlayer insulating film on a semiconductor substrate, in the general CMIS (Complementary MIS) process, since identical materials have been used on the n-type MISFET and the p-type MISFET, stresses exerted on the channel forming region of a MISFET are substantially identical in one identical chip. That is, when the drain current tends to increase in the n-type MISFET in response to the film stress, the drain current in the p-type MISFET decreases, whereas when the drain current in the p-type MISFET tends to increase, the drain current in the n-type MISFET decreases.

It is an object of the present invention to provide a technique that is capable of increasing the drain current Ids (improvement of the current driving performance) of field effect transistors.

It is a further object of the present invention to provide a technique capable of increasing the drain current Ids (improvement of the current driving performance) of the n-type field effect transistor and the p-type field effect transistor.

The foregoing and other objects and novel features of the present invention will become apparent by reference to the descriptions in the present specification and from the accompanying drawings.

Among the features of the invention disclosed in the present application, outlines of typical aspects of the invention are briefly explained below.

(1) A method of manufacturing a semiconductor device having a field effect transistor comprises the steps of:

forming a gate electrode by way of a gate insulating film above a main surface of a silicon layer serving as a semiconductor substrate; and ion implanting impurities from the main surface of the silicon layer to the inside thereof to form a semiconductor region which is aligned with the gate electrode; and, further, ion implanting a group IV element (for example, Ge) to a level shallower than the implantation depth of the impurities in the step of forming the semiconductor region from the main surface of the silicon layer to the inside thereof after the step of forming the gate electrode.

(2) The manufacturing method according to (1) described above further comprises a step of activating the impurities ion implanted in the step of forming the semiconductor region by a heat treatment after the step of forming the semiconductor region.

(3) A method of manufacturing a semiconductor device having field effect transistors comprises the steps of:

(a) forming a gate electrode by way of a gate insulating film on a main surface of a silicon layer serving as a silicon substrate;

(b) ion implanting a group IV element (for example, Ge) to the main surface of the semiconductor substrate after the step (a);

(c) ion implanting impurities to the main surface of the silicon layer after the step (b) to form a first semiconductor region which is aligned with the gate electrode;

(d) forming a side wall spacer to the side wall of the gate electrode after the step (c); and (e) ion implanting impurities to the main surface of the silicon layer after the step (d) to form a second semiconductor region which is aligned with the side wall spacer, in which ion implantation of the group IV element is conducted to a level shallower than the implantation depth of the impurities in the step (c).

(4) The manufacturing method according to (3) described above further comprises a step of activating the ion-impurities implanted in the step (c) by a heat treatment after the step (c).

(5) A method of manufacturing a semiconductor device which has an n-channel conductivity type field effect transistor formed in a first region and a p-channel conductivity type field effect transistor formed in a second region different from the first region on a main surface of a silicon layer serving as a semiconductor substrate, which method comprises the steps of:

forming a first gate electrode by way of a gate insulating film above the first region of the main surface of the silicon layer, and a second gate electrode by way of the gate insulating film above the second region of the main surface of the silicon layer;

ion implanting first impurities to the first region of the main surface of the silicon layer in a state of selectively masking the second region of the main surface of the silicon layer to form a first semiconductor region which is aligned with the first gate electrode;

ion implanting second impurities to the second region of the main surface of the silicon layer in a state of selectively masking the first region of the main surface of the silicon layer to form a second semiconductor region which is aligned with the second gate electrode;

forming side wall spacers, respectively, on the side walls of the first and the second gate electrode;

ion implanting third impurities in the first region of the main surface of the silicon layer in a state of selectively masking the second region on the main surface of the silicon layer to form a third semiconductor region of an identical conductivity type with that of the first semiconductor region and aligned with the side wall spacer on the side wall of the first gate electrode;

ion implanting fourth impurities in the second region of the main surface of the silicon layer in a state of selectively masking the first region on the main surface of the silicon layer to form a fourth semiconductor region of an identical conductivity type with that of the second semiconductor region and aligned with the side wall spacer on the side wall of the second gate electrode; and further ion implanting a group IV element (for example, Ge) to the first and the second regions of the main surface of the silicon layer to a level shallower than the implantation depth of the respective impurities in the step of forming the first and the second semiconductor regions, after the step of forming the first and the second gate electrodes and before the step of forming the first and the second semiconductor regions.

(6) The manufacturing method according to (5) described above, further comprises a step of activating the first and the second impurities that have been ion implanted in the step of forming the first and the second semiconductor regions by a heat treatment after the step of forming the first and the second semiconductor regions.

(7) A method of manufacturing a semiconductor device having a field effect transistor comprises the steps of:

forming a gate electrode by way of a gate insulating film on a main surface of a silicon layer serving as a semiconductor substrate; and ion implanting impurities from the main surface of the silicon layer to the inside thereof to form a first semiconductor region which is aligned with the gate electrode;

forming a side wall spacer to the side wall of the gate electrode;

ion implanting impurities from the main surface of the silicon layer to the inside thereof to form a second semiconductor region which is aligned with the side wall spacer;

forming a refractory metal film on the second semiconductor region and then applying a heat treatment for reacting the silicon of the second semiconductor region and the metal of the refractory metal film, to form a metal semiconductor reaction layer on the second semiconductor region; and, further, ion implanting a group IV element (for example, Ge) to a level shallower than the implantation depth of the impurities in the step of forming the first semiconductor region from the main surface of the silicon layer to the inside thereof after the step of forming the gate electrode and the before the step of forming the first semiconductor region.

(8) The method of manufacturing a semiconductor device according to (7) described above further comprises a step of activating respective impurities that have been ion implanted in the step of forming the first and the second semiconductor regions by a heat treatment after the step of forming the first semiconductor region and before the step of forming the refractory metal film.

(9) A method of manufacturing a semiconductor device which has an n-channel conductivity type field effect transistor formed in a first region on a main surface of a silicon layer serving as a semiconductor substrate and a p-channel conductivity type field effect transistor formed in a second region different from the first region on the main surface of the silicon layer, which method comprises the steps of:

forming an insulating film (for example, silicon nitride film) having a tensile stress so as to cover a first gate electrode formed above the first region of the main surface of the silicon layer and a second gate electrode formed above the second region of the main surface of the silicon layer;

applying anisotropic etching to the insulating film to form a first side wall spacer to the side wall of the first gate electrode and a second side wall spacer to the side wall of the second gate electrode; and ion implanting a group IV element (for example, Ge) to the second side wall spacer in a state of masking the first region of the main surface of the silicon layer so as to destroy the crystallinity of the second side wall spacer.

(10) A method of manufacturing a semiconductor device which has an n-channel conductivity type field effect transistor formed in a first region on a main surface of a silicon layer serving as a semiconductor substrate and a p-channel conductivity type field effect transistor formed in a second region different from the first region on the main surface of the silicon layer, which method comprises the steps of:

forming an insulating film (for example, silicon nitride film) having a compressive stress so as to cover a first gate electrode formed above the first region of the main surface of the silicon layer and a second gate electrode formed above the second region of the main surface of the silicon layer;

applying anisotropic etching to the insulating film to form a first side wall spacer to the side wall of the first gate electrode and a second side wall spacer to the side wall of the second gate electrode; and ion implanting a group IV element (for example, Ge) to the first side wall spacer in a state of masking the second region of the main surface of the silicon layer so as to destroy the crystallinity of the first side wall spacer.

(11) A method of manufacturing a semiconductor device which has an n-channel conductivity type field effect transistor formed in a first region on a main surface of a silicon layer serving as a semiconductor substrate and a p-channel conductivity type field effect transistor formed in a second region different from the first region on the main surface of the silicon layer, which method comprises the steps of:

forming a first gate electrode by way of a gate insulating film above the first region of the main surface of the silicon layer and a second gate electrode by way of a gate insulating film above the second region of the main surface of the silicon layer;

ion implanting first impurities to the first region of the main surface of the silicon layer in a state of selectively masking the second region of the main surface of the silicon layer to form a first semiconductor region which is aligned with the first gate electrode;

ion implanting second impurities to the second region of the main surface of the silicon layer in a state of selectively masking the first region of the main surface of the silicon layer to form a second semiconductor region which is aligned with the second gate electrode;

forming an insulating film having a tensile stress (for example, silicon nitride film) so as to cover the first and the second gate electrodes, then applying anisotropic etching to the insulating film to form a first side wall spacer to the side wall of the first gate electrode and a second side wall spacer to the side wall of the second gate electrode;

ion implanting third impurities to the first region of the main surface of the silicon layer in a state of selectively masking the second region of the main surface of the silicon layer to form a third semiconductor region of a conductivity type identical with that of the first semiconductor region and aligned with the first side wall spacer;

ion implanting fourth impurities to the second region of the main surface of the silicon layer in a state of selectively masking the first region of the main surface of the silicon layer to form a fourth semiconductor region of a conductivity type identical with that of the second semiconductor region and aligned with the second side wall spacer; further ion implanting a first group IV element (for example, Ge) to the first and the second regions of the main surface of the silicon layer to a level shallower than the implantation depth of the respective impurities in the steps of forming the first and the second semiconductor regions after the step of forming the first and the second gate electrodes and before the steps of forming the first and the second semiconductor regions; and ion implanting a second group IV element (for example, Ge) to the second side wall spacer in a state of masking the first region of the main surface of the silicon layer to destroy the crystallinity of the second side wall spacer.

(12) A method of manufacturing a semiconductor device which has an n-channel conductivity type field effect transistor formed in a first region on a main surface of a silicon layer serving as a semiconductor substrate and a p-channel conductivity type field effect transistor formed in a second region different from the first region on the main surface of the silicon layer, the method comprises the steps of:

forming a first gate electrode by way of a gate insulating film above the first region of the main surface of the silicon layer and a second gate electrode by way of a gate insulating film above the second region of the main surface of the silicon layer;

ion implanting first impurities to the first region of the main surface of the silicon layer in a state of selectively masking the second region of the main surface of the silicon layer to form a first semiconductor region which is aligned with the first gate electrode;

ion implanting second impurities to the second region of the main surface of the silicon layer in a state of selectively masking the first region of the main surface of the silicon layer to form a second semiconductor region which is aligned with the second gate electrode;

forming an insulating film having a compressive stress (for example, silicon nitride film) so as to cover the first and the second gate electrodes, then applying anisotropic etching to the insulating film to form a first side wall spacer to the side wall of the first gate electrode and a second side wall spacer to the side wall of the second gate electrode;

ion implanting third impurities to the first region of the main surface of the silicon layer in a state of selectively masking the second region of the main surface of the silicon layer to form a third semiconductor region of a conductivity type identical with that of the first semiconductor region and aligned with the first side wall spacer;

ion implanting fourth impurities to the second region of the main surface of the silicon layer in a state of selectively masking the first region of the main surface of the silicon layer to form a fourth semiconductor region of a conductivity type identical with that of the second semiconductor region and aligned with the second side wall spacer; further ion implanting a first group IV element (for example, Ge) to the first and the second regions of the main surface of the silicon layer to a level shallower than the implantation depth of the respective impurities in the steps of forming the first and the second semiconductor regions after the step of forming the first and the second gate electrodes and before the steps of forming the first and the second semiconductor regions; and ion implanting a second group IV element (for example, Ge) to the first side wall spacer in a state of masking the second region of the main surface of the silicon layer so as to destroy the crystallinity of the first side wall spacer.

(13) A method of manufacturing a semiconductor device having a field effect transistor comprises the steps of:

forming a semiconductor film on a main surface of a semiconductor substrate;

ion implanting impurities for reducing the resistance value to the semiconductor film;

patterning the semiconductor film to form a gate electrode; and, further, ion implanting an element of a group identical with that of the semiconductor film.

(14) The method of manufacturing a semiconductor device according to (13) described above further comprises a step of activating the impurities by a heat treatment after the step of ion implanting the impurities, in which the step of ion implanting the element of the group identical with that of the semiconductor film is conducted before the step of activating the impurities by the heat treatment.

(15) The method of manufacturing a semiconductor device according to (13) described above further comprises a step of activating the impurities by a heat treatment after the step of ion implanting the impurities, in which the step of ion implanting the element of the group identical with that of the semiconductor film is conducted before the step of ion implanting the impurities.

(16) In a method of manufacturing a semiconductor device according to (13) described above, the semiconductor film is silicon and the element is Ge ion.

(17) A method of manufacturing a semiconductor device which has an n-channel conductivity type field effect transistor formed in a first region of a main surface of a semiconductor substrate and a p-channel conductivity type field effect transistor formed in a second region different from the first region, which method comprises the steps of:

forming a semiconductor film on the first and the second regions of the main surface of the semiconductor substrate;

ion implanting impurities for reducing the resistance value to the semiconductor film;

patterning the semiconductor film to form gate electrodes respectively to the first and the second regions of the main surface of the semiconductor substrate;

activating the impurities by a heat treatment; and, further, ion implanting an element of a group identical with that of the semiconductor film to the semiconductor film after the step of forming the semiconductor film and before the step of activating the impurities by the heat treatment.

(18) A method of manufacturing a semiconductor device having a field effect transistor comprises the steps of:

forming a gate electrode by way of a gate insulating film above the main surface of a semiconductor substrate;

ion implanting impurities from the main surface of the semiconductor substrate to the inside thereof to form a semiconductor region which is aligned with the gate electrode;

ion implanting an element of a group identical with that of the semiconductor substrate from the main surface of the semiconductor substrate to the inside thereof to a level shallower than the implantation depth of the impurities in the step of forming the first semiconductor region, after the step of forming the gate electrode;

applying cleaning to the semiconductor substrate after the step of ion implanting the element of the identical group and the step of forming the semiconductor region, in which the cleaning step is conducted by using aqueous sulfuric acid solution, diluted hydrofluoric acid and aqueous hydrogen chloride solution.

(19) The method of manufacturing a semiconductor device according to (18) described above further comprises a step of activating the ion implanted impurities in the step of forming the semiconductor region by a heat treatment after the step of ion implanting the element of the identical group and the step of forming the semiconductor region, in which the cleaning step is conducted after the step of activating the impurities by the heat treatment.

Advantageous effects obtained by typical example among those disclosed in the present application are briefly described below.

According to the present invention, the drain current Ids of the field effect transistor can be increased (current driving performance can be improved).

Further, the drain current in the n-channel conductivity type field effect transistor and the p-channel conductivity type field effect transistor can be increased.

Further, the resistance of the gate electrode of the n-channel conductivity type field effect transistor and the p-channel conductivity type field effect transistor can be decreased.

DESCRIPTION OF THE ACCOMPANYING DRAWINGS

Figure 26:
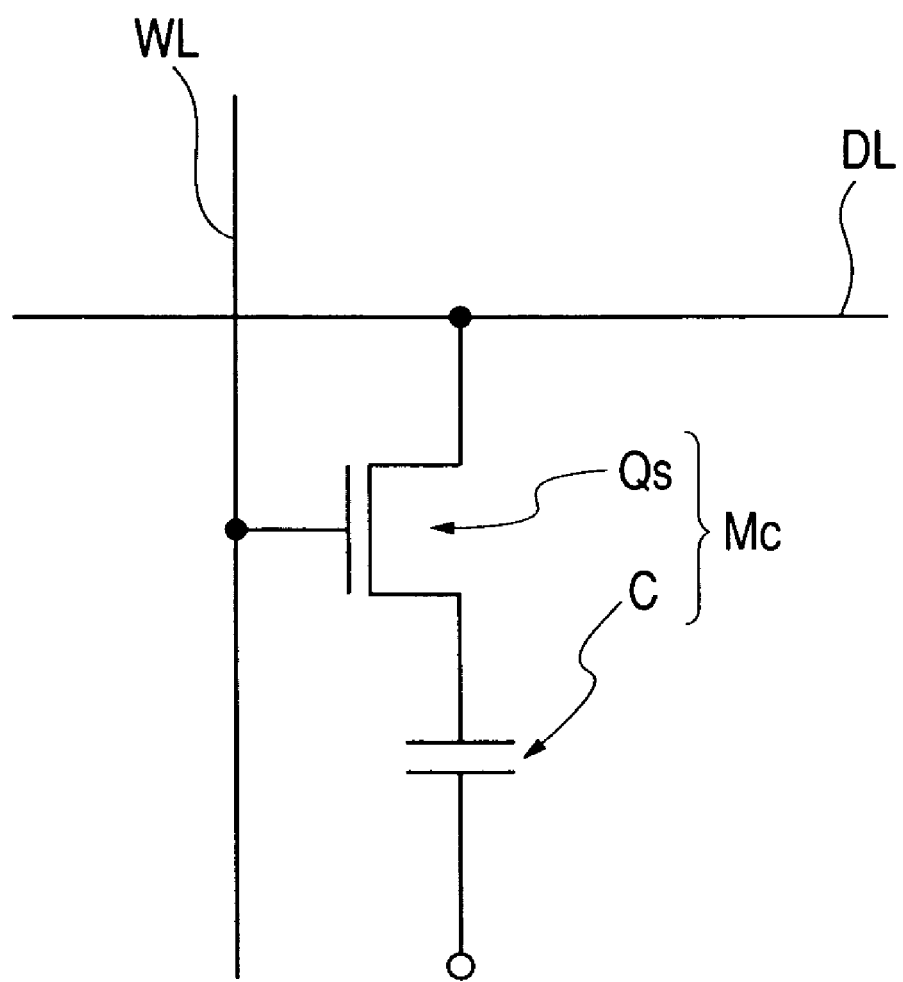
Figure 28:
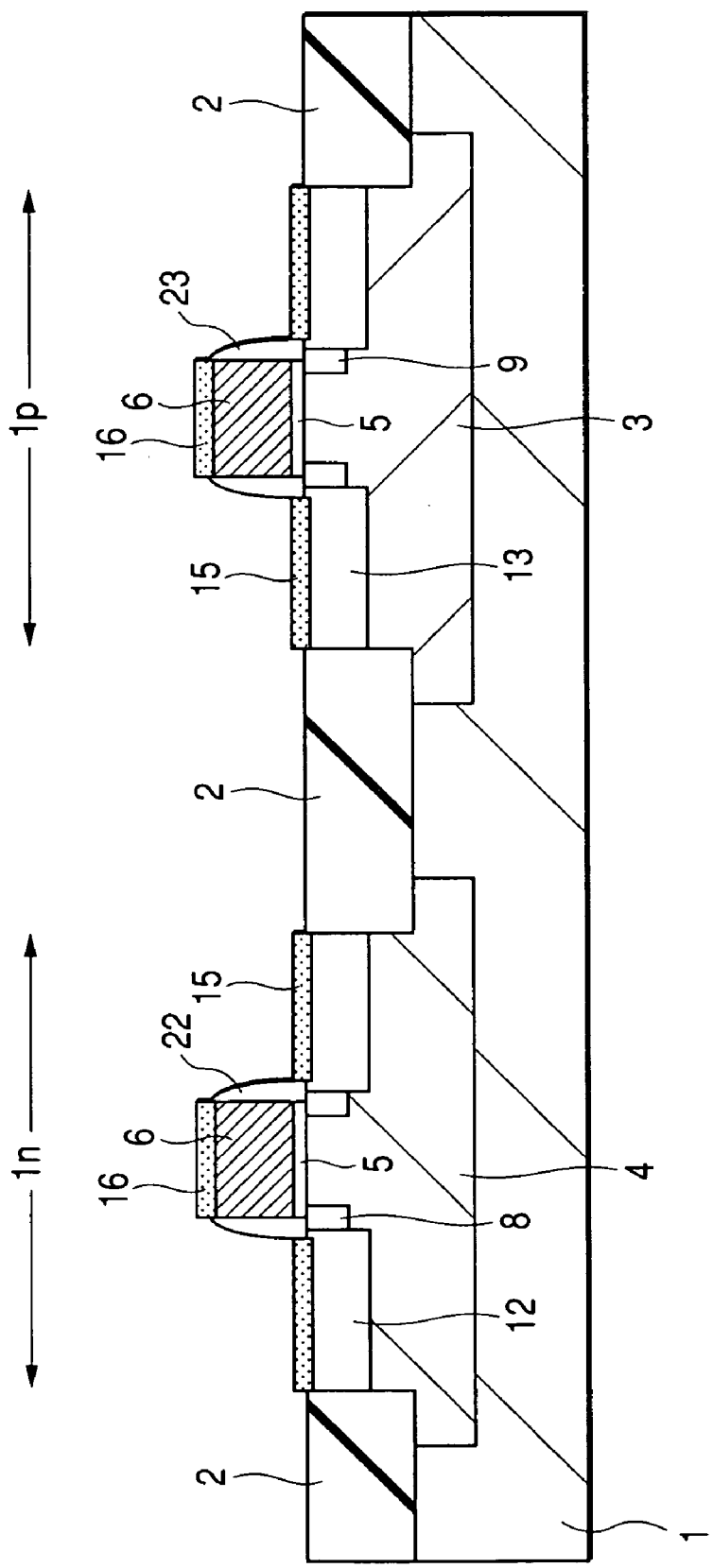
Figure 29:
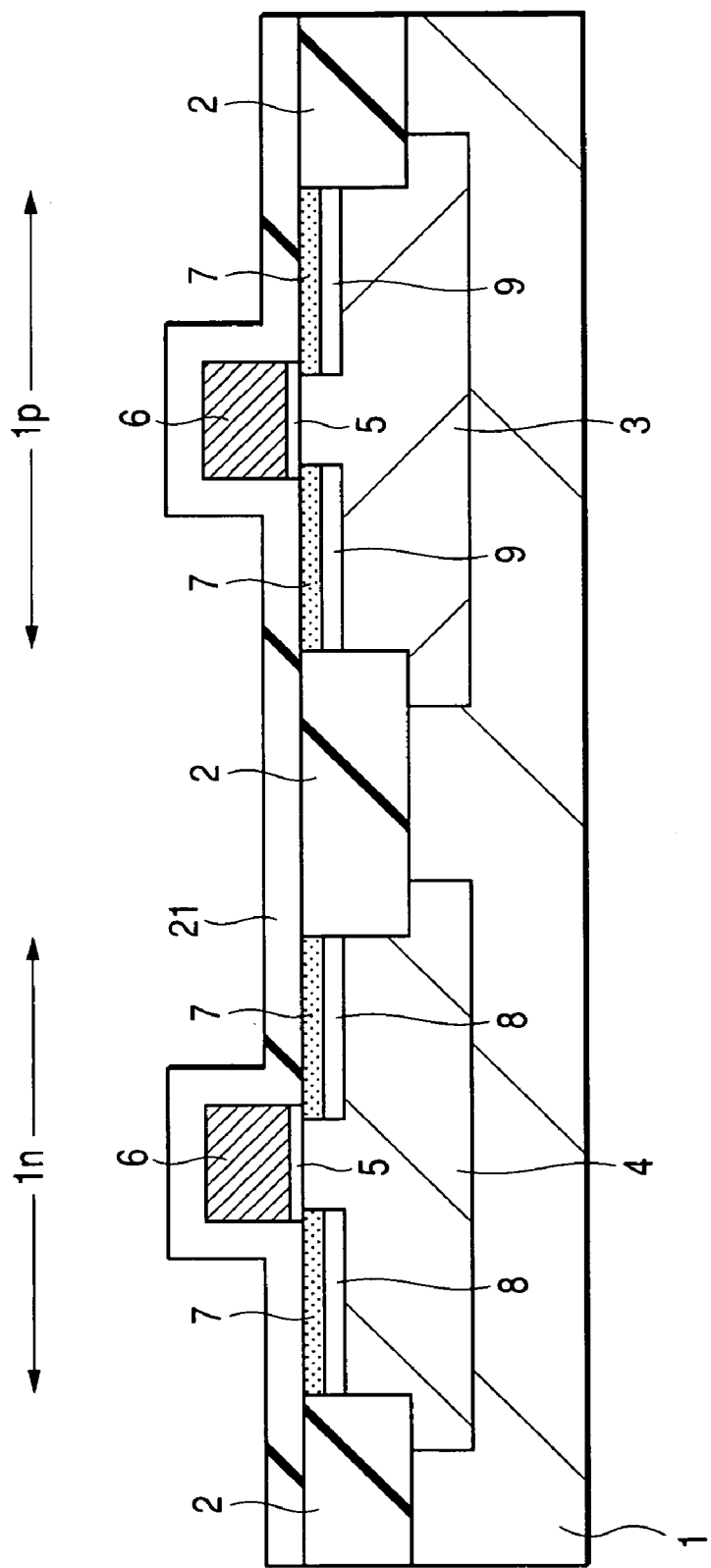
Figure 30:
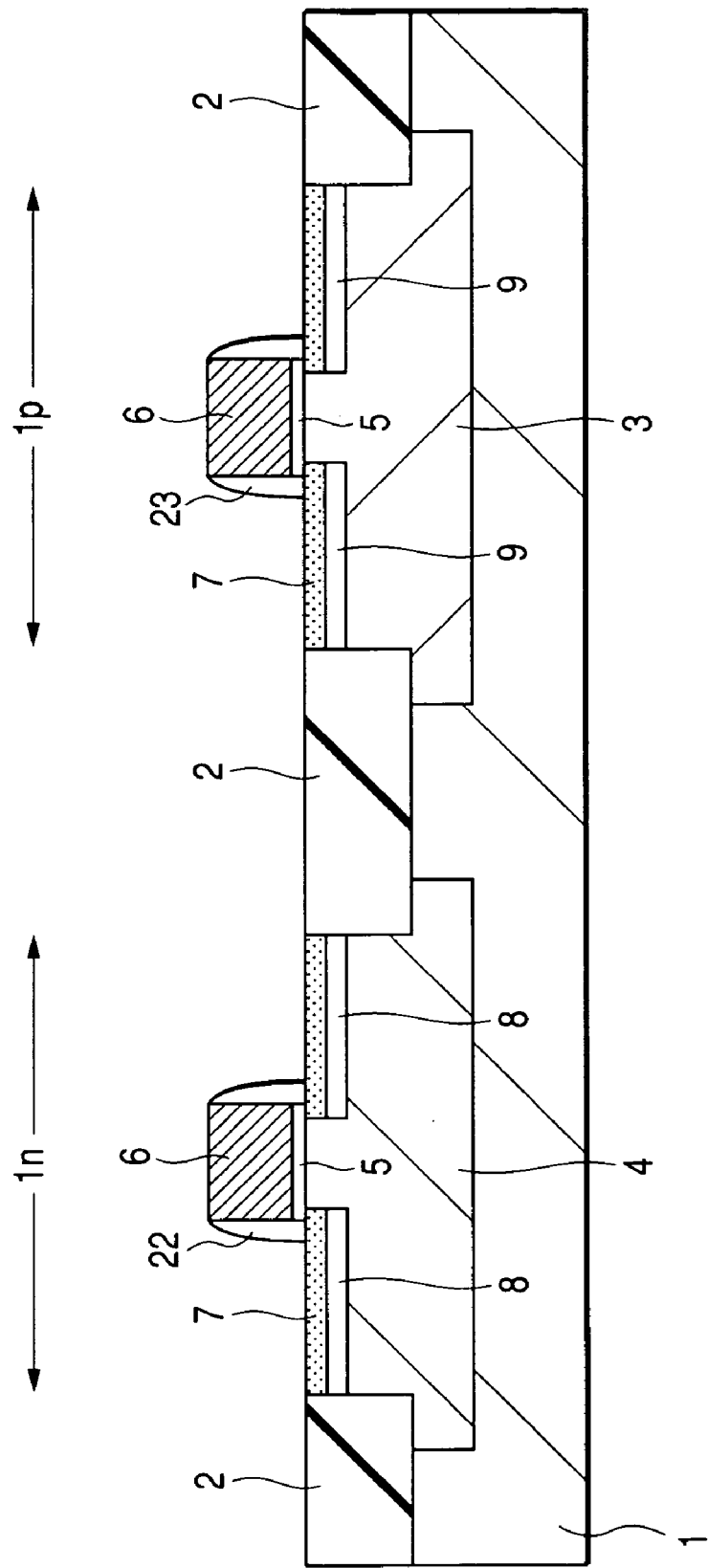
Figure 31:
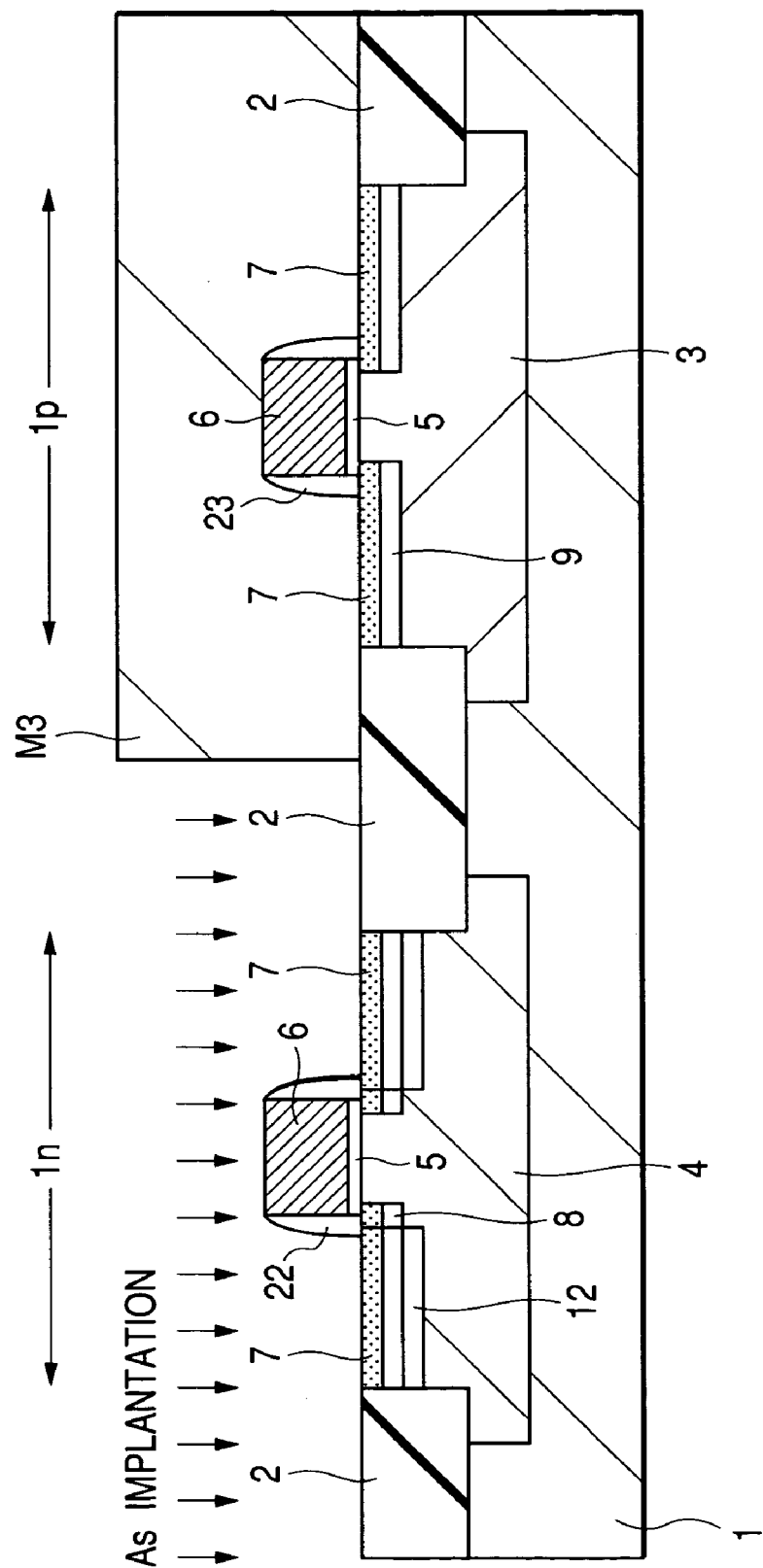
Figure 32:
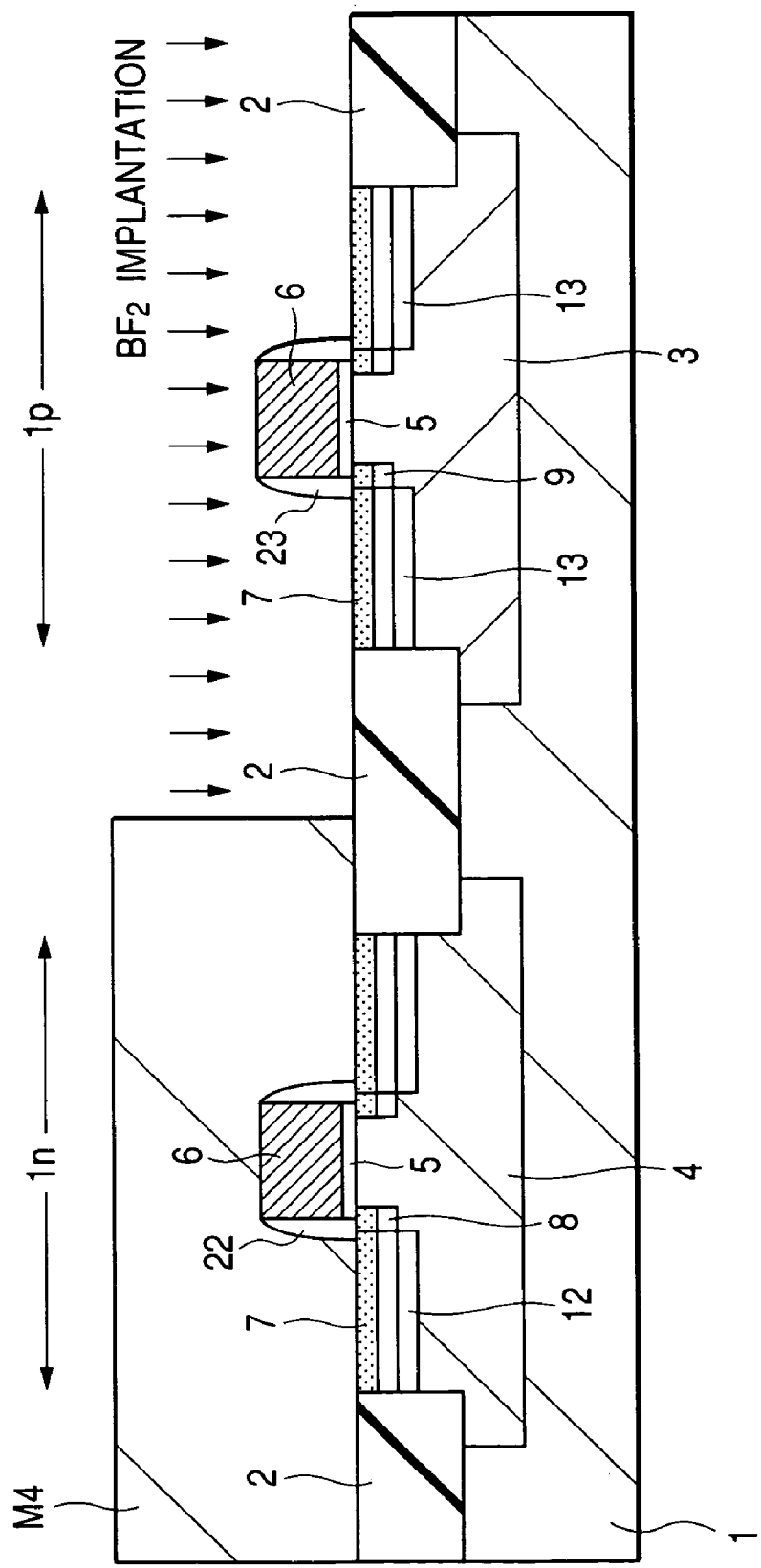
Figure 33:
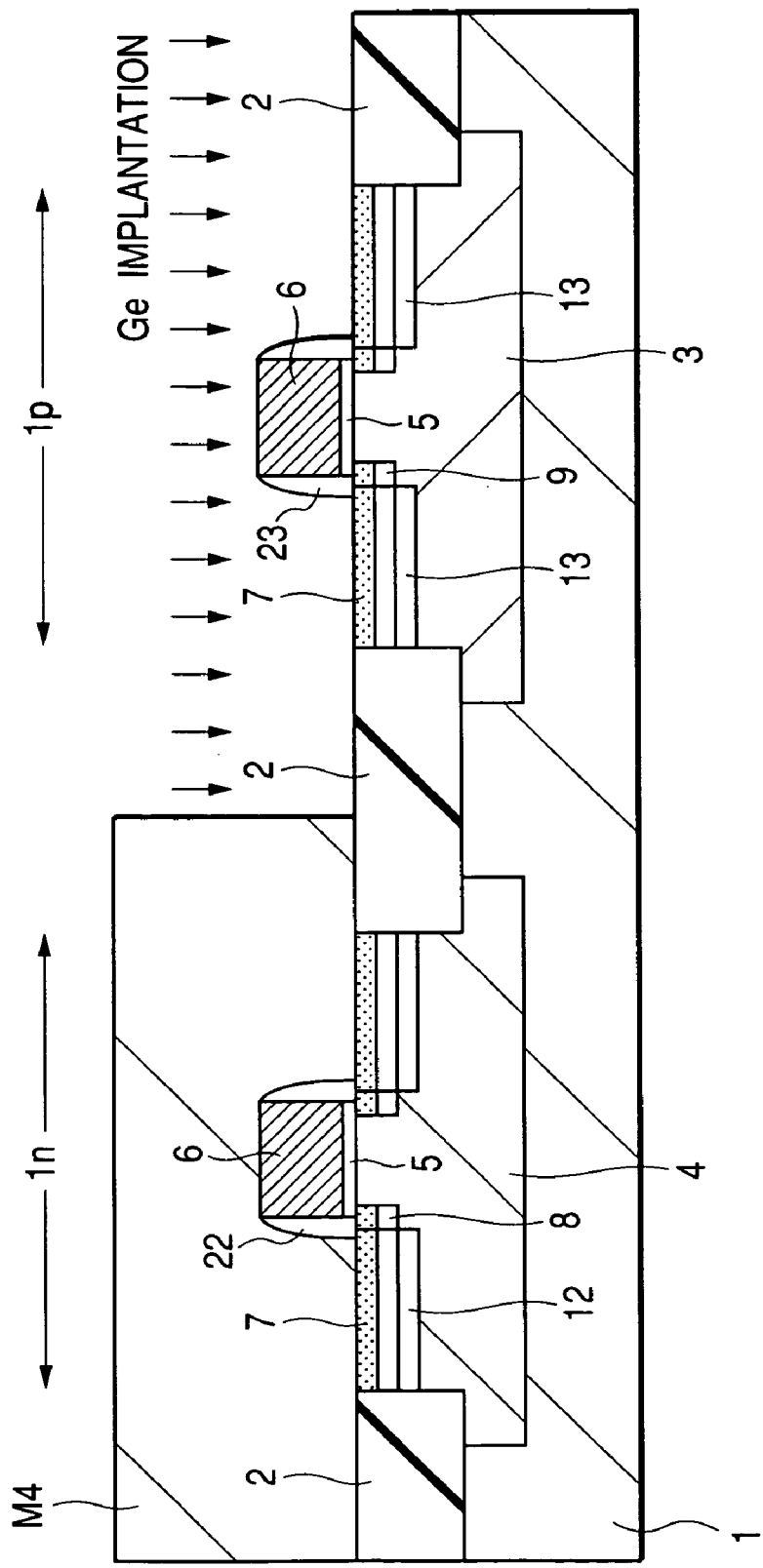
Figure 34:
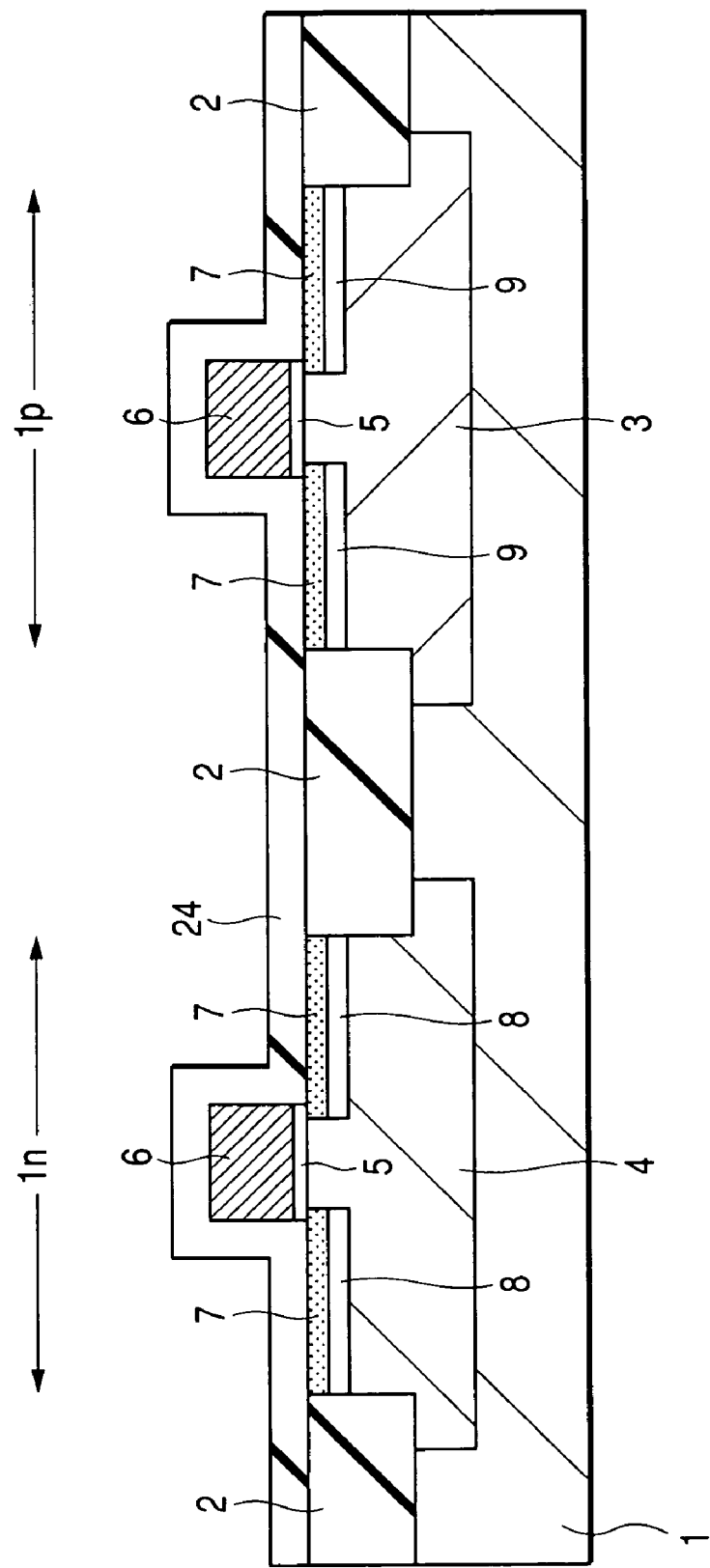
Figure 35:
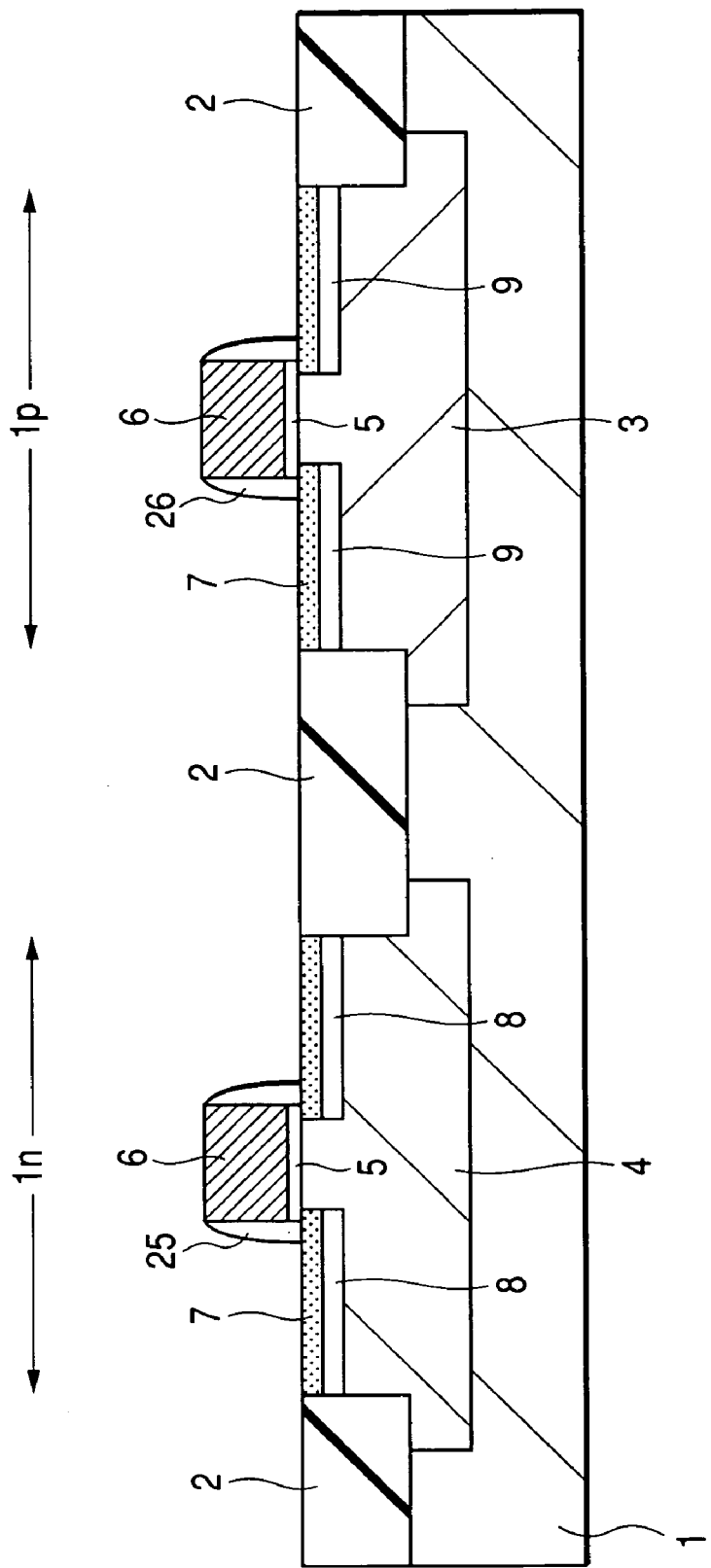
Figure 36:
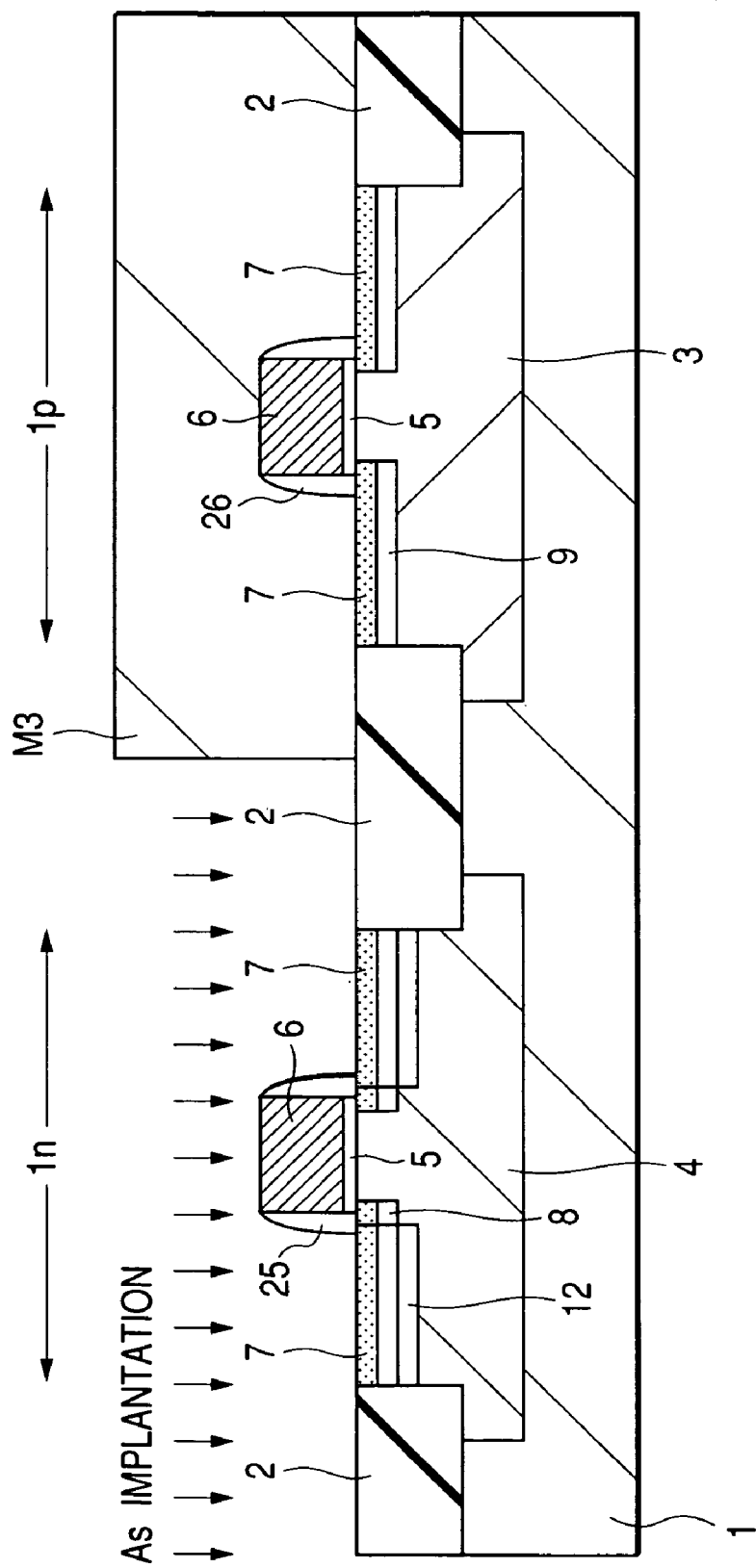
Figure 37:
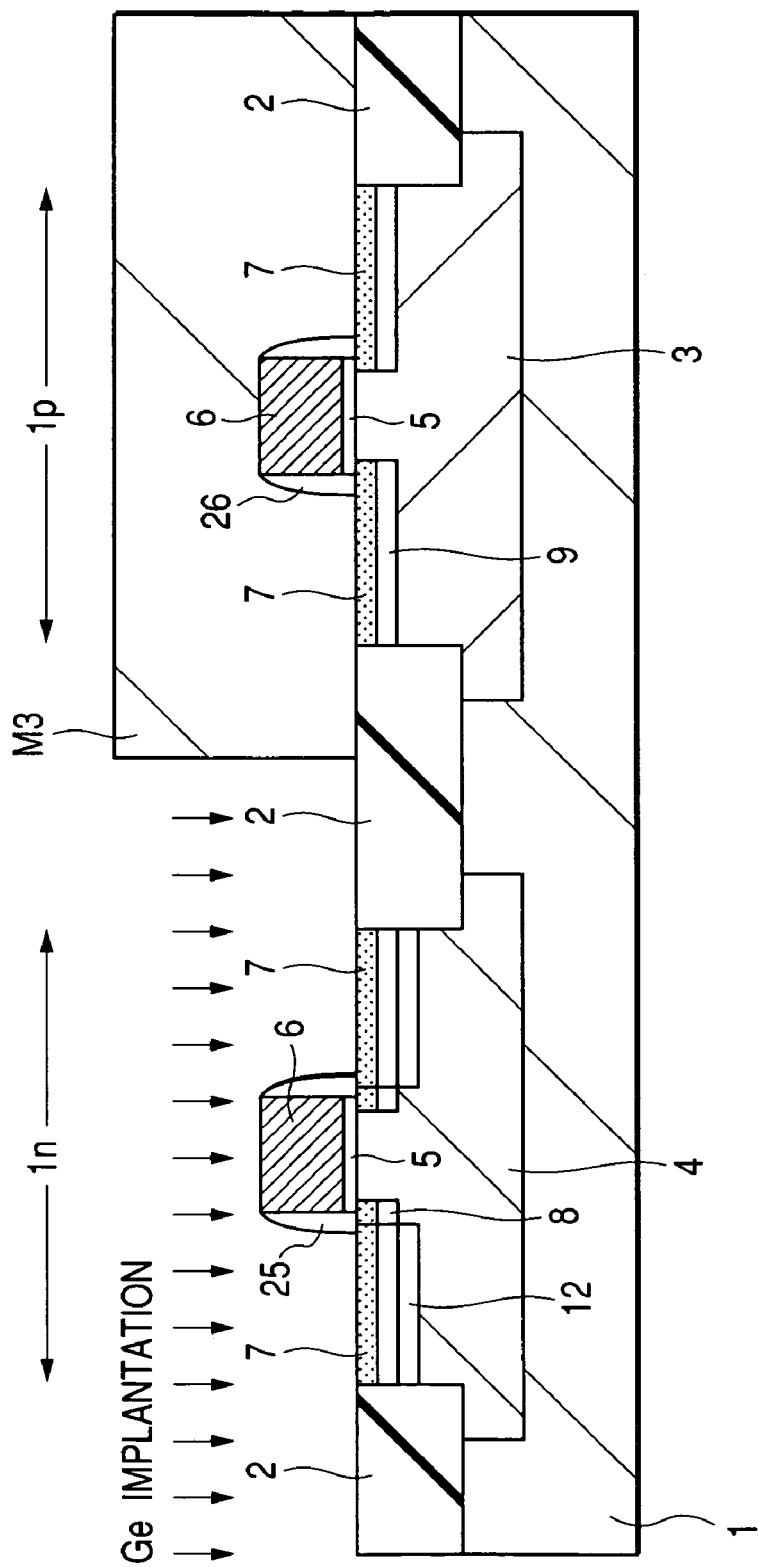
Figure 38:
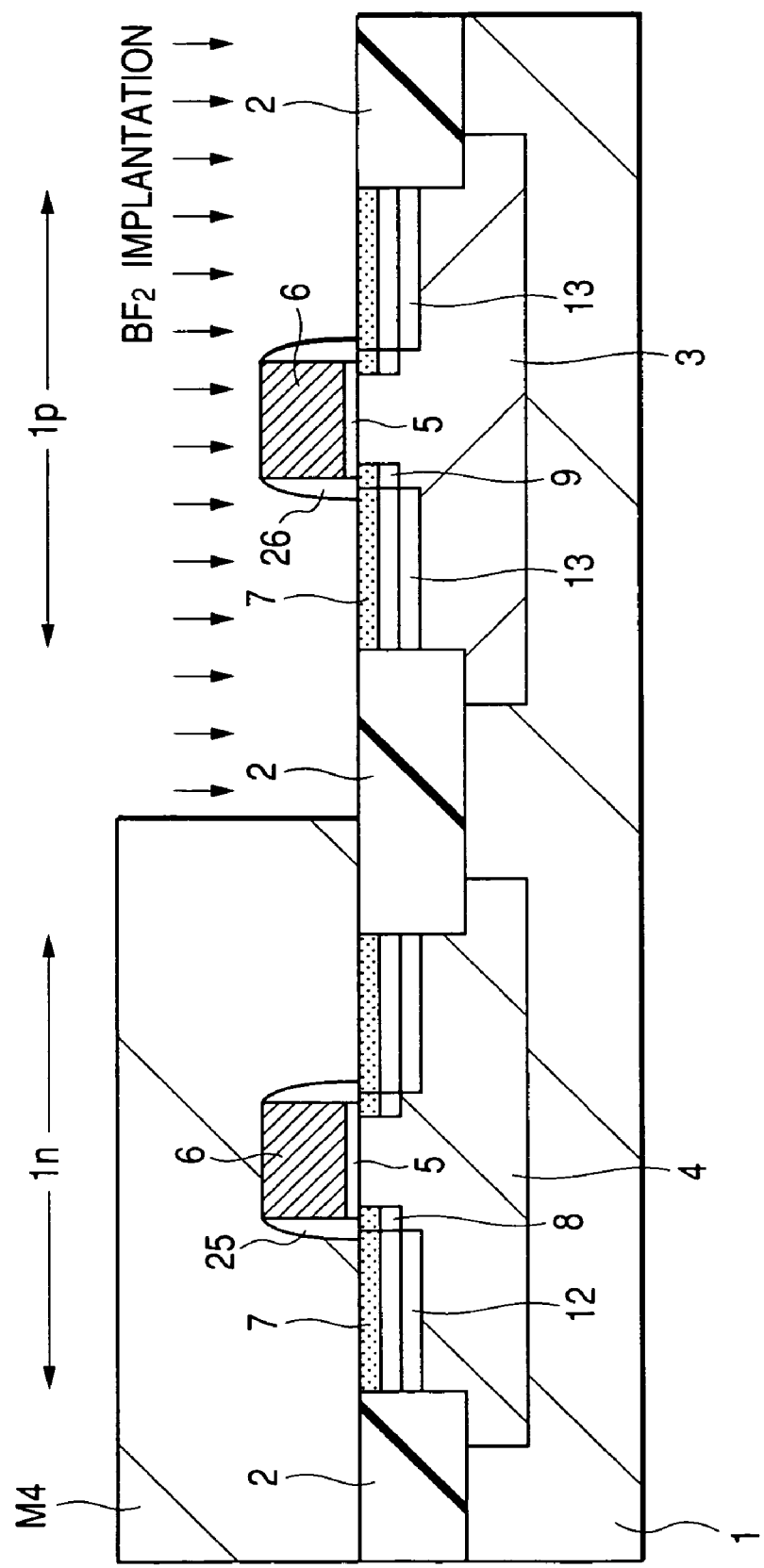
Figure 39:
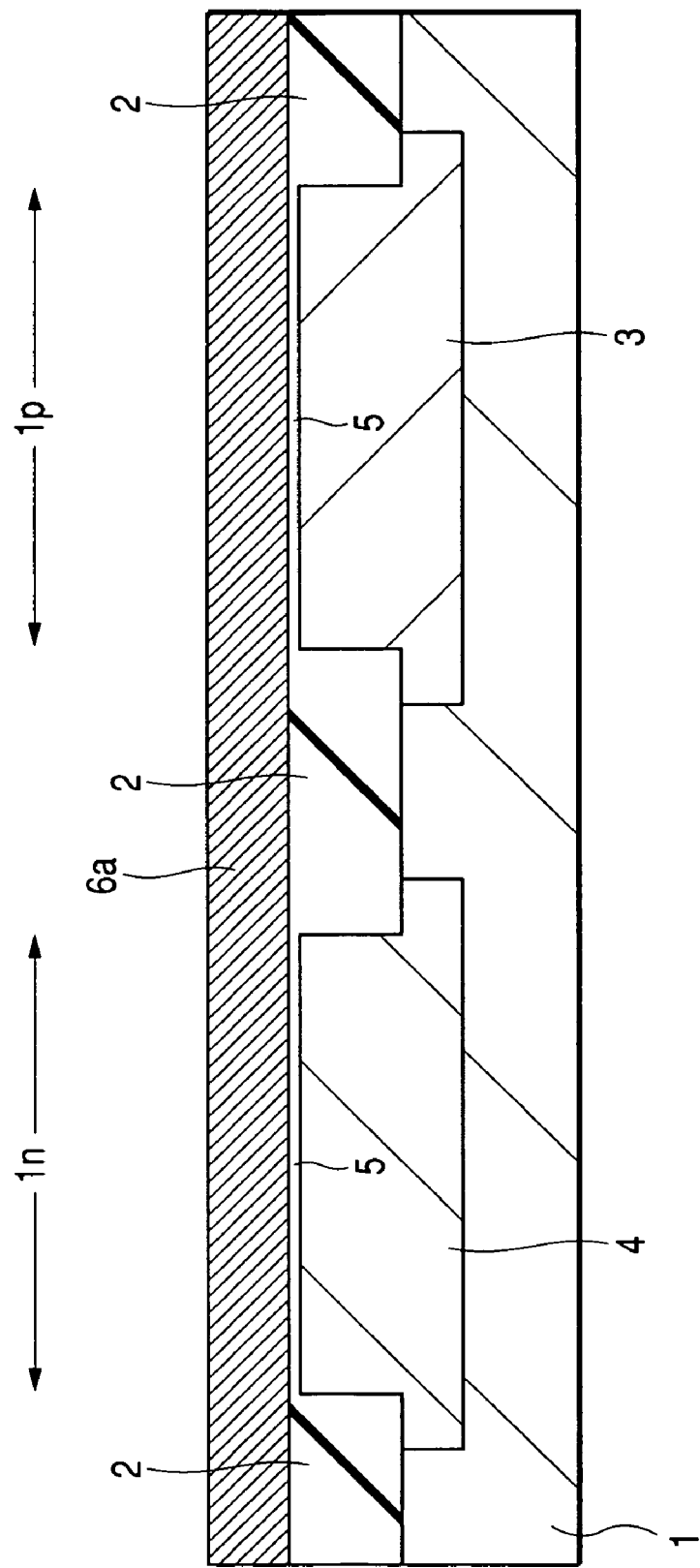
Figure 40:
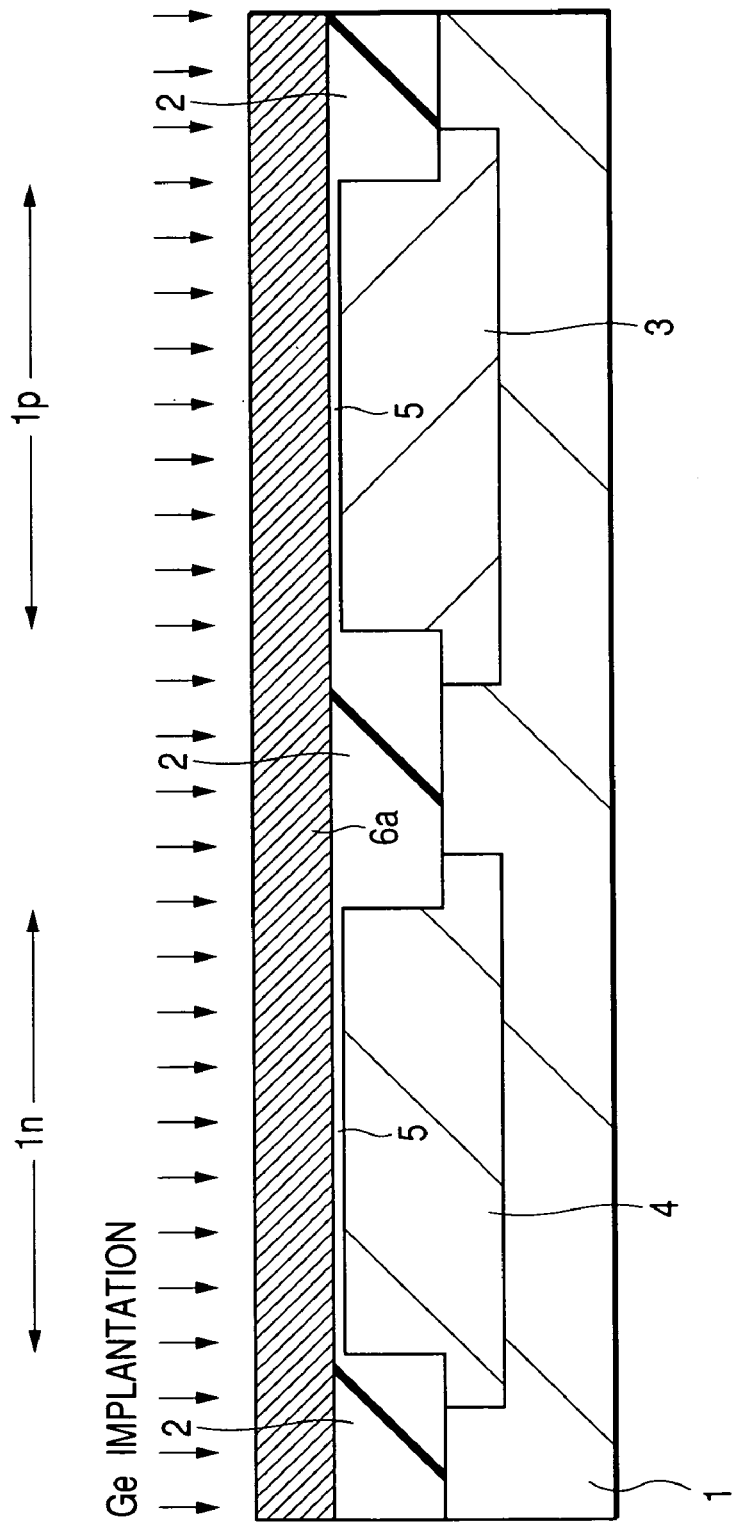
Figure 41:
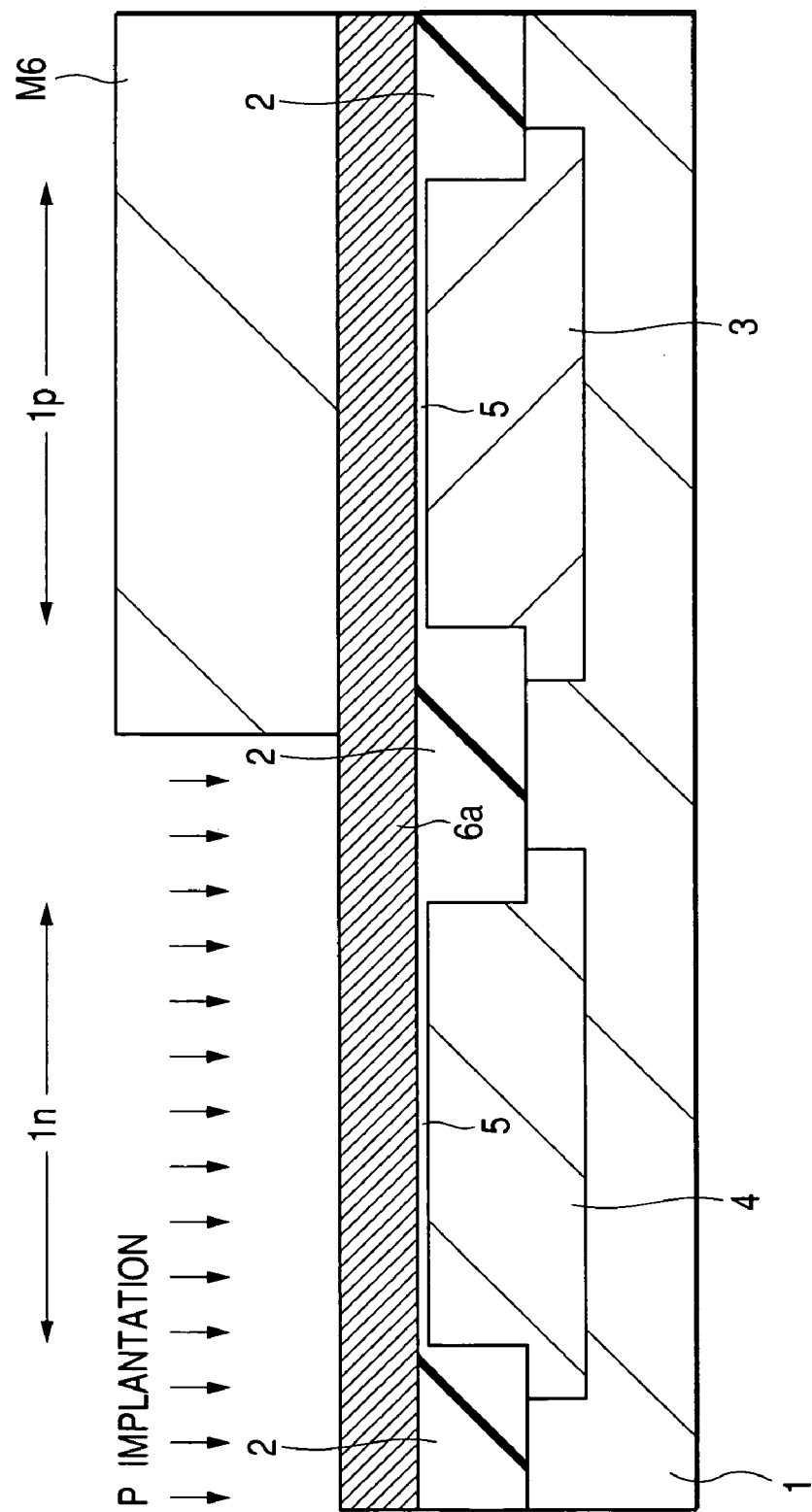
Figure 42:
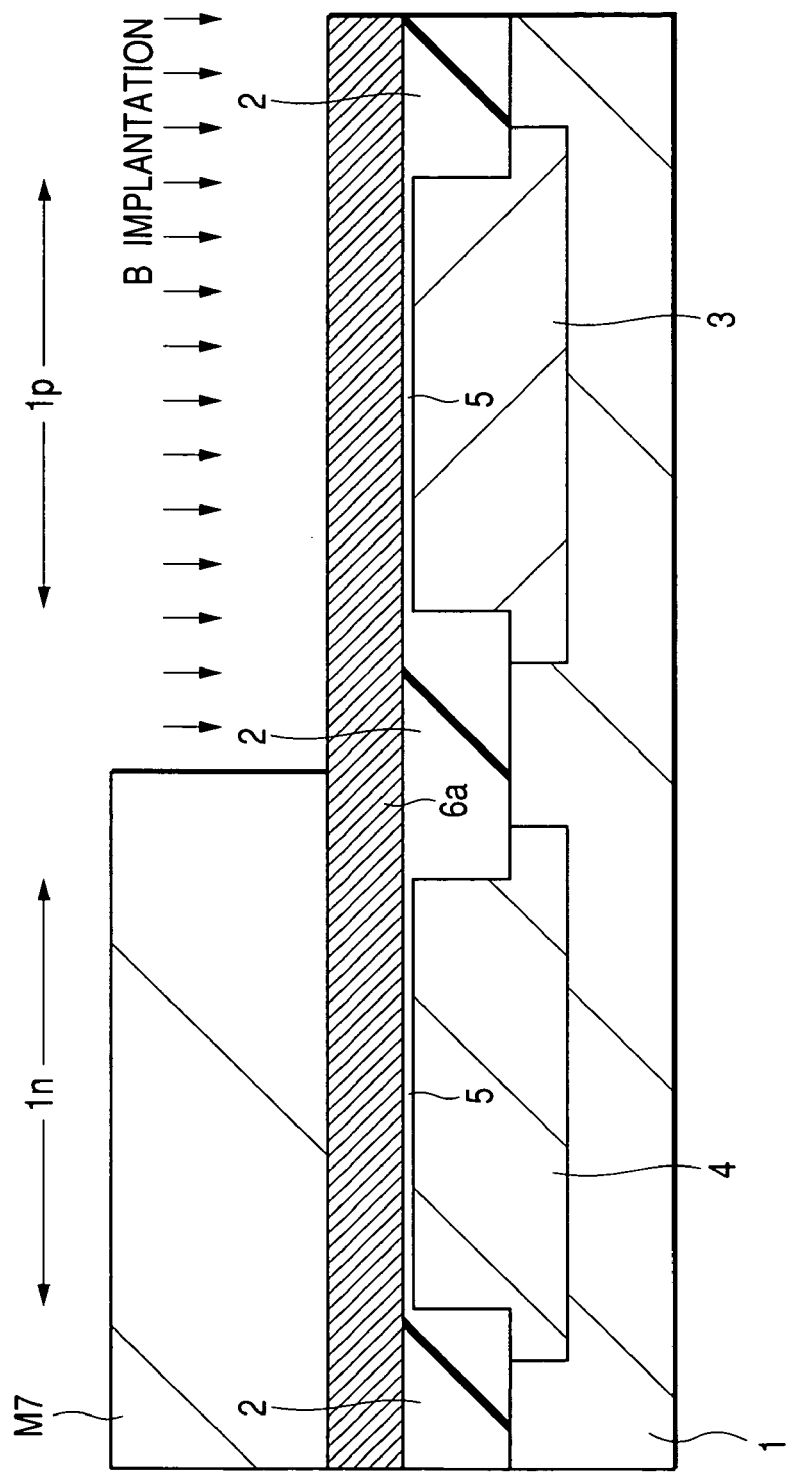
Figure 43:
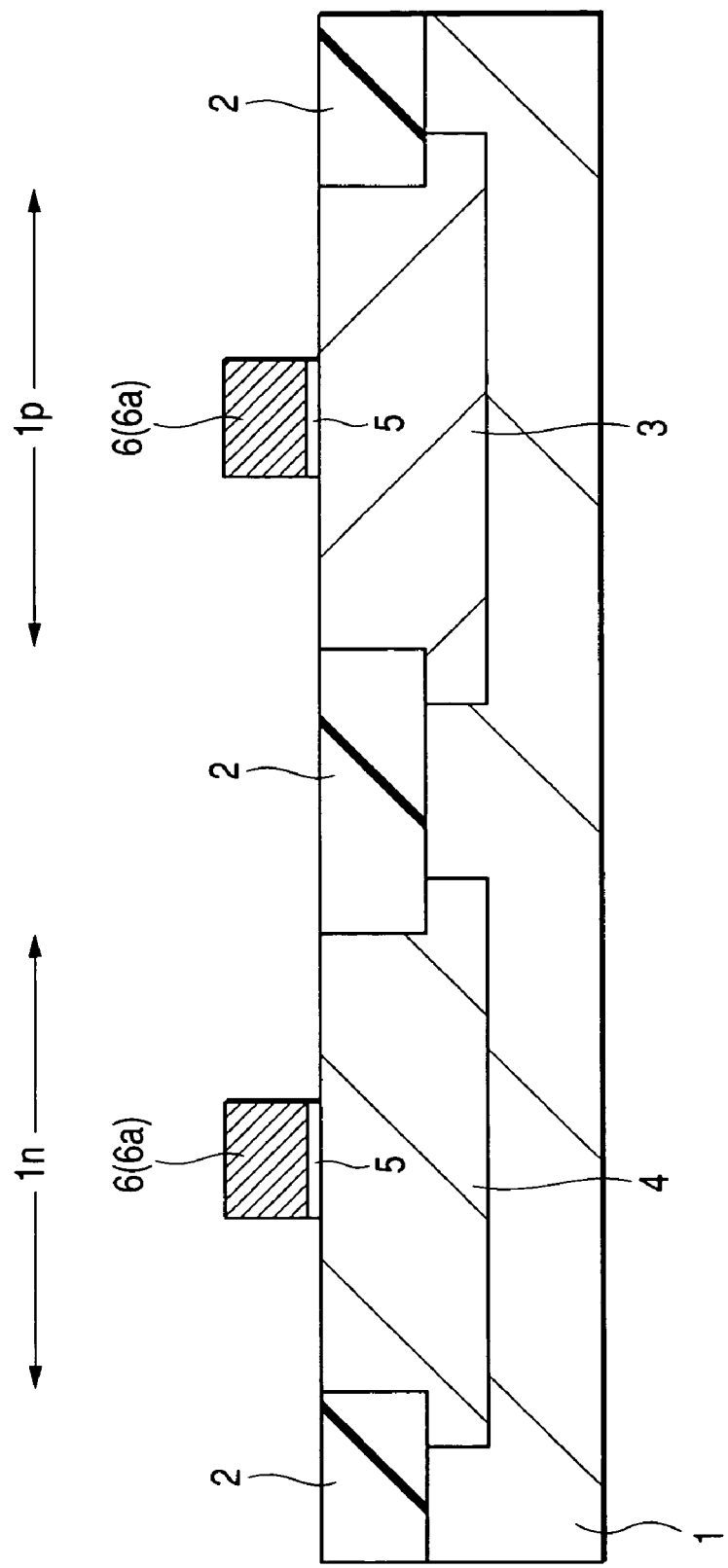
Figure 44:
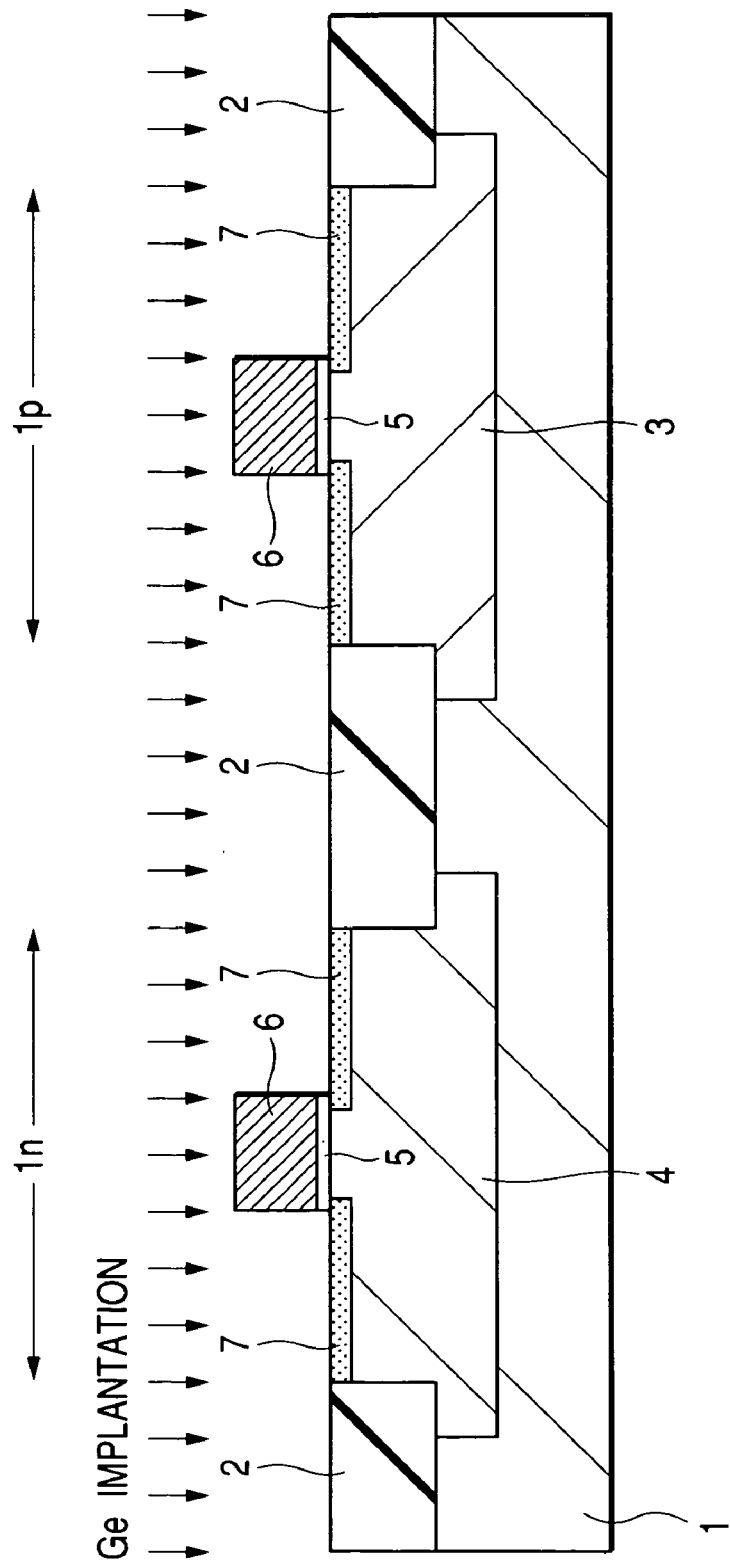
Figure 45:
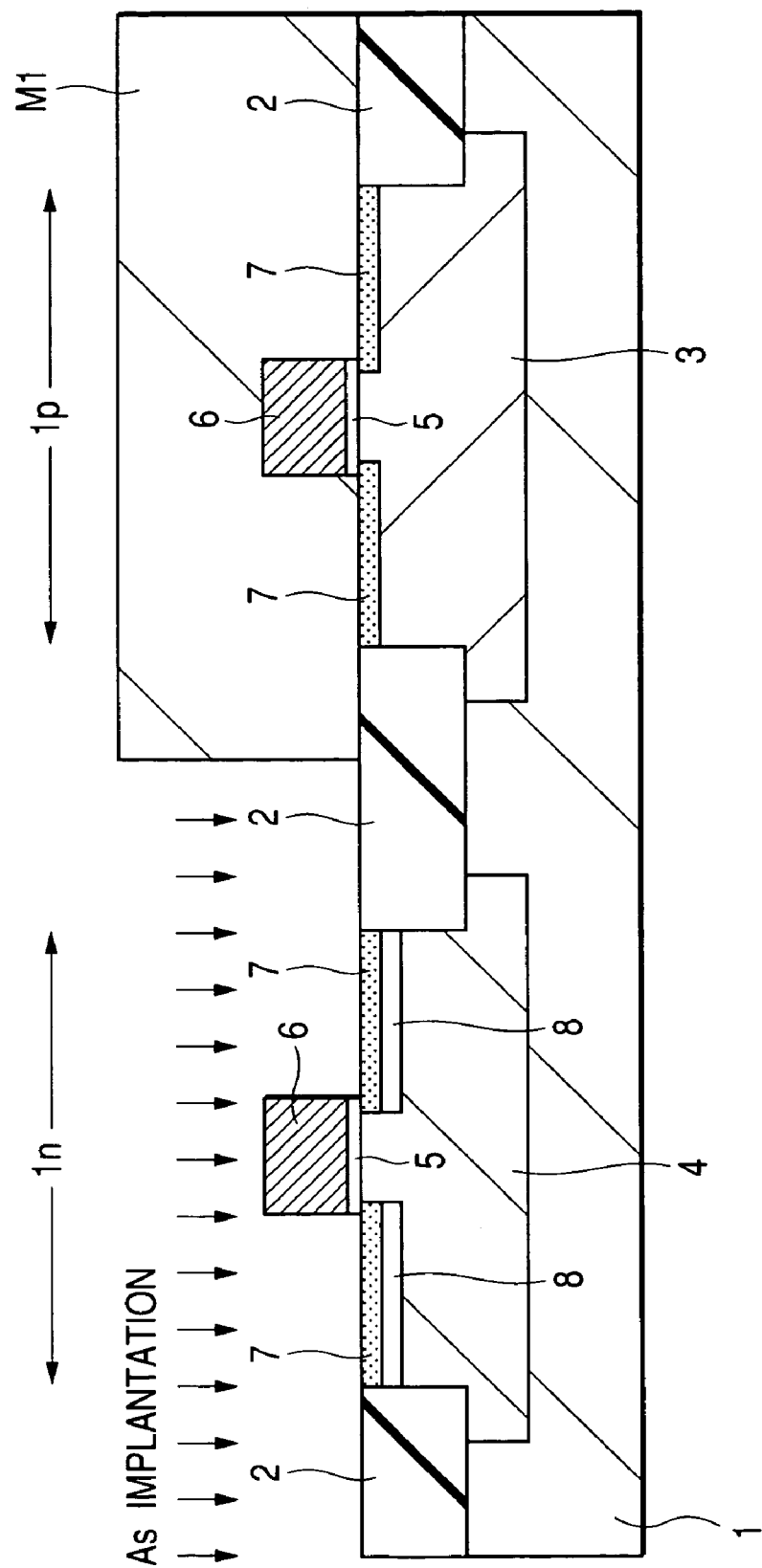
Figure 46:
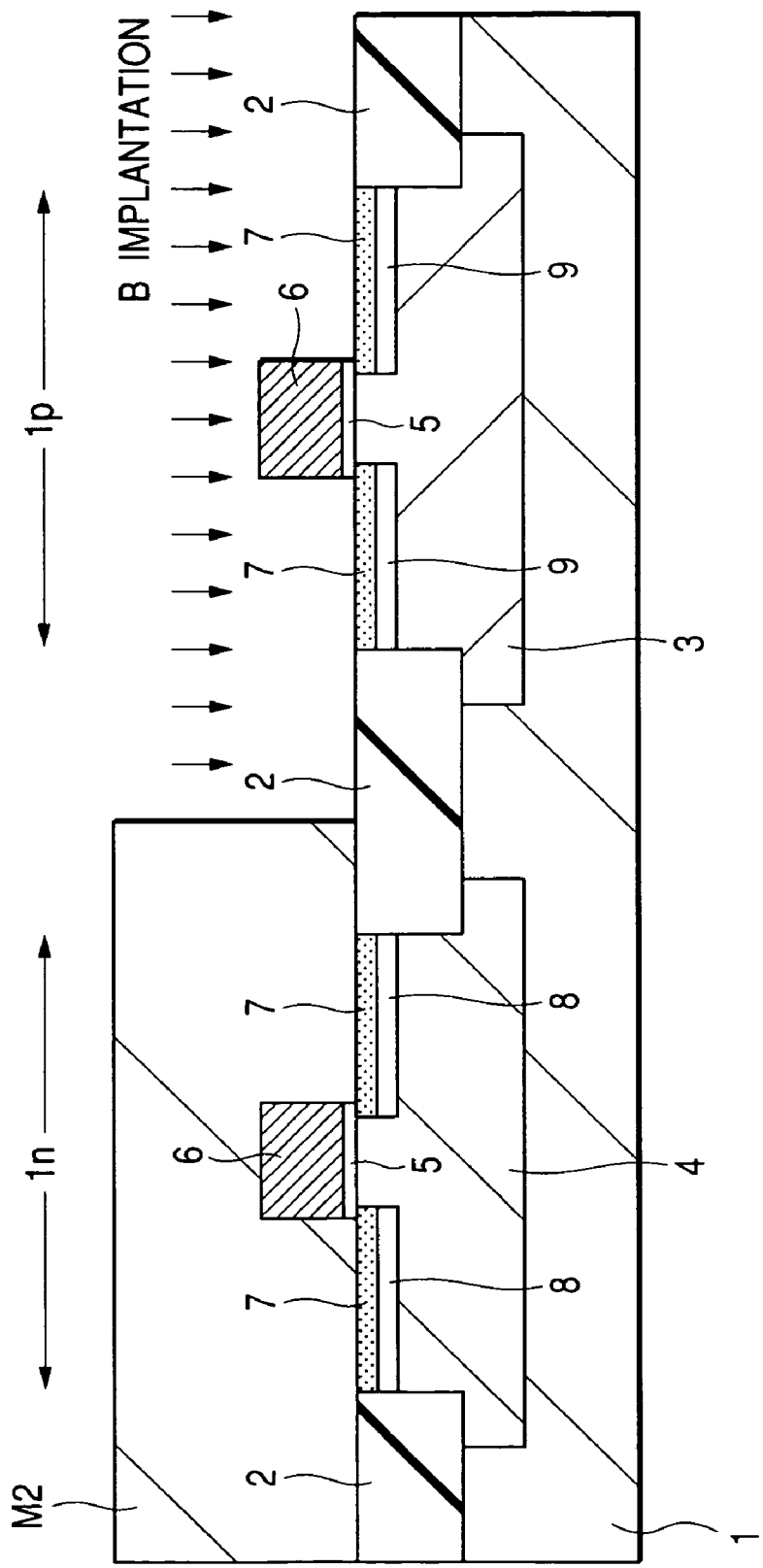
Figure 47:
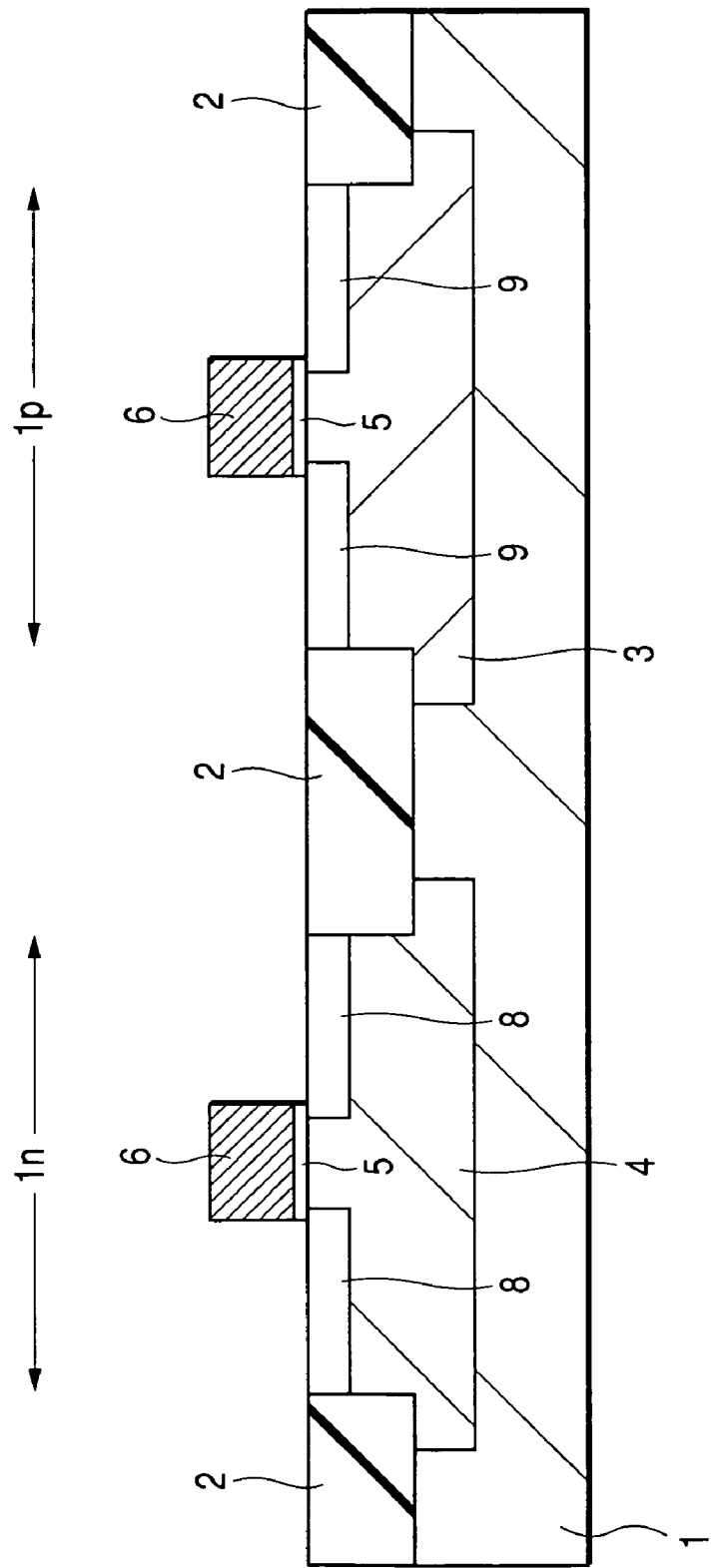
Figure 48:
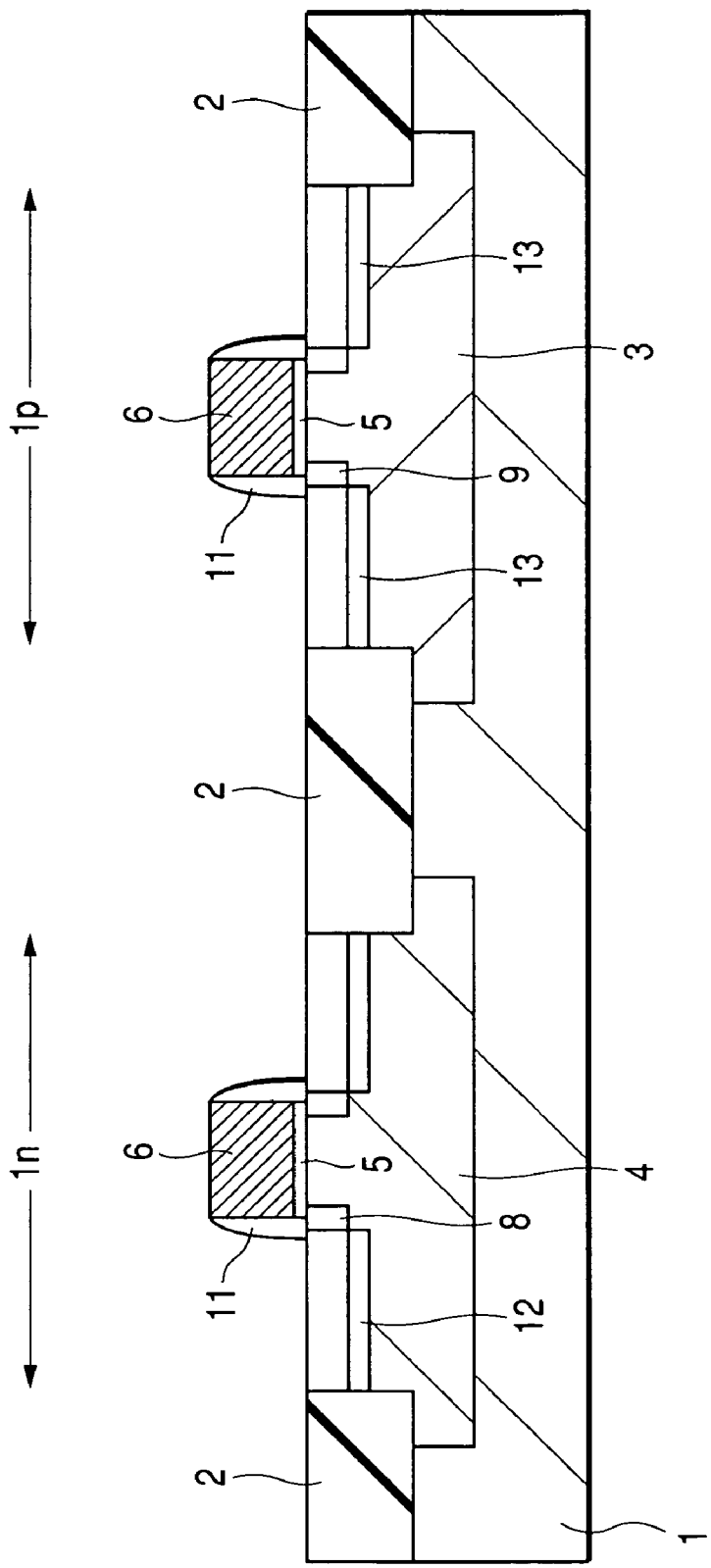

FIGS. 25(*a*) and 25(*b*) are views schematically showing the constitution of a semiconductor device representing a Embodiment 3 according to the invention, in which FIG. 25(*a*) is a schematic cross sectional view of a complementary MISFET and FIG. 25(*b*) is a schematic cross sectional view of a memory cell selecting MISFET;

FIG. 26 is an equivalent circuit diagram of a memory cell mounted on a semiconductor device representing Embodiment 3 according to the invention;

FIGS. 27(*a*) and 27(*b*) are schematic cross sectional views showing manufacturing steps of the semiconductor device representing Embodiment 3 according to the invention;

FIG. 28 is a schematic cross sectional view of a complementary MISFET mounted on a semiconductor device representing Embodiment 4 according to the invention;

FIG. 29 is a schematic cross sectional view showing a manufacturing step of the semiconductor device representing Embodiment 4 according to the invention;

FIG. 30 is a schematic cross sectional view showing a manufacturing step of the semiconductor device succeeding the step of FIG. 29;

FIG. 31 is a schematic cross sectional view showing a manufacturing step of the semiconductor device succeeding the step of FIG. 30;

FIG. 32 is a schematic cross sectional view showing a manufacturing step of the semiconductor device succeeding the step of FIG. 31;

FIG. 33 is a schematic cross sectional view a showing manufacturing step of the semiconductor device succeeding the step of FIG. 32;

FIG. 34 is a schematic cross sectional view showing a manufacturing step of a semiconductor device representing Embodiment 5 according to the invention;

FIG. 35 is a schematic cross sectional view showing a manufacturing step of the semiconductor device succeeding the step of FIG. 34;

FIG. 36 is a schematic cross sectional view showing a manufacturing step of the semiconductor device succeeding the step of FIG. 35;

FIG. 37 is a schematic cross sectional view showing a manufacturing step of the semiconductor device succeeding the step of FIG. 36;

FIG. 38 is a schematic cross sectional view showing a manufacturing step of the semiconductor device succeeding the step of FIG. 37;

FIG. 39 is a schematic cross sectional view showing a manufacturing step of a semiconductor device representing Embodiment 6 according to the invention;

FIG. 40 is a schematic cross sectional view showing a manufacturing step of the semiconductor device succeeding the step of FIG. 39;

FIG. 41 is a schematic cross sectional view showing a manufacturing step of the semiconductor device succeeding the step of FIG. 40;

FIG. 42 is a schematic cross sectional view showing manufacturing step of the semiconductor device succeeding the step of FIG. 41;

FIG. 43 is a schematic cross sectional view showing a manufacturing step of the semiconductor device succeeding the step of FIG. 42;

FIG. 44 is a schematic cross sectional view showing a manufacturing step of the semiconductor device representing Embodiment 7 according to the invention;

FIG. 45 is a schematic cross sectional view showing a manufacturing step of the semiconductor device succeeding the step of FIG. 44;

FIG. 46 is a schematic cross sectional view showing a manufacturing step of the semiconductor device succeeding the step of FIG. 45;

FIG. 47 is a schematic cross sectional view showing a manufacturing step of the semiconductor device succeeding the step of FIG. 46; and FIG. 48 is a schematic cross sectional view showing a manufacturing step of the semiconductor device succeeding the step of FIG. 47.

PREFERRED EMBODIMENTS OF THE INVENTION

The present invention is to be described specifically by way of preferred embodiments with reference to the accompanying drawings. Throughout the drawings, those components having identical functions are given identical reference numerals, and duplicate descriptions thereof will be omitted.

Embodiment 1

In Embodiment 1, the description is directed to an example in which the invention is applied to a semiconductor device having a complementary MISFET.

Figure 1:
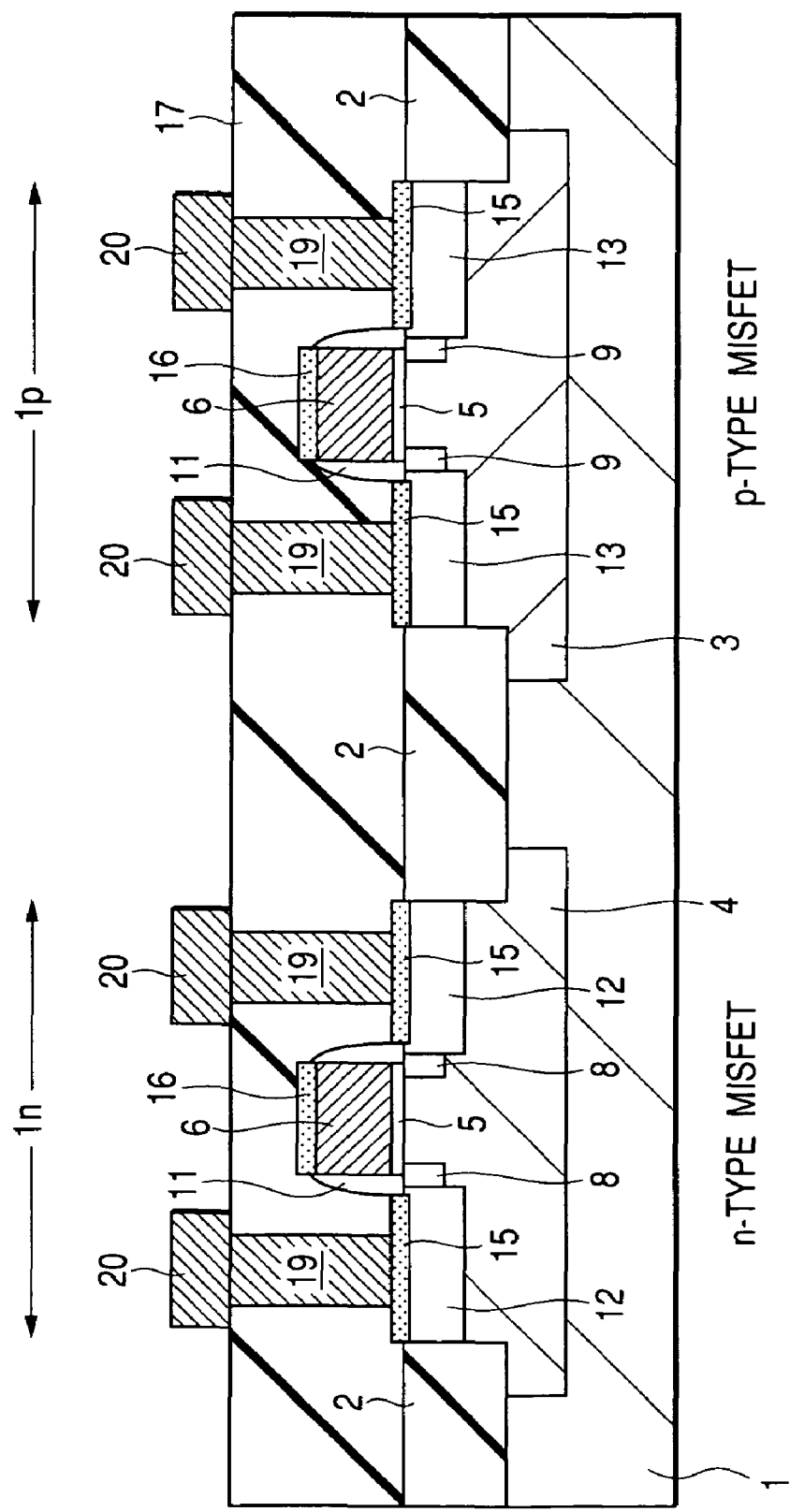
FIG. 1 is a schematic cross sectional view of a complementary MISFET mounted on a semiconductor device representing Embodiment 1 according to the present invention.

FIG. 1 is a schematic cross sectional view showing the schematic constitution of a complementary MISFET mounted on a semiconductor device according to Embodiment 1. In FIG. 1, a n-type MISFET is shown on the left, while a p-type MISFET is shown on the right.

As shown in FIG. 1, the semiconductor device of Embodiment 1 mainly comprises a p-type silicon substrate, for example, made of single crystal silicon serving as a semiconductor substrate (silicon layer as a semiconductor substrate) 1.

The main surface (device forming surface or circuit forming surface) of the silicon substrate 1 has device forming regions 1n and 1p, which are isolated by a device isolation region 2 from each other, in which a p-well region 4 and an n-type MISFET are formed in the device forming region 1n, and an n-well region 3 and a p-type MISFET are formed in the device forming region 1p. The device isolation region 2 is formed, for example, of a shallow groove isolation (SGI) region. The shallow groove isolation region is formed by forming a shallow groove in a main surface of the silicon substrate 1 and then selectively burying an insulating film (for example, silicon oxide film) to the inside of the shallow groove. Each of the n-type and p-type MISFET of this embodiment has a horizontal structure in which the drain current flows in the direction of the plane of the silicon substrate 1.

Each of the n-type and the p-type MISFET has a constitution mainly comprising a channel forming region, a gate insulating film 5, a gate electrode 6, and a source region and a drain region. The gate insulating film 5 is disposed on the main surface of the silicon substrate 1, the gate electrode 6 is disposed by way of the gate insulating film 5 above the main surface of the silicon substrate 1 and the channel forming region is disposed to the surface layer of the silicon substrate 1 just below the gate electrode 6. The source region and the drain region are disposed on both sides of the channel forming region along the direction of channel length so that the channel forming region is disposed therebetween.

The source region and the drain region of the n-type MISFET has a constitution comprising a pair of n-semiconductor regions 8 serving as the extension region, and a pair of n-semiconductor regions 12 serving as the contact region. The n-semiconductor region 8 is formed so as to be aligned with the gate electrode 6 and the n-semiconductor region 12 is formed so as to be aligned with the side wall spacer 11 that is disposed to the side wall of the gate electrode 6.

The source region and the drain region of the p-type MISFET has a constitution comprising a pair of p-semiconductor regions 9, serving as the extension region, and a pair of p-semiconductor regions 13 serving as the contact region. The p-semiconductor region 9 is formed so as to be aligned with the gate electrode 6 and the p-semiconductor region 13 is formed so as to be aligned with the side wall spacer 11 that is disposed to the side wall of the gate electrode 6.

In the n-type and p-type MISFET, silicide layers (15, 16) serving as metal semiconductor reaction layers are formed to the respective surfaces of the gate electrodes 6, the n-semiconductor regions 12 and the p-type semiconductor regions 13 for reducing the resistance. The silicide layers 15 and 16 are formed so as to be aligned with the side wall spacer 11, for example, by a salicide (Self Aligned Silicide) technique. That is, each of the n-type and p-type MISFET of this embodiment has a salicide structure.

Over the main surface of the silicon substrate 1, an interlayer insulating film 17, for example, comprising a silicon oxide film is disposed so as to cover the n-type and p-type MISFET. Above the n-semiconductor region 12 and the p-type semiconductor region 13 are formed source-drain contact holes reaching from the surface of the interlayer insulating film 17 to the silicide layer 15. A conductive plug 19 is buried to the inside of the source-drain contact hole. The n- and p-semiconductor regions (12, 13) are connected electrically by way of the suicide layer 15 and the conductive plug 19 with wirings 20 extending on the interlayer insulating film 17.

While not illustrated, a gate contact hole reaching from the surface of the interlayer insulating film 17 to the silicide layer 16 is formed above the gate electrode 6 of the n-type and p-type MISFET, and a conductive plug 19 is buried inside of the gate contact hole. The gate electrode 6 is electrically connected by way of the silicide layer 16 and the conductive plug 19 inside the gate contact hole with the wirings 20 extending on the interlayer insulating film 17.

The n-semiconductor region 8 serving as the extension region of the n-type MISFET is formed by ion implanting, for example, arsenic (As) as an impurity from the main surface of the silicon substrate 1 to the inside thereof. The n-semiconductor region 8 is incorporated with a group IV element, for example, germanium (Ge) introduced from the main surface of the silicon substrate 1 to the inside thereof by way of ion implantation. The peak value in the concentration distribution of Ge is located closer to the main surface of the silicon substrate 1 from the peak value for the impurity concentration distribution of As, that is, at a shallower level. Ion implantation of Ge in the device forming region 1n is conducted, as will to be specifically described later, to a level shallower than the implantation depth of impurities (for example, As) in the step of forming the n-semiconductor region 8, before the step of forming the n-semiconductor region 8 as the extension region of the n-type MISFET.

The p-semiconductor region 9 serving as the extension region of the p-type MISFET is formed by ion implanting, for example, boron difluoride ($BF_2$) as an impurity from the main surface of the silicon substrate 1 to the inside thereof. The p-semiconductor region 9 is incorporated with a group IV element, for example, germanium (Ge) that is introduced from the main surface of the silicon substrate 1 to the inside thereof by way of ion implantation. The peak value in the concentration distribution of Ge is located closer to the main surface of the silicon substrate 1 from the peak value for the impurity concentration distribution of As, that is, at a shallower level. Ion implantation of Ge in the device forming region 1p is conducted, as will be described specifically later, to a level shallower than the implantation depth of impurities (for example, $BF_2$) in the step of forming the p-semiconductor region 9, before the step of forming the p-semiconductor region 9 as the extension region of the p-type MISFET.

In this Embodiment 1, Ge ion implantation to the device forming regions 1n and 1p is conducted in one identical step.

Now, manufacture of the semiconductor device according to Embodiment 1 will be described with reference to FIG. 2 to FIG. 14. FIG. 2 to FIG. 14 are schematic cross sectional views showing successive steps in the manufacture of a semiconductor device.

Figure 2:
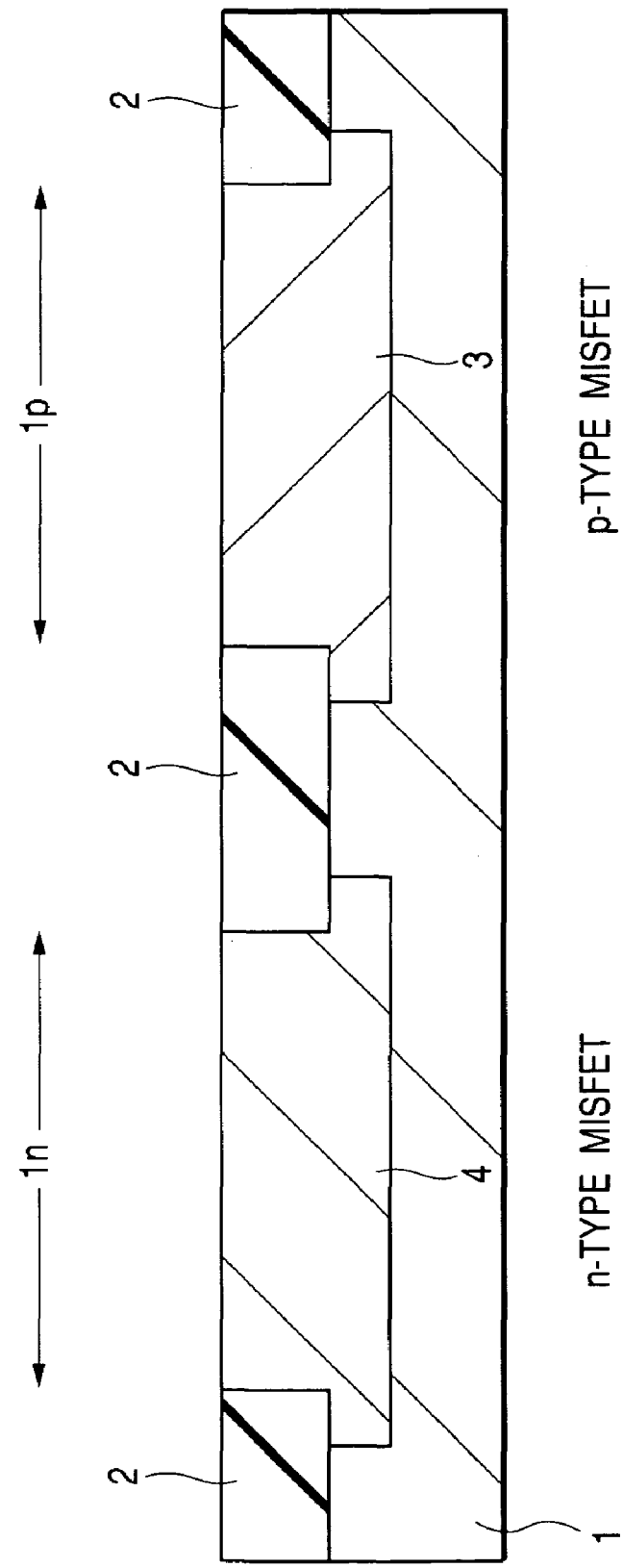
FIG. 2 is a schematic cross sectional view showing a manufacturing step of the semiconductor device of Embodiment 1 according to the invention.

At first, a silicon substrate 1 comprising single crystal silicon having a specific resistivity of 10 Ωcm is provided, and then, as shown in FIG. 2, a p-well region 4 is formed to a device forming region 1n and an n-well region 3 is formed to a device forming region 1p of a main surface of a silicon substrate 1, selectively.

Then, as shown in FIG. 2, a shallow isolation region is formed as a device isolation region 2 for isolating the device forming regions 1n and 1p on the main surface of the silicon substrate 1. The shallow groove isolation region is formed by forming a shallow groove (a groove of about 300 nm depth) to the main surface of the silicon substrate 1, then forming an insulating film, for example, comprising a silicon oxide film, on the main surface of the silicon substrate 1 by a chemical vapor deposition (CVD) method and then flattening the same by a CMP (Chemical Mechanical Polishing) method so as to selectively leave the insulating film in the inside of the shallow groove. Subsequently, the surface of the silicon substrate 1 is cleaned to remove obstacles and contaminates, such as abrasive grain slurries that have been deposited on the surface of the silicon substrate 1, including the device forming regions 1n and 1p.

Figure 3:
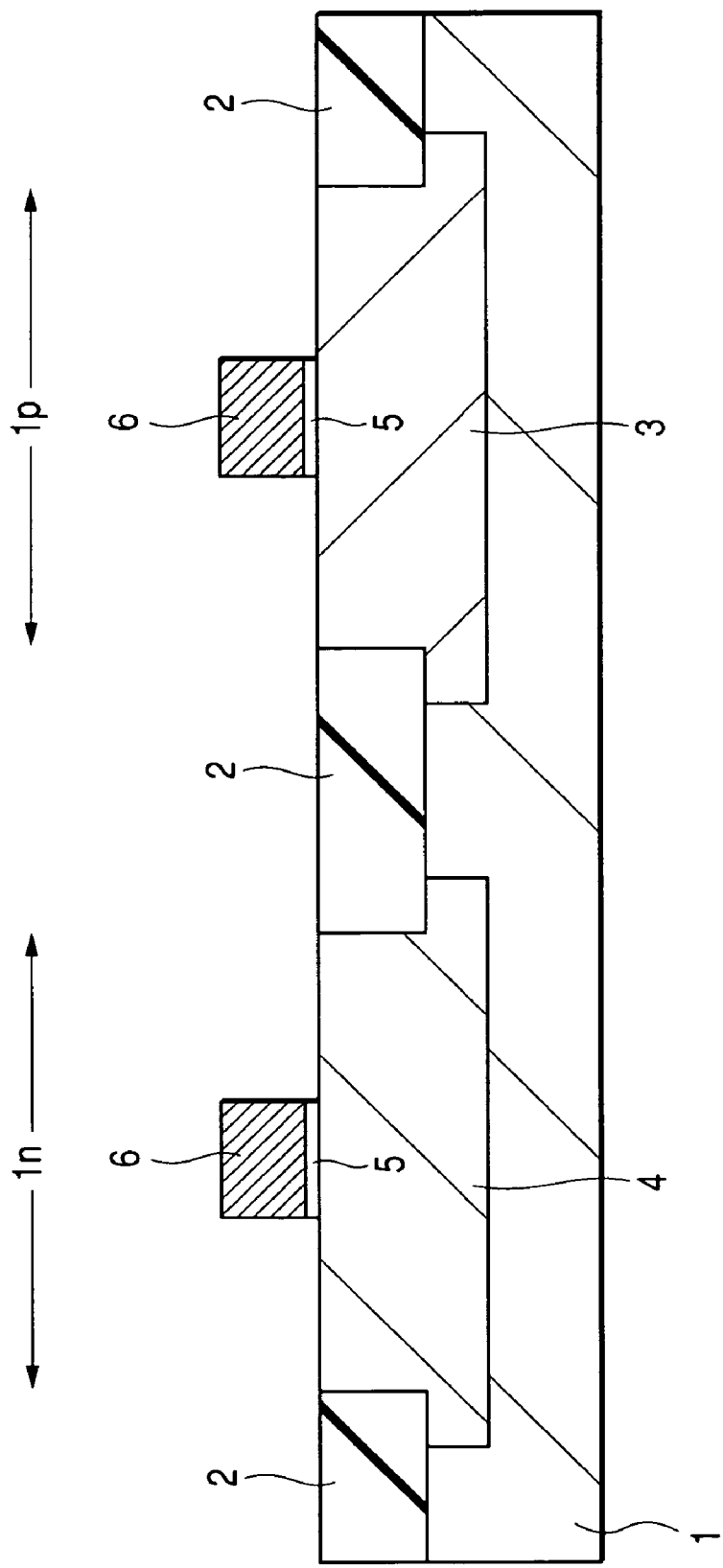
FIG. 3 is a schematic cross sectional view showing a manufacturing step of the semiconductor device succeeding the step of FIG. 2.

Then, a gate insulating film, for example, comprising a silicon oxide film of about 2 to 3 nm is formed by a heat treatment on the device forming regions 1n and 1p of the main surface of the silicon substrate 1, and a polycrystal silicon film, for example, of about 150 to 200 nm thickness is formed over the entire surface of the main surface of the silicon substrate 1, and then the polycrystal silicon film is patterned to form gate electrodes 6, as shown in FIG. 3. Impurities for reducing the resistance value are introduced to the polycrystal silicon film during or after deposition.

Figure 4:
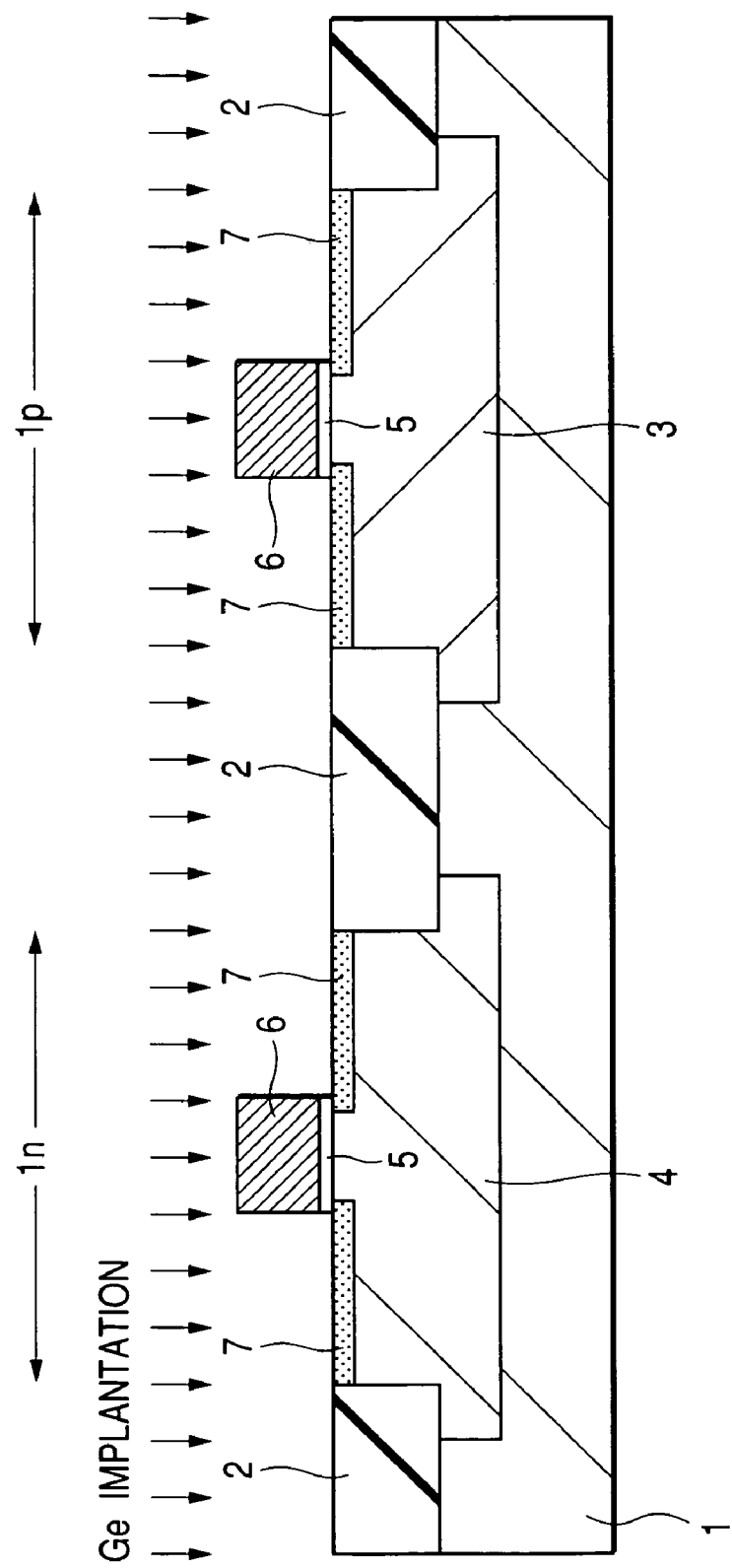
FIG. 4 is a schematic cross sectional view showing a manufacturing step of the semiconductor device succeeding the step of FIG. 3.

Then, before the step of forming extension regions of the n-type and p-type MISFET, an IV group element, for example, Ge (germanium) is ion implanted from the main surface of the silicon substrate 1 to the inside of the device forming region 1n and 1p thereof, specifically, to the portions of the p-well region 4 and the n-well region 3 where the gate electrodes 6 are not formed, as shown in FIG. 4. The Ge ion implantation forms an amorphous layer 7 in the device forming regions 1n and 1p of the main surface of the silicon substrate 1 so as to be aligned with the gate electrode 6.

Ge ion implantation is conducted to a level shallower than the ion implantation depth of the impurities in the step of forming the extension region of the n-type and p-type MISFET. In this embodiment, Ge ion implantation is conducted under the conditions, for example, at an acceleration energy of about 3 KeV and at a dose of about $5 \times 10^{14}$–$2 \times 10^{15}$ atoms/cm$^2$.

Figure 5:
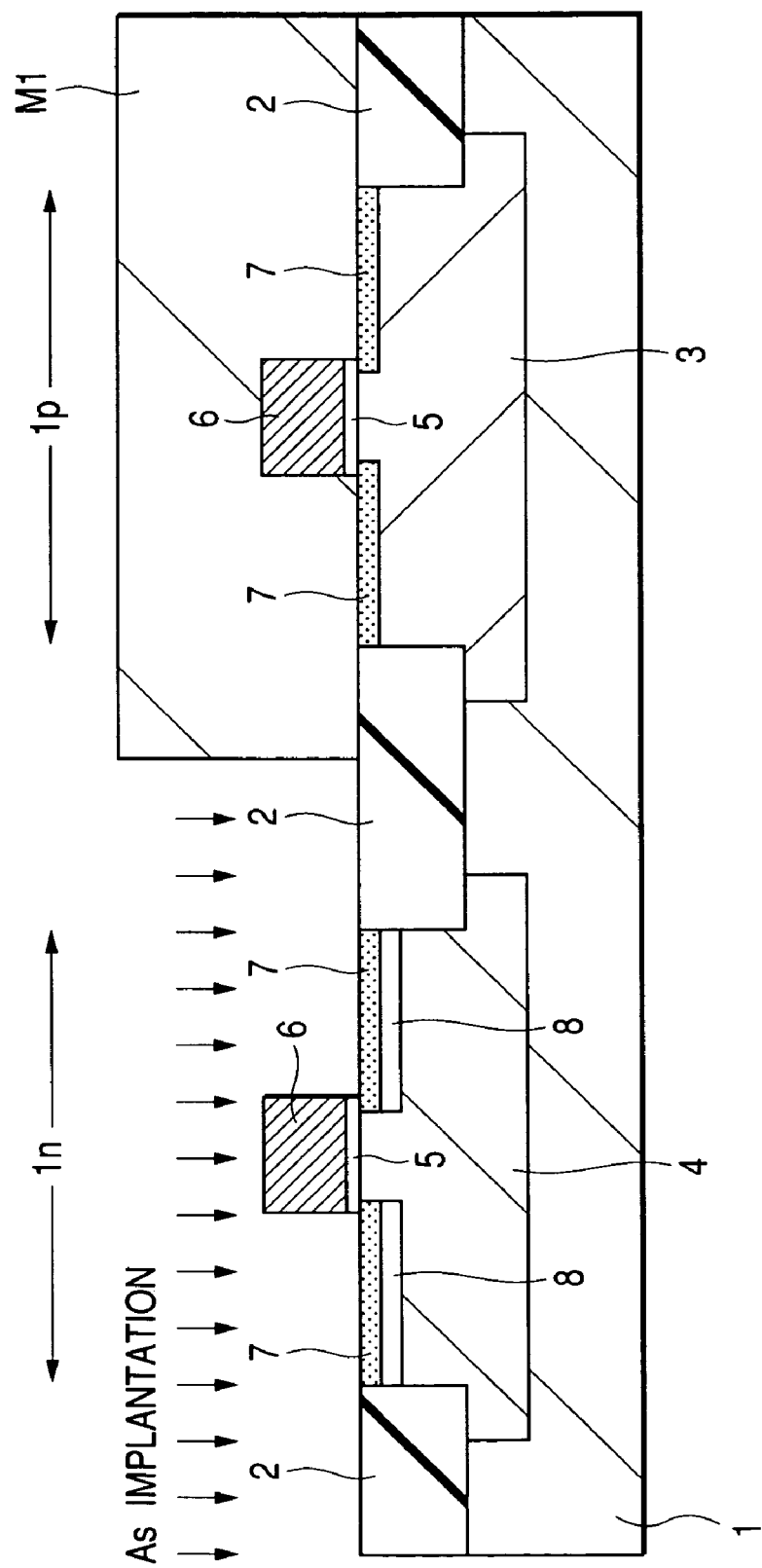
FIG. 5 is a schematic cross sectional view showing a manufacturing step of the semiconductor device succeeding the step of FIG. 4.

Then, as shown in FIG. 5, impurities, for example, As (arsenic) are ion implanted from the main surface of the silicon substrate 1 to the inside of the device forming region 1n thereof, specifically, to a portion of the p-well region 4 where the gate electrode 6 is not formed in a state of selectively covering the device forming region 1p of the main surface of the silicon substrate 1 with a mask M1. A pair of n-semiconductor regions (extension regions) 8 are formed so as to be aligned with the gate electrode 6 in the device forming region 1n of the main surface of the silicon substrate 1 by As ion implantation. In this embodiment, As ion implantation is conducted under the conditions, for example, at an acceleration energy of about 1 to 3 KeV and at a dose of about $1 \times 10^{14}$ to $2 \times 10^{15}$ atoms/cm$^2$. In this case, the acceleration energy upon As ion implantation is preferably equal with or higher than that for Ge. Since the molecular weight of As is about equal with the molecular weight of Ge, As is formed at a position deeper than that for Ge. As the mask M1, a photoresist mask formed, for example, by photolithography is used.

Figure 6:
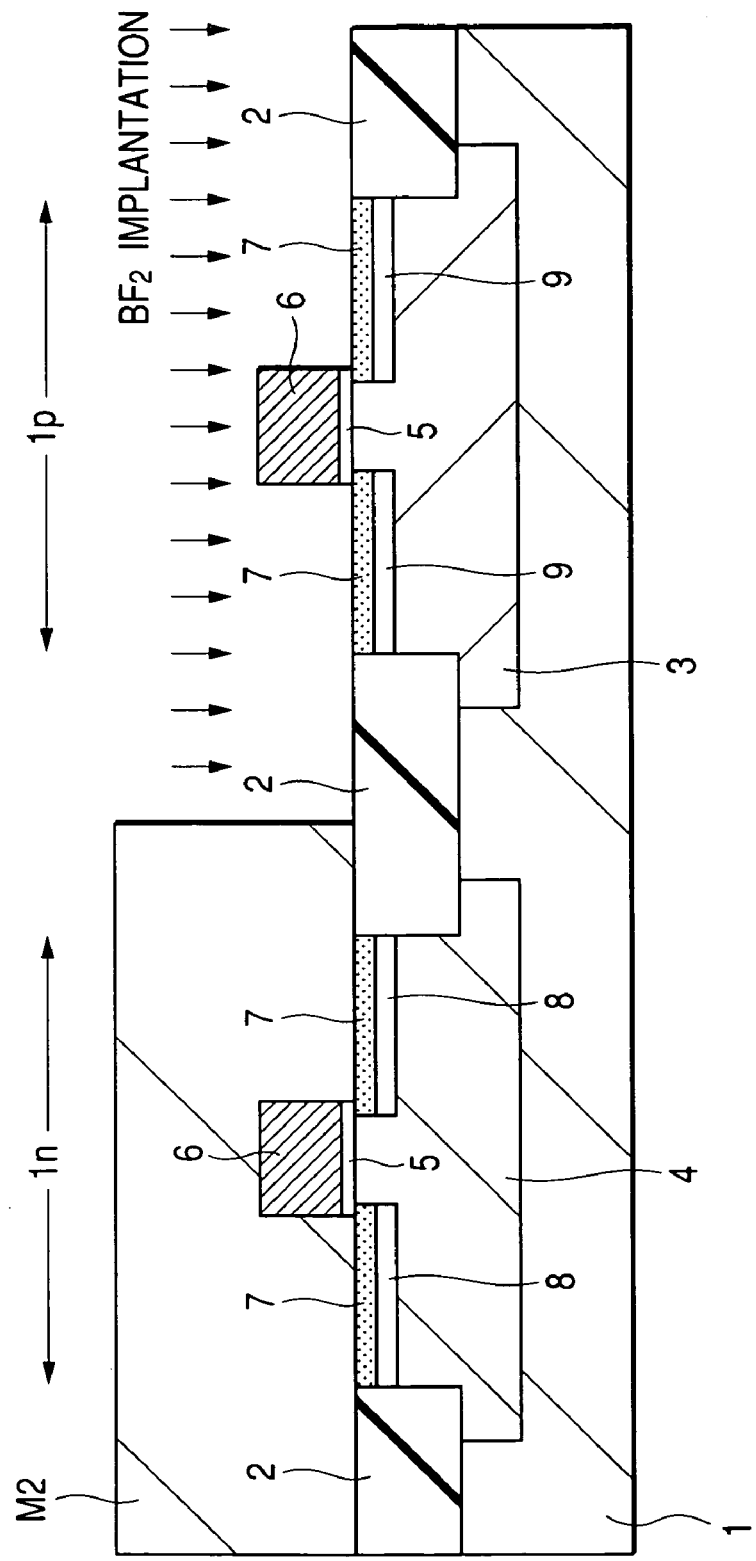
FIG. 6 is a schematic cross sectional view showing a manufacturing step of the semiconductor device succeeding the step of FIG. 5.

Then, after removing the mask M1, impurities, for example, $BF_2$ (boron difluoride) are ion implanted from the main surface of the silicon substrate 1 to the inside of the device forming region 1p thereof, specifically, to a portion of the n-well region 3 where the gate electrode 6 is not formed in a state of selectively covering the device forming region 1n of the main surface of the silicon substrate 1 with a mask M2, as shown in FIG. 6. A pair of p-semiconductor regions (extension regions) 9 are formed so as to be aligned with the gate electrode 6 in the device forming region 1p of the main surface of the silicon substrate 1 by the $BF_2$ ion implantation. In this embodiment, $BF_2$ ion implantation is conducted under the conditions, for example, at an acceleration energy of about 1 to 3 KeV and at a dose of about $1 \times 10^{14}$ to $2 \times 10^{15}$ atoms/cm$^2$. $BF_2$ is used as a means for forming the p-semiconductor region 9, because $BF_2$ has a larger molecular weight than B and the diffusion coefficient is smaller. If B were used, since B diffuses excessively in the lateral direction and the direction of the depth relative to the semiconductor substrate upon heat treatment for activating impurities to be described later, the uniformity in the plane can not be maintained and, as a result, it is more difficult to attain the extremely shallow junction intended by the invention compared with a case of using $BF_2$. That is, in this embodiment, it is intended to attain an extremely shallow junction by the use of impurities having a larger molecular weight than B.

As the mask M2, a photoresist mask formed, for example, by photolithography is used.

Figure 7:
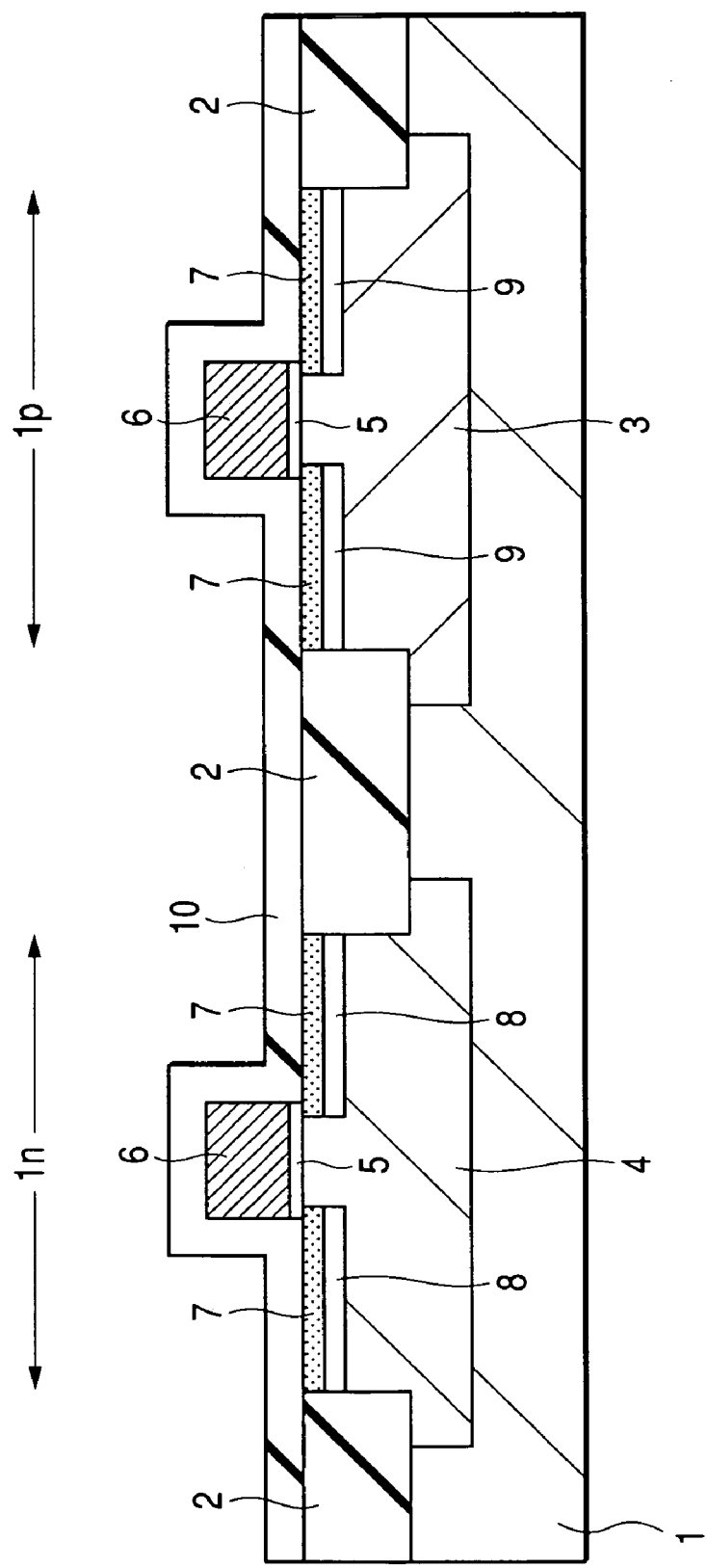
FIG. 7 is a schematic cross sectional view showing a manufacturing step of the semiconductor device succeeding the step of FIG. 6.
Figure 8:
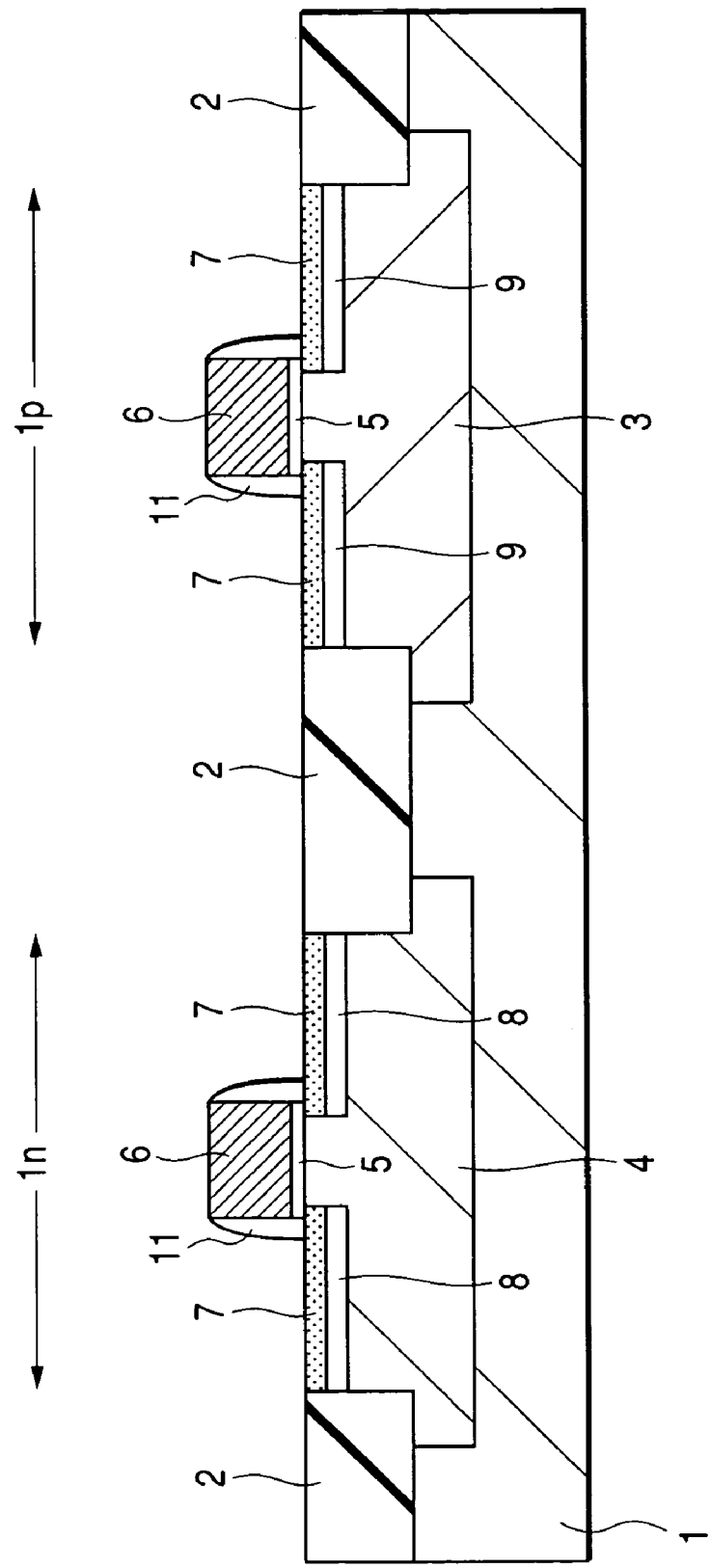
FIG. 8 is a schematic cross sectional view showing a manufacturing step of the semiconductor device succeeding the step of FIG. 7.

Then, after removing the mask M2, a side wall spacer 11 having a film thickness, for example, of about 50 to 70 nm in the direction of the gate length is formed on the side walls of the gate electrode 6, as shown in FIG. 8. The side wall spacer 17 is formed, as shown in FIG. 7, by forming an insulating film 10 comprised, for example, of silicon oxide over the entire main surface of the silicon substrate 1 by a CVD method and then applying anisotropic etching such as RIE (Reactive Ion Etching) to the insulating film 10. The side wall spacer 11 is formed so as to be aligned with the gate electrode 6.

Figure 9:
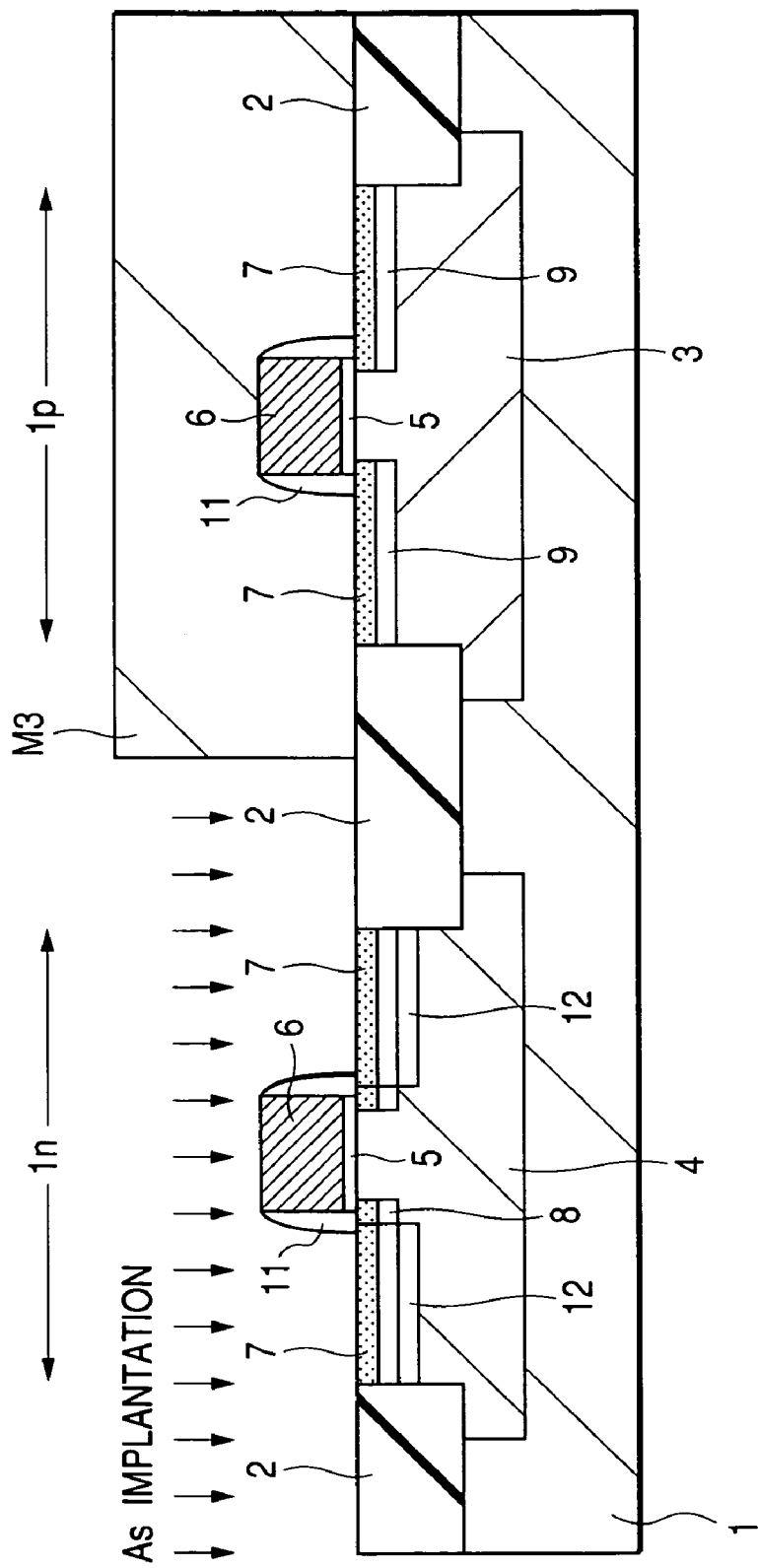
FIG. 9 is a schematic cross sectional view showing a manufacturing step of the semiconductor device succeeding the step of FIG. 8.

Then, as shown in FIG. 9, impurities, for example, As are ion implanted from the main surface of the silicon substrate 1 to the inside of the device forming region 1n thereof, specifically, to a portion of the p-well region 4 where the gate electrode 6 is not formed in a state of selectively covering the device forming region 1p of the main surface of the silicon substrate 1 with a mask M3. A pair of n-semiconductor regions (contact regions) 12 are formed so as to be aligned with the side wall spacer 11 in the device forming region 1n of the silicon substrate 1 by the As ion implantation. In this embodiment, As ion implantation is conducted under the conditions, for example, at an acceleration energy of about 20 to 45 KeV and at a dose of about 2 to $4 \times 10^{15}$ atoms/cm$^2$. As the mask M3, a photoresist mask formed, for example, by photolithography is used.

Figure 10:
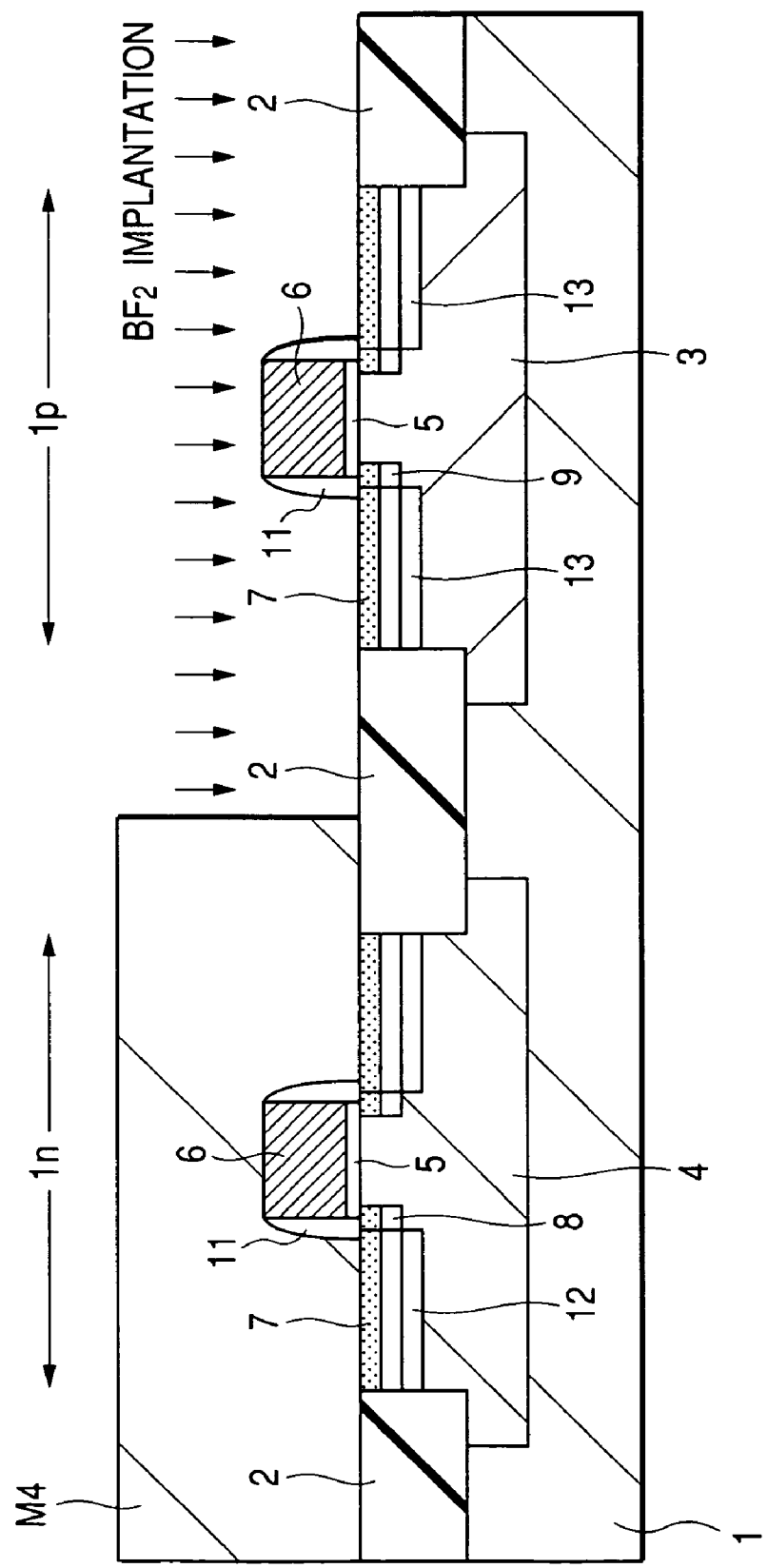
FIG. 10 is a schematic cross sectional view showing a manufacturing step of the semiconductor device succeeding the step of FIG. 9.

Then, after removing the mask M3, as shown in FIG. 10, impurities, for example, $BF_2$ (boron difluoride) are ion implanted from the main surface of the silicon substrate 1 to the inside of the device forming the region 1p thereof, specifically, in the portion of the n-well region 3 where the gate electrode 6 is not formed in a state of selectively covering the device forming region 1n of the main surface of the silicon substrate 1 with a mask M4. A pair of p-semiconductor regions (contact regions) 13 are formed so as to be aligned with the side wall spacer 11 in the device forming region of the silicon substrate 1 by $BF_2$ ion implantation. In this embodiment, $BF_2$ ion implantation is conducted under the conditions, for example, at an acceleration energy of about 20 to 50 KeV and at a dose of about 2 to $4 \times 10^{15}$ atoms/cm$^2$. As the mask M4, a photoresist mask formed, for example, by photolithography is used.

Then, after removing the mask M4, impurities (As, $BF_2$) ion implanted in the step of forming the n-semiconductor region 8, the step of forming the p-semiconductor region 9, the step of forming the n-semiconductor region 12 and the step of forming the p-semiconductor region 13 are activated by heat treatment.

The heat treatment is conducted by using a sheet type annealing apparatus usually referred as a spike annealing apparatus having an extremely high temperature up/down rate under the condition at a temperature of 1000° C. and for a heating time of 1 sec.

Figure 11:
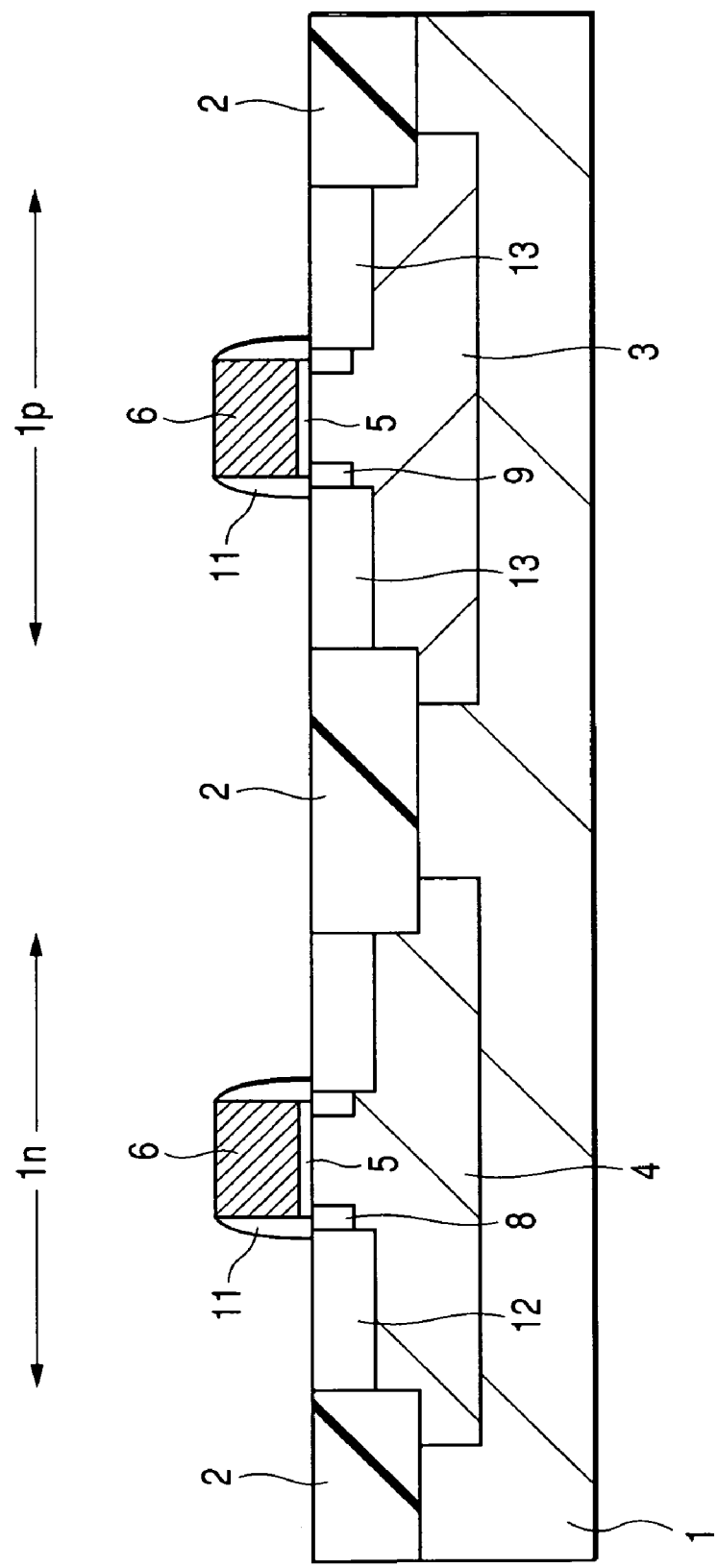
FIG. 11 is a schematic cross sectional view showing a manufacturing step of the semiconductor device succeeding the step of FIG. 10.

In the step, an amorphous portion (amorphous layer 7) in the silicon substrate (silicon layer) formed by Ge ion implantation is recovered into original single crystals. Further, amorphous portions (semiconductor regions 8, 9, 12, 13) in the silicon substrate (silicon layer) formed by ion implantation of the impurities (As, $BF_2$) are also recovered from amorphous form into original single crystals, as shown in FIG. 11.

Further, in this step, since Ge, which is the element belonging to the group IV identical with that of the silicon substrate (silicon layer), is ion implanted previously to the device forming regions 1n and 1p of the main surface of the silicon substrate 1 to a level shallower than the ion implantation depth of the impurities (As, $BF_2$) in the step of forming the semiconductor regions (8, 9, 12, 13), after the step of forming the gate electrode 6 and before the step of forming the semiconductor regions (8, 9, 12, 13), a Si—Ge—X (X: As, $BF_2$) bond is formed, which improves the activation of the impurities in the silicon substrate (silicon layer) and increases the concentration of the impurities contributing to the conduction more than in the case of Si—X alone (the amount of unreacted impurities not bonded with Si is decreased).

As a result, since the resistance of the n-type and p-type MISFET extension regions (semiconductor regions 8, 9), particularly, the resistance on the surface is lowered, the drain current Ids in the n-type and p-type MISFET can be increased (current driving performance can be improved).

Further, Ge is ion implanted also in the contact regions (semiconductor regions 12, 13) of the n-type and p-type MISFET. Accordingly, since activation of impurities in the silicon substrate (silicon layer) is improved also in the contact regions and the concentration of the impurities contributing to conduction is increased (amount of unreacted impurities not bonding with Si is decreased), the resistance in the contact region, particularly, the resistance on the surface is lowered.

In a case where Ge is ion implanted to a level deeper than the impurities (As, $BF_2$) in the step of forming the extension regions (semiconductor regions 8, 9), since the impurities ion implanted in the step of forming the extension regions tend to diffuse easily due the effect of crystal defects caused by Ge ion implantation, the junction depth in the extension regions (semiconductor regions 8, 9) is increased. Accordingly, since the diffusion of the ion implanted impurities can be suppressed in the step of forming the extension regions by Ge ion implantation to a level shallower than the implantation depth of the impurities in the step of forming the extension regions as in this embodiment, extension regions of low resistance with shallow junction depth can be formed.

Further, in a case of ion implanting Ge after the ion implantation of impurities in the step of forming the extension regions (semiconductor regions 8, 9), impurities (As, $BF_2$) in the step of forming the extension regions are ion implanted into single crystals. In the single crystals having a regularity in the arrangement of atoms, since a channeling phenomenon in which impurities reach deeply through the gaps in the arrangement of atom tends to occur, the junction depth of the extension region is increased. On the other hand, in the amorphous layer where the atoms are in irregular arrangement, the channeling phenomenon occurs less. Accordingly, extension regions of low resistance with a shallow junction depth can be formed by Ge ion implantation from the main surface to the inside of the silicon substrate (silicon layer) after the step of forming the gate electrode 6 and before the step of forming the extension region.

Figure 12:
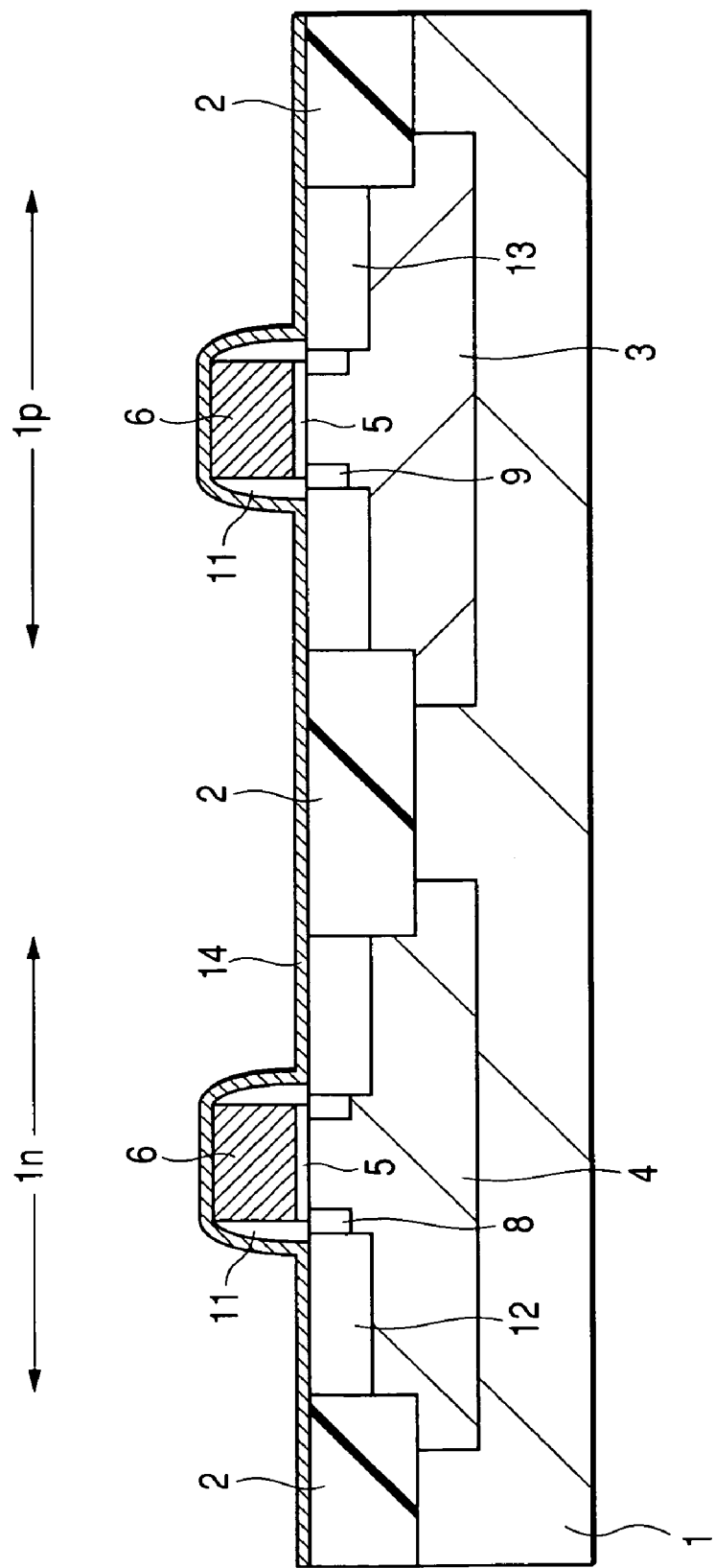
FIG. 12 is a schematic cross sectional view showing a manufacturing step of the semiconductor device succeeding the step of FIG. 11.
Figure 13:
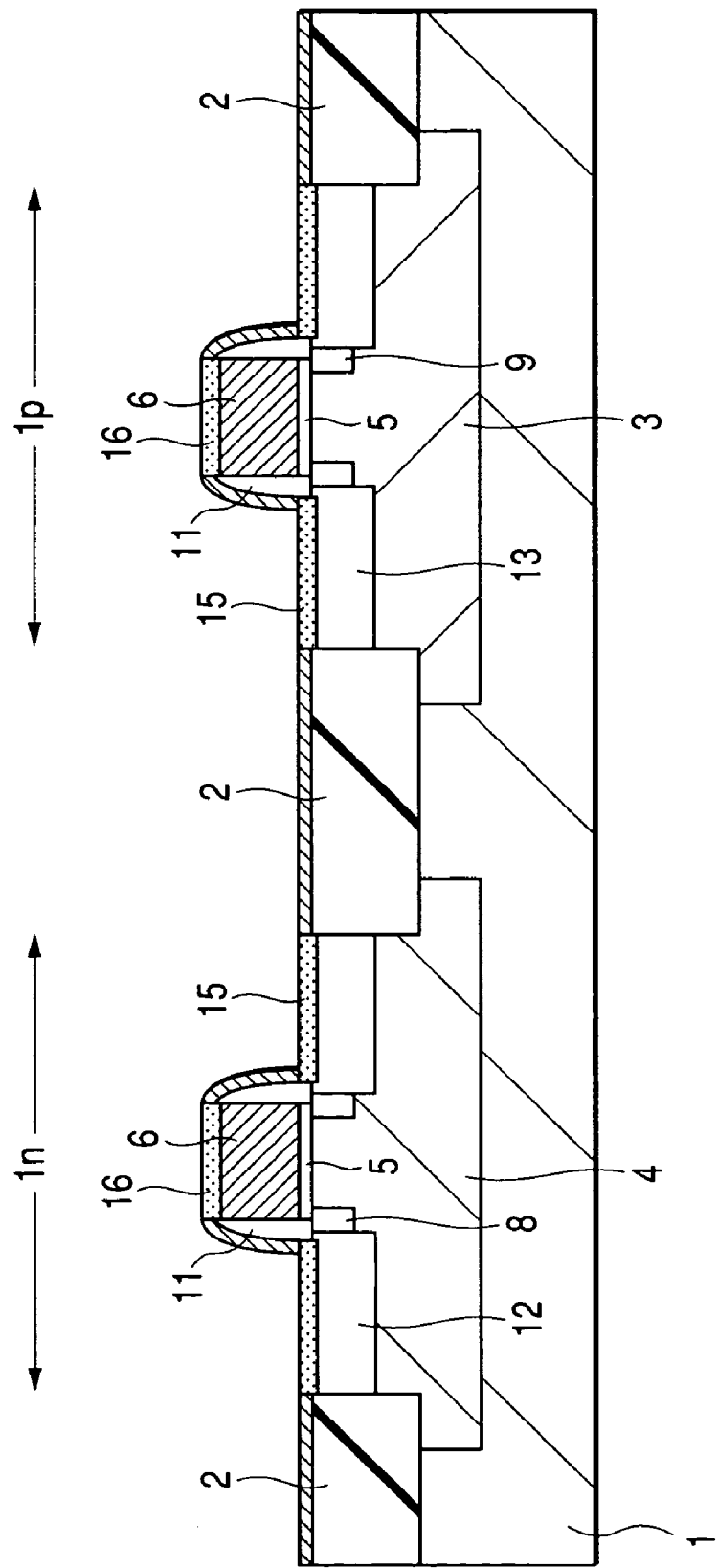
FIG. 13 is a schematic cross sectional view showing a manufacturing step of the semiconductor device succeeding the step of FIG. 12.

Then, after exposing the surface of the gate electrode 6 and the semiconductor regions (12, 13) by removing spontaneous oxide film or the like, a cobalt (Co) film 14 is formed, for example, as a refractory metal film over the entire main surface of the silicon substrate 1, including the surfaces thereof, as shown in FIG. 12 and, subsequently, a heat treatment for reacting silicon (Si) of the semiconductor regions (12, 13) and Si of the gate electrode 6 with Co of the cobalt film 14 is applied to react Si on the surface of the semiconductor regions 12, 13 and on the gate electrode 6 to form silicide (CoSi) layers 15 and 16 as a metal semiconductor reaction layer to the surface of the semiconductor regions (12, 13) and to the surface of the gate electrodes 6, as shown in FIG. 13. The silicide layers 15 and 16 are formed so as to be aligned with the side wall spacer 11.

Then, while the silicide layer 15 on the semiconductor regions (12, 13) is formed by thermally reacting Si of the silicon substrate and Co of the cobalt film 14 in the semiconductor regions (12, 13), when activation of the impurities on the surface of the semiconductor regions (12, 13) is insufficient, since the amount of unreacted impurities not bonded with Si of the silicon substrate is increased, silicidation is inhibited by the effect of the unreacted impurities, and a coagulation portion of CoSi with a resistance higher than the silicide layer 15 tends to be formed to the silicide layer 15. The silicide layer 15 is disposed for suppressing an increase in the source-drain resistance caused by refinement of the MISFET. Accordingly, when the coagulation portion of the CoSi is formed due to the effect of unreacted impurities, this reduces the effect of suppressing the increase in the source-drain resistance due to the refinement of the MISFET.

On the contrary, since the surface of the semiconductor regions (12, 13) in this embodiment is activated by a Si—Ge—X (X: As, $BF_2$) bond due to Ge ion implantation and the amount of unreacted impurities not bonded with Si is decreased, coagulation of CoSi in the siliciding reaction can be suppressed.

Figure 14:
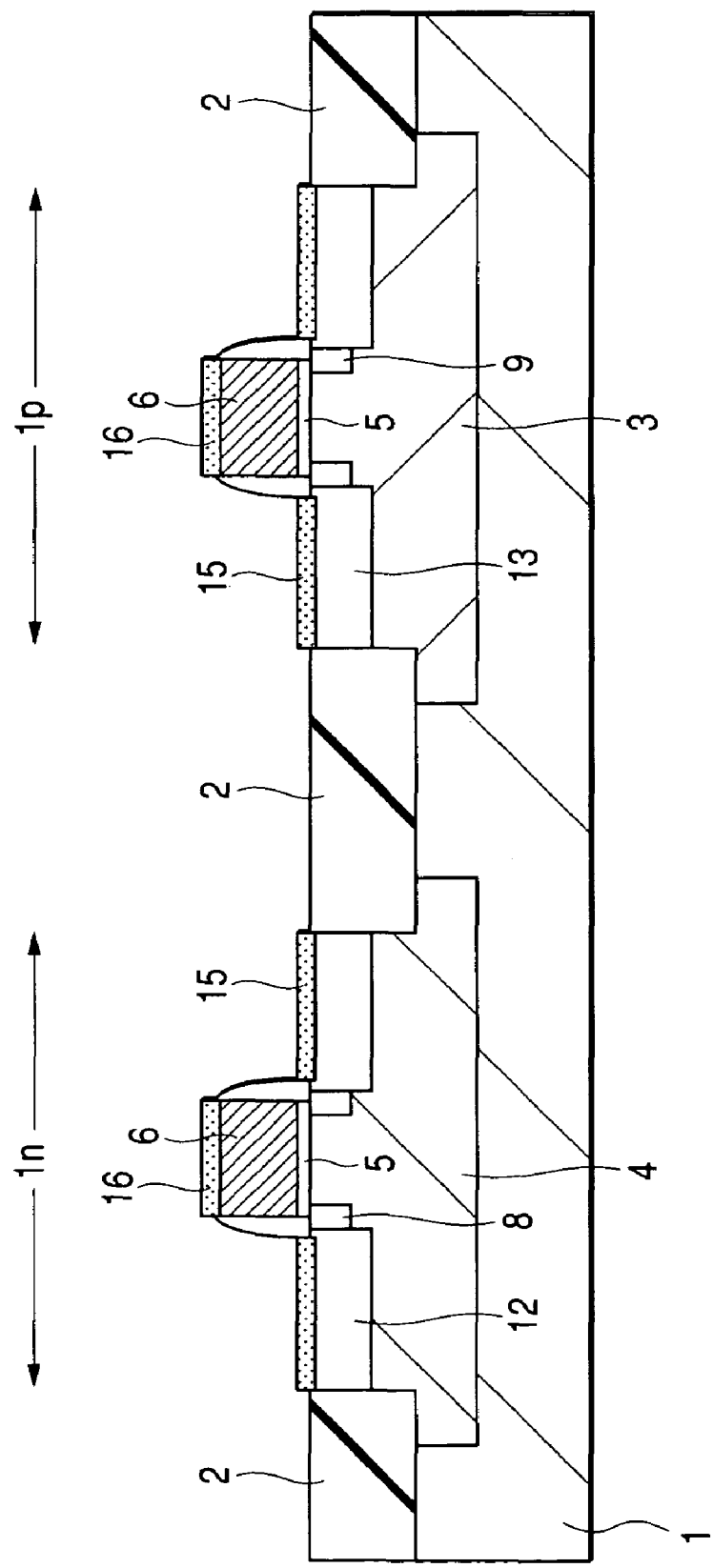
FIG. 14 is a schematic cross sectional view showing a manufacturing step of the semiconductor device succeeding the step of FIG. 13.

Then, as shown in FIG. 14, an unreacted cobalt film 14, other than in the region where silicide layers (15, 16) are formed, is removed selectively, as shown in FIG. 14, and then a heat treatment for activating the silicide layers (15, 16) is applied. Then, an interlayer insulative fim 17, for example, comprising a silicon oxide film, is formed over the entire main surface of the silicon substrate 1 including the area on the n-type and p-type MISFET by a CVD process, and, then, the surface of the interlayer insulating film 17 is planarized by a CMP process.

Then, source-drain contact holes reaching from the surface of the interlayer insulating film 17 to the silicide layer 15, and gate contact holes reaching from the surface of the interlayer insulating film 17 to the silicide layer 16, are formed; and, subsequently, a conductive material, such as a metal, is buried to the inside of the source-drain contact holes and to the inside of gate contact holes to form conductive plugs 19; and then wirings 20 are formed on the interlayer insulating film 17 to obtain the structure shown in FIG. 1.

Figure 15:
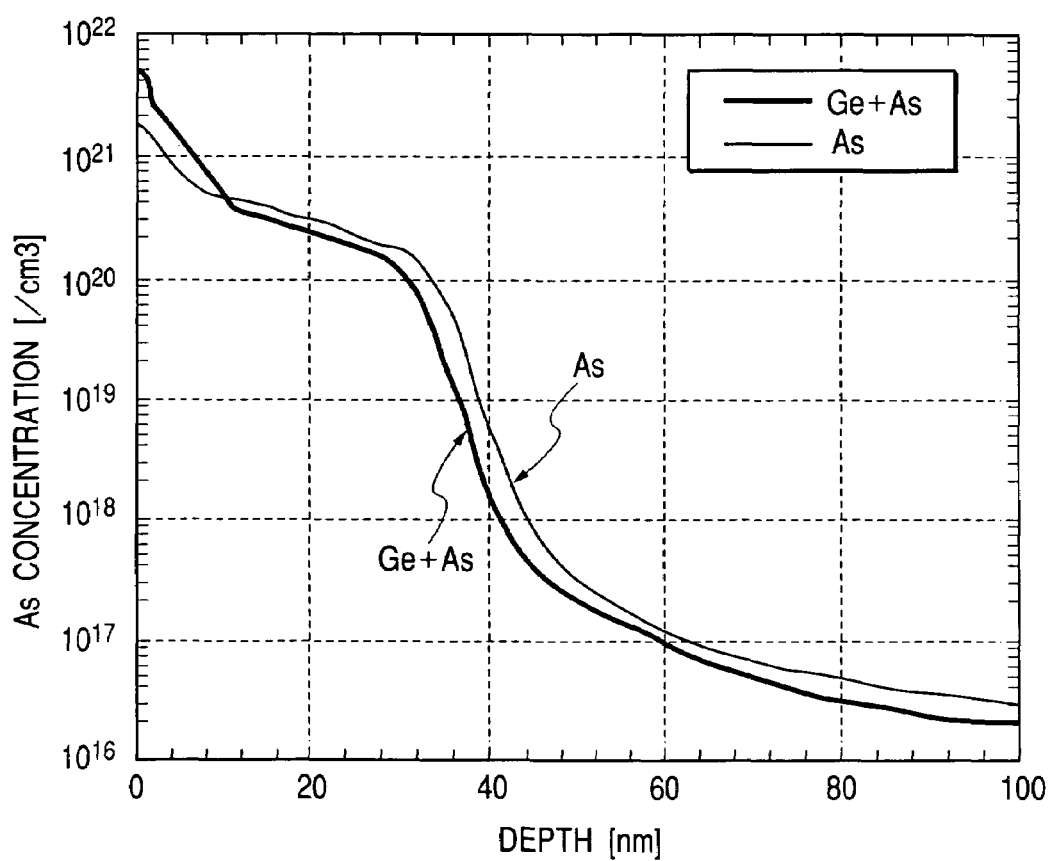
FIG. 15 is a graph showing an As profile in a case of previously implanting Ge and an As profile in a case of not previously implanting Ge.

FIG. 15 is a graph showing profiles for As impurity concentration in an extension region in a case where Ge is implanted previously and in a case where Ge is not implanted previously.

Figure 16:
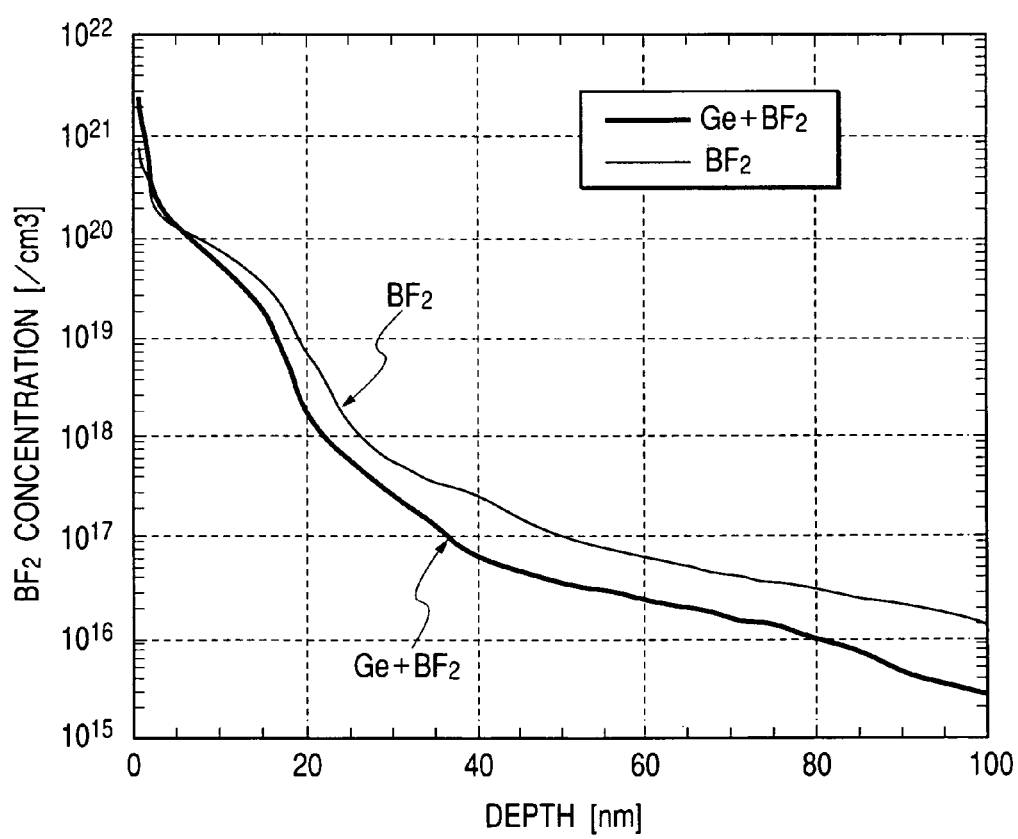
FIG. 16 is a graph showing an $BF_2$ profile in a case of previously implanting Ge and an $BF_2$ profile in a case of not previously implanting Ge.

FIG. 16 is a graph showing profiles for $BF_2$ impurity concentration in an extension region in a case where $BF_2$ is implanted previously and in a case where $BF_2$ is not implanted previously.

In FIG. 15 and FIG. 16, the profile for impurities concentration in a case of previously implanting Ge was determined by using samples prepared by conducting Ge ion implantation and impurity ion implantation in the step of forming the extension region under the identical conditions in this Embodiment 1 and then applying a heat treatment for activating the impurities. The profile for impurity concentration in a case of not previously implanting Ge was determined by using samples prepared by conducting ion implantation of impurities in the step of forming the extension region and then applying a heat treatment for activating the impurities under the identical conditions in this Embodiment 1.

As shown in FIG. 15, the As concentration on the surface of the extension region is higher in the case of previously ion implanting Ge than in the case not previously ion implanting Ge. Further, the profile depth at $10^{18}$ atoms/cm$^3$ is shallower in the case of previously ion implanting Ge than in the case of not previously ion implanting Ge.

As shown in FIG. 16, the $BF_2$ concentration on the surface of the extension region is higher in the case of previously ion implanting Ge than in the case of not previously ion implanting Ge. Further, the profile depth at $10^{18}$ atoms/cm$^3$ is shallower in the case of previously ion implanting Ge than in the case of not previously ion implanting Ge.

As described above, since the extension regions of low resistance with shallow junction depth can be formed by Ge ion implantation as a group IV element in the device forming regions 1*n* and 1*p* in the main surface of the silicon substrate 1 to a level shallower than the implantation depth of the respective impurities (As, $BF_2$) in the steps of forming the extension regions of a n-type and a p-type MISFET after the step of forming the gate electrodes 6 and before the step of forming the extension regions (semiconductor regions 8, 9) of the n-type and p-type MISFET, the drain current Ids in the n-type and p-type MISFET can be increased (current driving performance can be improved). In Embodiment 1, the drain current was increased by about 5% both in the n-type and p-type MISFET compared with the case of not conducting previous Ge ion implantation.

As described above, according to Embodiment 1, since the extension regions in both of the n-type and p-type MISFET can be formed at a low resistance and a shallow junction depth, the drain current Ids in the n-type and p-type MISFET can be increased (current driving performance can be improved).

Further, since the contact regions (semiconductor regions 12, 13) in both of the n-type and p-type MISFET are activated by a Si—Ge—X (X: As, $BF_2$) bond due to Ge ion implantation and the amount of unreacted impurities not bonded with Si is decreased, coagulation of CoSi in the siliciding reaction can be suppressed.

In Embodiment 1, while the description was directed to a case of applying the invention to a semiconductor device having a complementary MISFET, the invention is applicable also to a semiconductor device having one of a n-type or a p-type MISFET.

Further, in Embodiment 1, while the description was directed to a case of using Ge as a group IV element identical with that of the silicon substrate, another element may also be used so long as it is a group IV element identical with that of the silicon substrate.

Further, in Embodiment 1, while the description was directed to a case of applying the heat treatment for activating the impurities after conducting ion implantation of impurities in the step of forming extension regions in both of the n-type and p-type MISFET, as well as conducting ion implantation of impurities in the step of forming the contact regions in both of them, the heat treatment for activating the impurities may also be applied after the step of forming the extension regions of the n-type and p-type MISFET and before the step of forming the contact regions for n-type and p-type MISFET and, further, it may be applied after the step of forming the contact regions of the n-type and the p-type MISFET.

In this case, however, since the junction depth in the extension region increases, it is preferred that the heat treatment for activating the impurities is conducted only once as in this Embodiment 1.

Further, in the Embodiment 1, while the description was directed to a case of using $BF_2$ as an impurity for forming the extension regions of the p-type MISFET, a similar effect can be achieved also in a case of forming the extension region of the p-type MISFET by ion implanting boron (B).

Figure 17:
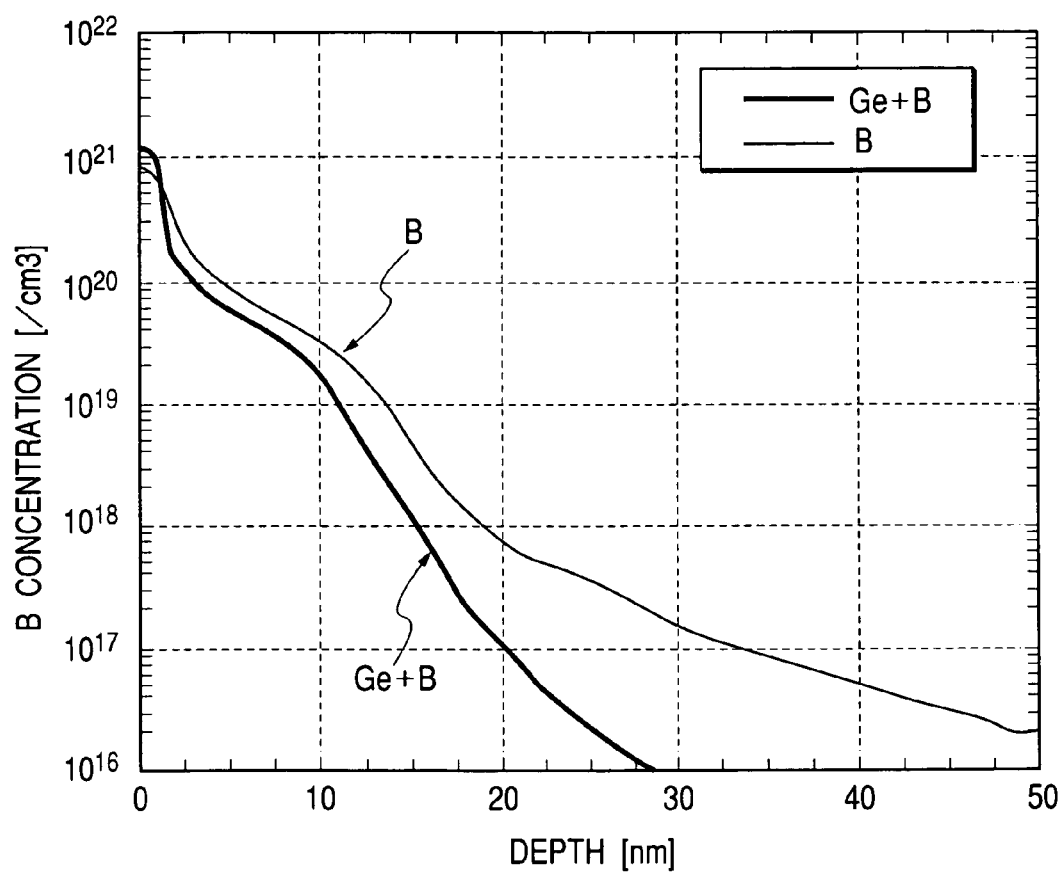
FIG. 17 is a graph showing an B profile in a case of previously implanting Ge and an B profile in a case of not previously implanting Ge.

FIG. 17 is a graph showing profiles of the impurity concentration of B in an extension region in a case of previously implanting Ge and in a case of not previously implanting Ge. The impurity concentration profile of B shown in FIG. 17 is determined by using a sample prepared under the same conditions as those for the impurity profile of $BF_2$ shown in FIG. 18. As shown in FIG. 17, the B concentration on the surface of the extension region increases more in a case of previously ion implanting Ge than in a case of not previously ion implanting Ge, like the case of $BF_2$. Further, the profile depth at $10^{18}$ atoms/cm$^3$ is shallower in a case of previously ion implanting Ge than in a case of not previously ion implanting Ge. Accordingly, a similar effect is obtainable also in a case of ion implanting boron to form an extension region of the p-type MISFET.

Further, in Embodiment 1, while the description was directed to a case of using As as an impurity for forming the extension region of the n-type MISFET, a similar effect is obtainable also in a case of ion implanting phosphorus (P), thereby forming an extension region of the n-type MISFET.

FIG. 18 to FIG. 21 are schematic cross sectional views showing sequential steps in the manufacture of a semiconductor device as a modified example of Embodiment 1.

In the Embodiment 1 as described above, a description was directed to a case of ion implanting Ge as a group IV element in one identical step to the device forming regions 1n and 1p of the main surface of the silicon substrate 1 after the step of forming the gate electrodes 6 and before the step of forming the extension regions of the n-type and p-type MISFET. However, Ge ion implantation to the device forming region 1n and Ge ion implantation to the device forming region 1p may be conducted separately. An example of conducting Ge ion implantation separately will be described with reference to FIG. 18 to FIG. 21.

Figure 18:
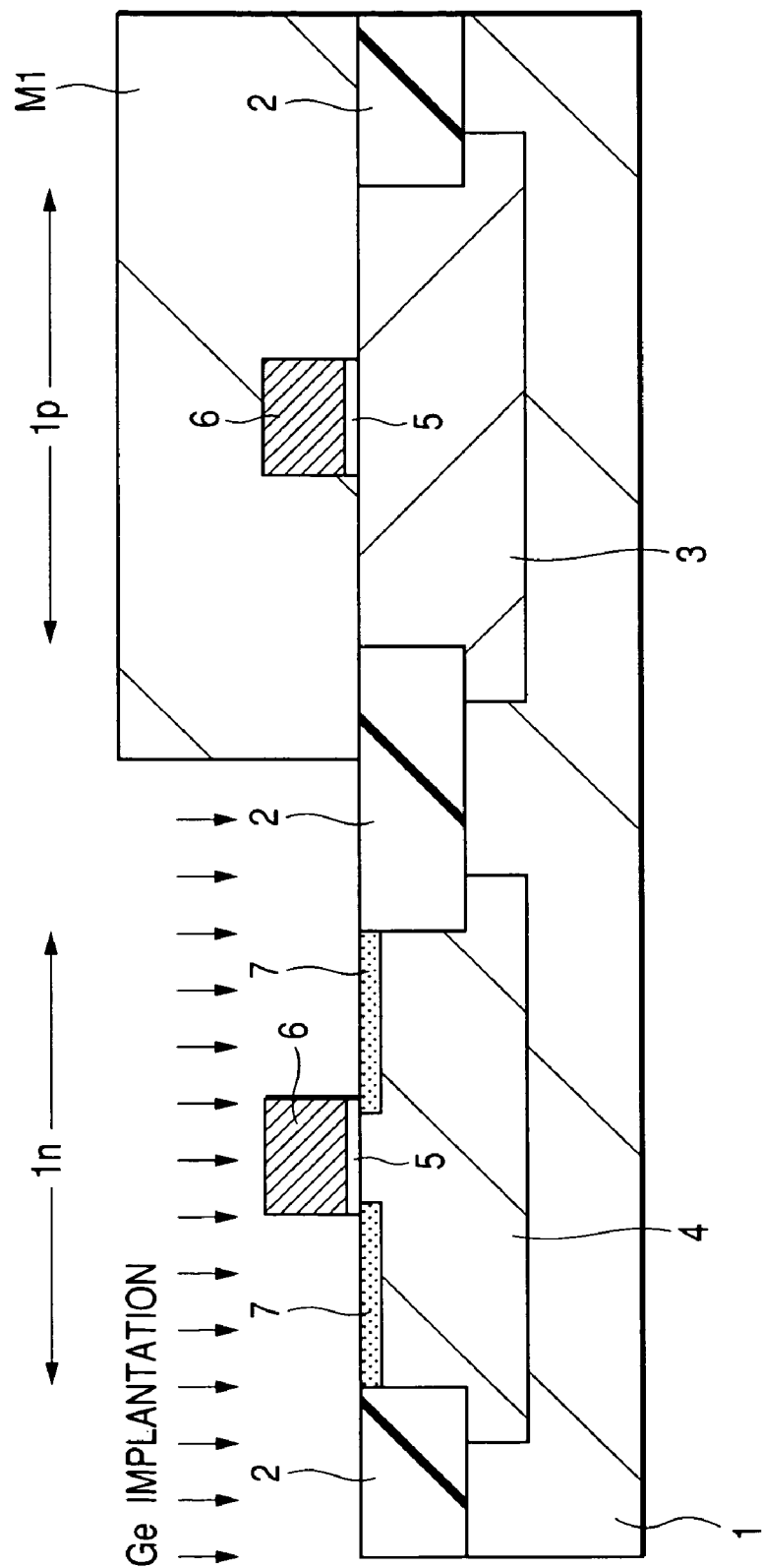
FIG. 18 is a schematic cross sectional view showing a manufacturing step of a semiconductor device serving as a modification for Embodiment 1 according to the invention.

After forming gate electrodes 6 in the device forming regions 1n and 1p of a main surface of a silicon substrate 1, a group IV element, for example, Ge is ion implanted from the main surface of the silicon substrate 1 to the inside of the device forming region 1n thereof, specifically, to the portion of the p-well region 4, where the gate electrode 6 is not formed, in a state of selectively covering the device forming region 1p of the main surface of the silicon substrate 1 by the mask M1, as shown in FIG. 18, after forming the gate electrodes 6 to the device forming regions 1n and 1p of the main surface of the silicon substrate 1. An amorphous layer 7 is formed so as to be aligned with the gate electrode 6 in the device forming region 1n of the main surface of the silicon substrate 1 by Ge ion implantation. The Ge ion implantation is conducted to a level shallower than the ion implantation depth of the impurities in the subsequent step of forming the extension region of the n-type MISFET.

Figure 19:
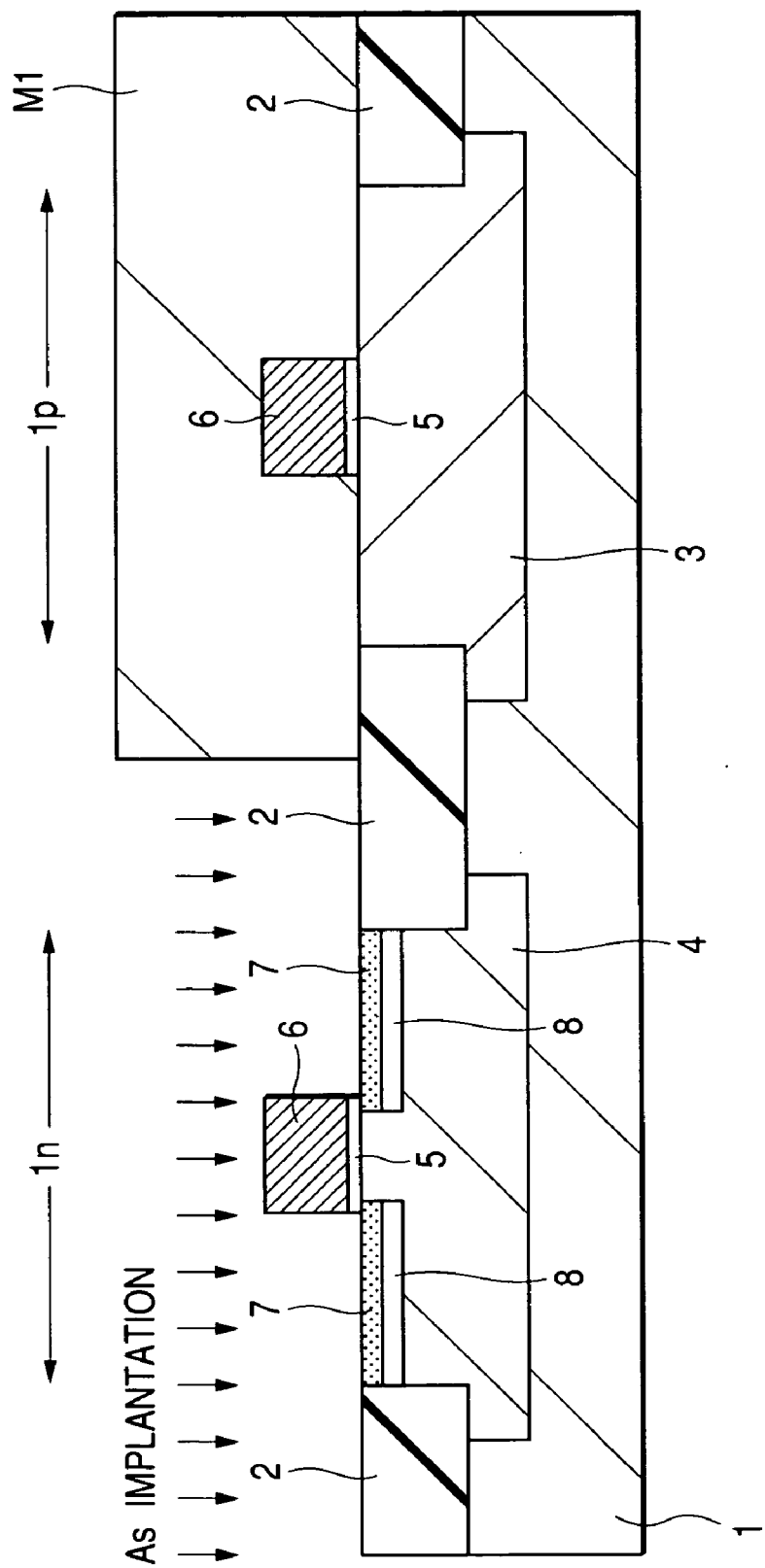
FIG. 19 is a schematic cross sectional view showing a manufacturing step of the semiconductor device succeeding the step of FIG. 18.

Then, as shown in FIG. 19, impurities, for example, As (arsenic) are ion implanted from the main surface of the silicon substrate 1 to the inside of the device forming region 1n thereof, specifically, to the portion of the p-well region 4, where the gate electrode 6 is not formed, by using the mask M1 in a state of selectively covering the device forming region 1p of the main surface of the silicon substrate 1 by the mask M1. A pair of n-semiconductor regions (extension regions) 8 are formed so as to be aligned with the gate electrode in the device forming region 1n of the main surface of the silicon substrate 1.

Figure 20:
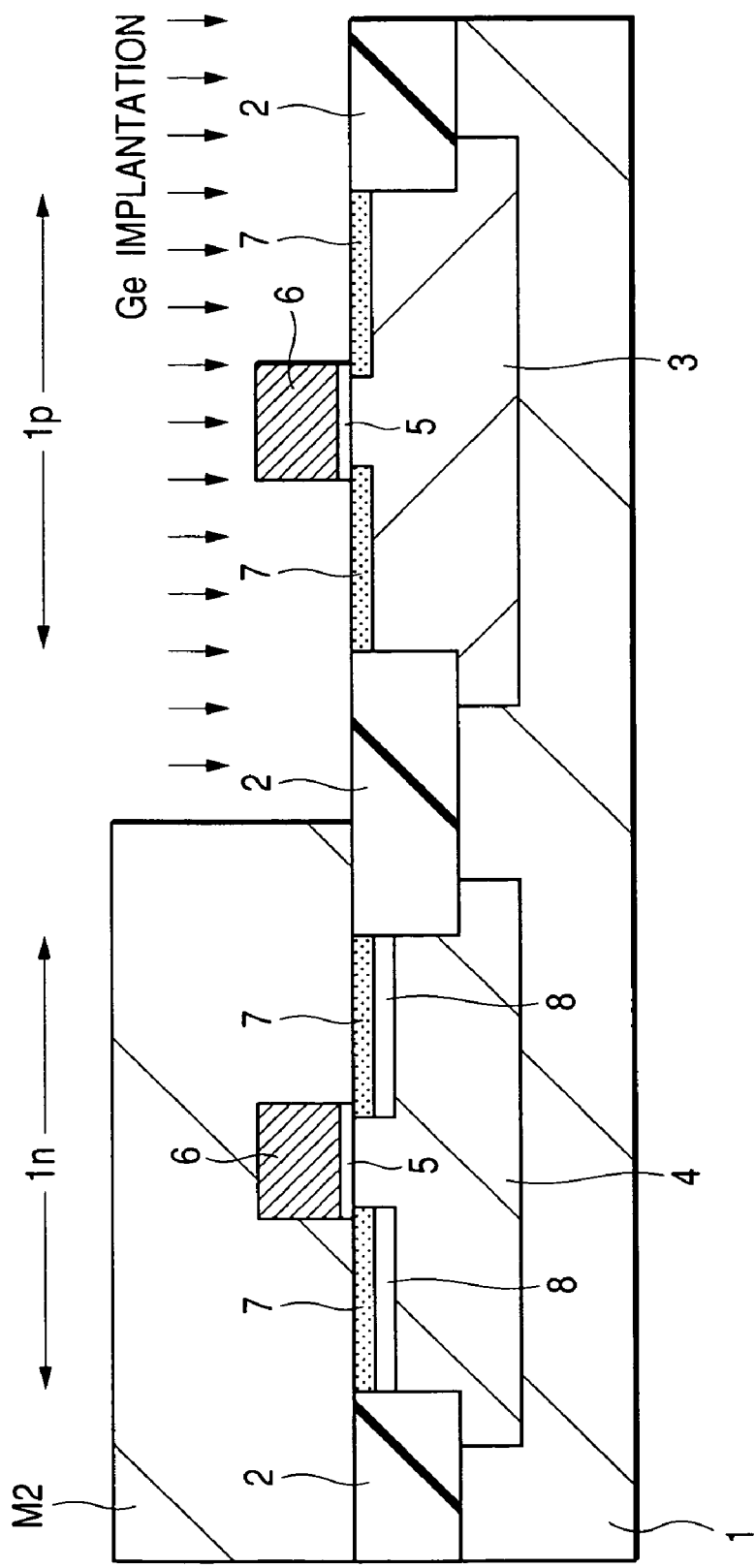
FIG. 20 is a schematic cross sectional view showing a manufacturing step of the semiconductor device succeeding the step of FIG. 19.

Then, after removing the mask M1, as shown in FIG. 20, a group IV element, for example, Ge is ion implanted from the main surface of the substrate 1 to the inside of the device forming region 1p thereof, specifically, to the portion of the n-well region 3 where the gate electrode 6 is not formed, in a state of selectively covering the device forming region 1n of the main surface of the silicon substrate 1 with the mask M2. An amorphous layer 7 is formed so as to be aligned with the gate electrode 6 in the device forming region 1p of the main surface of the silicon substrate 1 by the Ge ion implantation. The Ge ion implantation is conducted to a level shallower than the ion implantation depth of the impurities in the subsequent step of forming the extension region in the p-type MISFET.

Figure 21:
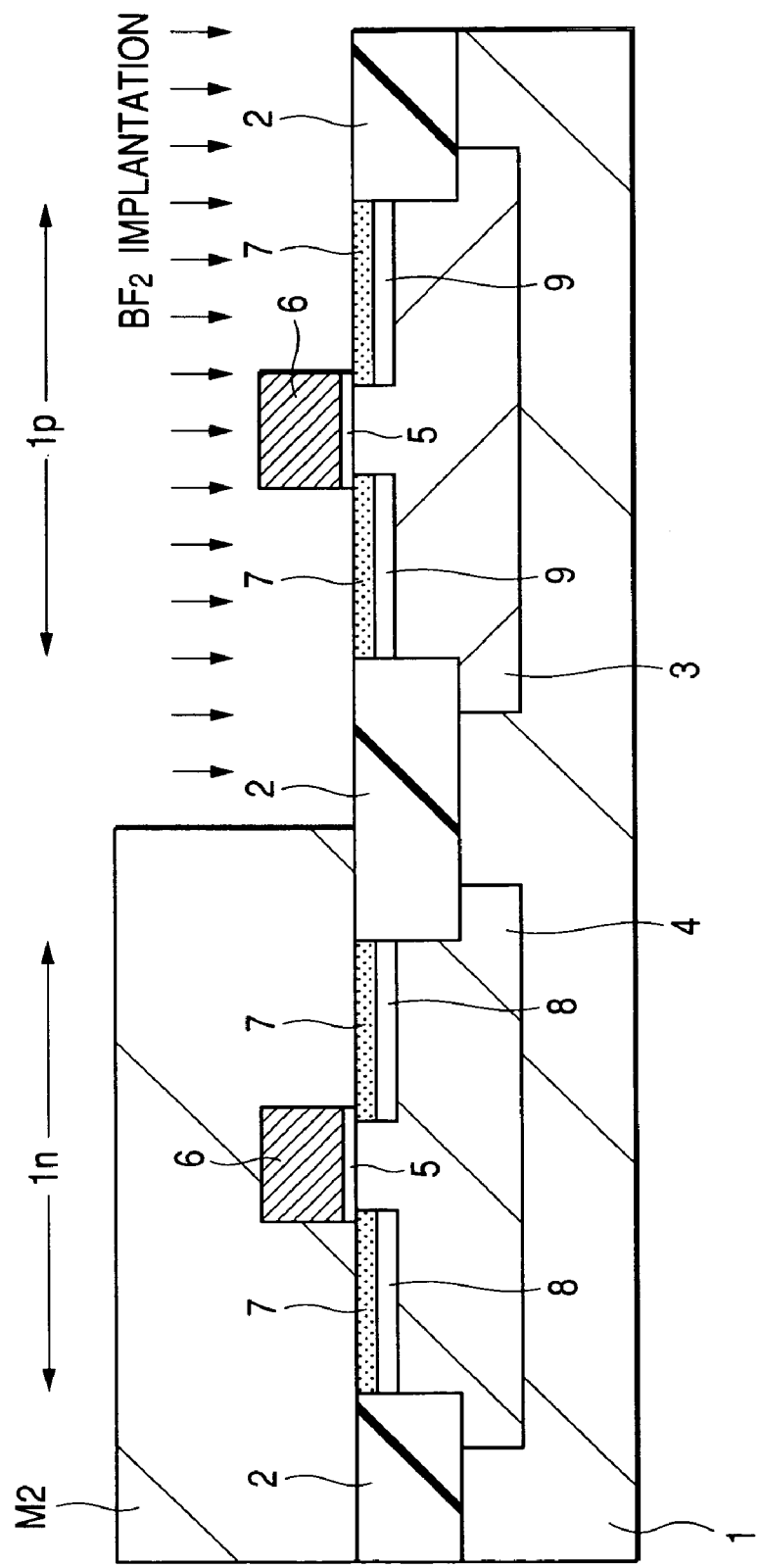
FIG. 21 is a schematic cross sectional view showing a manufacturing step of the semiconductor device succeeding the step of FIG. 20.

Then, as shown in FIG. 21, impurities, for example, $BF_2$ (boron difluoride) are ion implanted from the main surface of the silicon substrate 1 to the inside of the device forming region 1p thereof, specifically, to the portion of the n-well region 3 where the gate electrode 6 is not formed by using the mask M2 in a state of selectively covering the device forming region 1n of the main surface of the silicon substrate 1 with the mask M2. A pair of p-semiconductor regions (extension regions) 9 are formed by $BF_2$ ion implantation so as to be aligned with the gate electrode 6 in the device forming region 1p of the main surface of the silicon substrate 1.

Subsequently, the n-type and p-type MISFET are formed by applying the same steps as those used in Embodiment 1.

As described above, Ge is ion implanted from the main surface of the silicon substrate 1 to the inside of the device forming region 1n thereof to a level shallower than the implantation depth of impurities in the step of forming the extension region of the n-type MISFET in a state of selectively covering the device forming region 1p of the main surface of the silicon substrate 1 by the mask M1 before the step of ion implanting impurities in the step of forming the extension region of the n-type MISFET, and Ge is ion implanted from the main surface of the silicon substrate 1 to the inside of the device forming region 1p thereof to a level shallower than the implantation depth of the impurities in a state of selectively covering the device forming region 1n of the main surface of the silicon substrate 1 by the mask M2 before in the ion implantation step of impurities in the step of forming the extension region of the p-type MISFET; accordingly, the amount of the dose and the depth of implantation of Ge can be set depending on the amount of the dose and the depth of implantation of the impurities in the step of forming the extension region of the n-type MISFET, and the amount of the dose and the depth of implantation of Ge can be set depending on the amount of the dose and the depth of implantation of impurities in the step of forming the extension region of the p-type MISFET, so that reduction of the resistance of the extension region by the Ge ion implantation can be optimized in the n-type and the p-type MISFET, respectively.

Further, Since Ge ion implantation in the device forming region 1n where the n-type MISFET is formed (refer to FIG. 18) and ion implantation of impurities in the step of forming the extension region of the n-type MISFET (refer to FIG. 19) are conducted by using the identical mask M1 and Ge ion implantation to the device forming region 1p where the p-type MISFET is formed (refer to FIG. 20) and ion implantation of impurities in the step of forming the extension region of the p-type MISFET (refer to FIG. 21) are conducted by using the identical mask M2, Ge ion implantation to the device forming region 1n and Ge ion implantation to the device forming region 1p can be conducted separately, so that reduction of the resistance of the extension region by Ge ion implantation can be optimized in the n-type and p-type MISFET, respectively, without increasing the manufacturing cost.

For attaining a high degree of integration and a cost reduction in the semiconductor devices, it is an important to reduce the number of masks (reticule).

This is because reduction for the number of mask sheets can decrease not only the manufacturing cost of the mask per se, but also decrease the complexity of the series of processings of coating, exposure, development, cleaning and drying of photoresist for forming photoresist patterns using the masks, thereby making it possible to drastically decrease the process cost for the semiconductor devices.

Further, the failure rate caused by obstacles can be decreased so as to improve the yield and the reliability of the semiconductor devices.

Further, in this embodiment, germanium (Ge) is used, for example, as the group IV element. This is because germanium has a larger atomic weight among other IV group elements and more easily assumes a pre-amorphous form relative to the silicon substrate or polycrystal silicon film. For example, considering a case of a p-type MISFET, carbon (C), in the identical IV group elements, can not form bonding: Si—B-IV group element since the radius of its atom is substantially identical with that of boron. In a case of using silicon (Si), it may be take a pre-amorphous form relative to the silicon substrate or polycrystal silicon film, but the effect is somewhat inferior, since the atomic weight is smaller than that of germanium.

Further, the advantage in the use of germanium (Ge) is that it is usable as a gas source upon ion implantation. With regard to other IV group elements, antimony (Sn) and lead (Pb) are not practical, since solid sources have to be used upon ion implantation.

From the foregoing, in this embodiment, it is effective to use germanium or silicon as the group IV element and, more preferably, germanium is used. This is similar with respect to the subsequent Embodiments 2 to 7.

Embodiment 2

Figure 22:
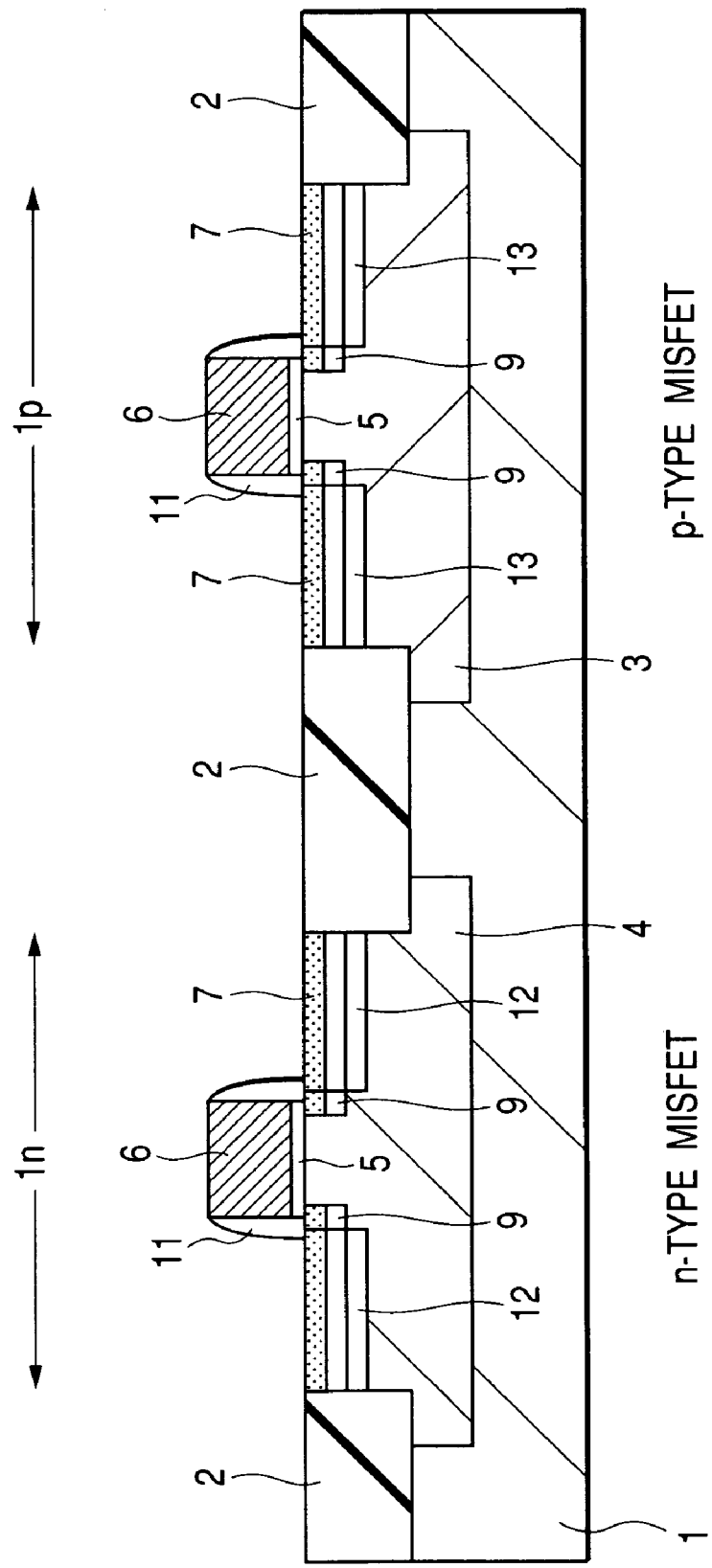
FIG. 22 is a schematic cross sectional view showing a step for manufacturing a semiconductor device representing an Embodiment 2 according to the invention.
Figure 23:
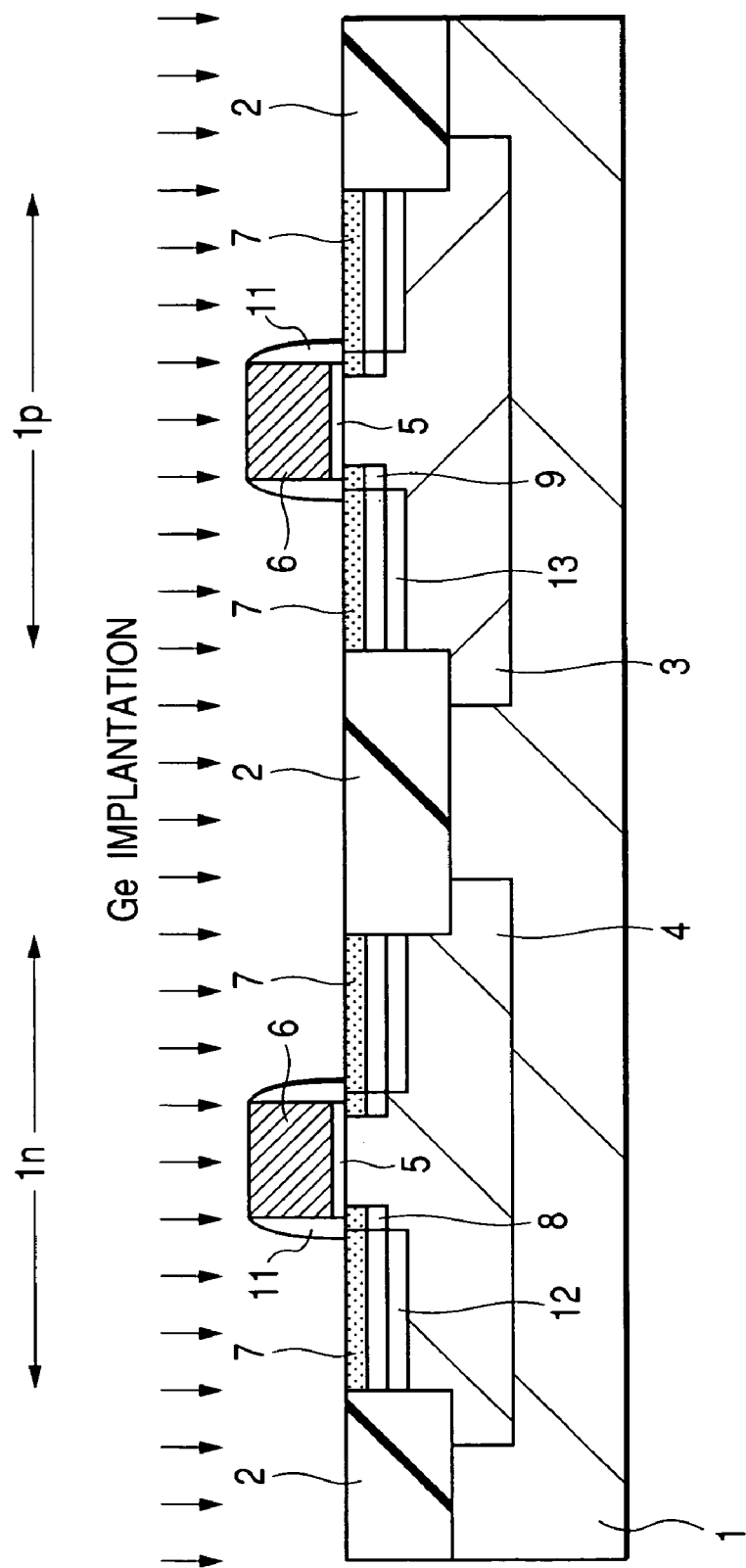
FIG. 23 is a schematic cross sectional view showing a manufacturing step of the semiconductor device succeeding the step of FIG. 22.
Figure 24:
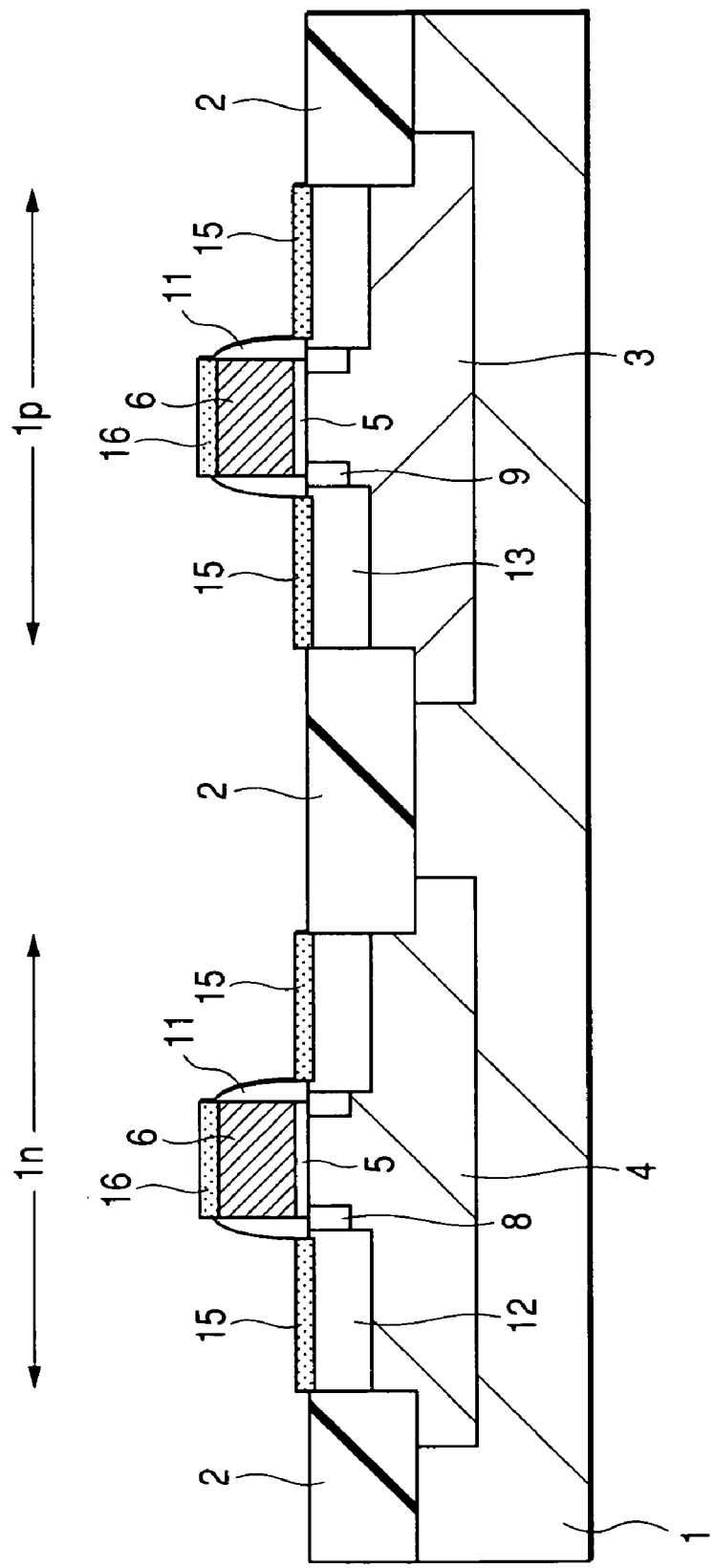
FIG. 24 is a schematic cross sectional view showing a manufacturing step of the semiconductor device succeeding the step of FIG. 23.

FIG. 22 to FIG. 24 are schematic cross sectional views showing steps in the manufacture of a semiconductor device representing Embodiment 2 of the invention.

In Embodiment 2, the feature is directed to the suppression of coagulation of a refractory metal in silicidation.

After forming up contact regions (semiconductor regions 12, 13) of the n-type and p-type MISFET as shown in FIG. 22 using the same process as that used in Embodiment 1, as described above, a group IV element, for example, Ge is ion implanted from the main surface of the silicon substrate 1 to the inside of the device forming regions 1n and 1p thereof, as shown in FIG. 23. By Ge ion implantation, Ge is introduced further in addition to the Ge ion implanted before the step of forming the extension regions in the contact regions.

Then, impurities (As, BF$_2$) ion implanted in the state of forming the extension regions in the step of forming the extension regions (semiconductor regions 8, 9) and the step of forming the contact regions (semiconductor regions 12, 13) are activated by heat treatment. The heat treatment is applied under the same conditions as those used in Embodiment 1, as described above.

In this step, since Ge ions implanted before the step of forming the extension regions and Ge ions implanted after the step of forming the contact regions are incorporated in the contact regions (semiconductor regions 12, 13), activation of impurities, particularly, on the surface of the contact regions is further improved so as to decrease the amount of unreacted impurities not bonded with silicon in the contact regions.

Then, silicide layers 15 and 16 are formed on the surface of the contact regions (semiconductor regions 12, 13) and the surface of the gate electrodes 6 as shown in FIG. 24, by the same method as used in Embodiment 1, as described above.

As described above, since the unreacted impurities particularly on the surface of the contact regions are further decreased by further ion implanting the group IV element, for example, Ge from the main surface of the silicon substrate to the inside of the device forming regions 1n and 1p thereof after the step of forming the contact regions (12, 13) and before the step of forming the cobalt film 14 (refractory metal film), coagualtion of CoSi (coagulation of refractory metal) in the siliciding reaction can be suppressed further.

Further, in Embodiment 2, the heat treatment for activating the impurities is conducted after the second Ge implantation. However, the heat treatment for activating the impurities may be conducted also after the step of forming the contact regions of the n-type and p-type MISFET (refer to FIG. 5 and FIG. 6) and before the second Ge ion implantation (refer to FIG. 23) and, further, after the second Ge ion implantation and before the step of forming the cobalt film 14 (refer to FIG. 12). In this case, however, since the implantation depth in the extension regions increases, the heat treatment for activating the impurities is preferably conducted as in Embodiment 2 after the second Ge ion implantation and before the step of forming the cobalt film 14.

Further, in Embodiment 2, the second Ge ion implantation (refer to FIG. 23) is conducted after the step of forming the contact regions for the n-type and p-type MISFET (refer to FIG. 9 and FIG. 10). However, the second Ge ion implantation may be conducted after the step of forming the side wall spacer 11 (refer to FIG. 8) and before the step of forming the contact regions of the n-type and p-type MISFET.

Further, in Embodiment 2, coagulation of the refractory metal by silicidation is suppressed by the second Ge ion implantation. However, coagulation of the refractory metal in the silicidation can be suppressed only by the second Ge ion implantation without conducting Ge ion implantation before the step of forming the extension regions (refer to FIG. 4).

Embodiment 3

In this embodiment, the feature is directed to an example in which the invention is applied to a semiconductor device having, on one identical substrate, a complementary MISFET and a DRAM (Dynamic Random Access Memory) type memory cell.

Figure 25A:
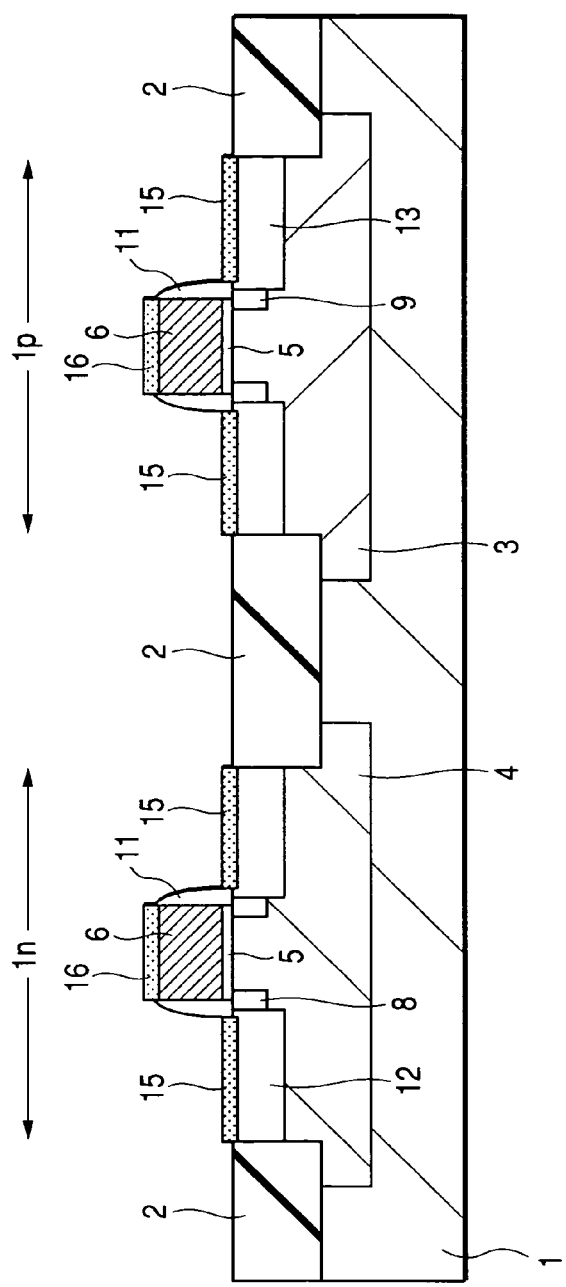
Figure 25B:
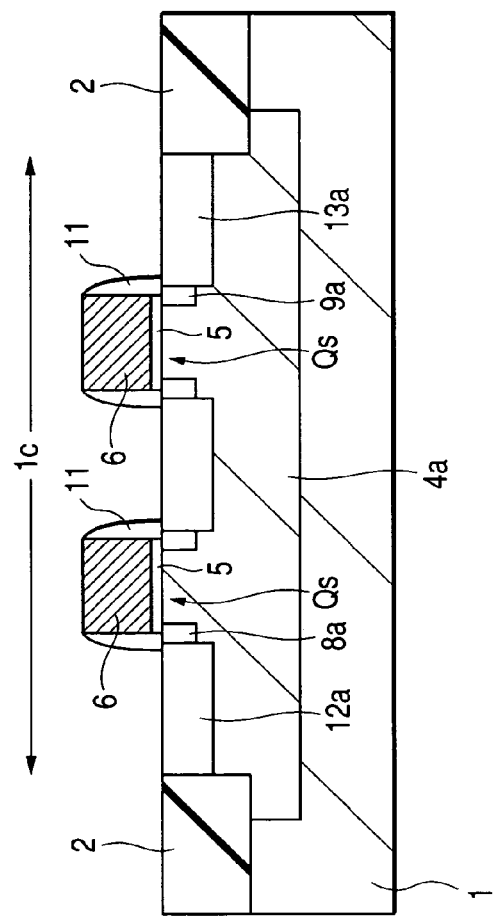

FIG. 25(a) is a schematic cross sectional view of a complementary MISFET, and FIG. 25(b) is a schematic cross sectional view of a memory cell selecting MISFET of Embodiment 3; FIG. 26 is an equivalent circuit diagram of a memory cell mounted on the semiconductor device of Embodiment 3; and FIGS. 27(a) and 27(b) are schematic cross sectional views showing steps in the manufacture of the semiconductor device of Embodiment 3. In FIG. 25(a), the device forming region 1n on the left is an n-type MISFET, and the device forming region 1p on the right is a p-type MISFET.

As shown in FIG. 26, a memory cell Mc is disposed at a crossing point between a word line WL and a data line (bit line) DL. The memory cell Mc comprises one information storage capacitance device C and one memory cell selecting MISFET Qs connected in series therewith. One of a pair of semiconductor regions constituting the memory cell selecting MISFET Qs is connected electrically with the data line DL and the other of them is connected electrically with the information storage capacitance device C.

Each of the n-type and p-type MISFET of Embodiment 3 has the same constitution as that in Embodiment 1 described previously, as shown in FIG. 25(a). The memory cell selecting MISFET Qs is formed to the device forming region 1c on the main surface of the silicon substrate, as shown in FIG. 25(b). The device forming region 1c is isolated by device isolation regions 2, and the p-well region 4a is formed in the device forming region 1c.

The memory selecting MISFET Qs mainly comprises a channel forming region, a gate insulating film 5, gate electrodes 6, and source regions and drain regions. The gate electrode film 5 is disposed to the main surface of the silicon substrate 1, the gate electrode 6 is disposed by way of the gate insulating film 5 above the main surface of the silicon substrate 1 and the channel forming region is disposed to the surface layer of the silicon substrate 1 just below the gate electrode 6. The source region and the drain region are disposed on both sides in the direction of the channel length on both sides of the channel forming region so that the channel forming region is disposed therebetween.

The source region and the drain region of the memory cell selecting MISFET Qs comprise a pair of n-semiconductor regions 8a serving as the extension region and a pair of n-semiconductor regions 12a serving as the contact region. The n-semiconductor region 8a is formed so as to be aligned with the gate electrode 6, and the n-semiconductor region 12a is formed so as to be aligned with a side wall spacer 11 that is disposed to the side wall of the gate electrode 6.

While silicide layers (15, 16) are formed on the surface of the gate electrodes 6 and the contact regions (semiconductor regions 12, 13) in the n-type and p-type MISFET, as shown in FIG. 25(A), such silicide layers are not formed on the surface of the gate electrodes 6 and the contact regions (semiconductor regions 12a) in the memory selecting MISFET Qs, as shown in FIG. 25(B). Further, although not illustrated, a group IV element, for example, Ge is ion implanted to the extension regions (semiconductor regions 8, 9) and the contact regions (semiconductor regions 12, 13) in the n-type and p-type MISFET, whereas Ge is not ion implanted to the extension regions and the contact regions in the memory cell selecting MISFET Qs.

The n-type and p-type MISFET, and the memory cell selecting MISFET of the structure as described above are obtained by forming the gate electrodes 6, then ion implanting Ge from the main surface of the silicon substrate 1 to the device forming regions 1n and 1p thereof in a state of selectively covering the device forming region 1c of the main surface of the silicon substrate 1 by a mask M5, as shown in FIG. 27, then forming a cobalt film (although not illustrated) over the entire surface of the silicon substrate 1 including the device forming regions 1n, 1p and 1c and then selectively removing the cobalt film on the device forming region 1c by using the mask.

In the memory cell selecting MISFET Qs, it is desirable to decrease the junction leakage current between the semiconductor regions that are used as the source-drain regions and the substrate as little as possible. Accordingly, a MISFET requiring high speed operation is adapted to have a structure in which the silicide layer is formed to the gate electrodes 6 and the contact regions, as in the n-type and p-type MISFET described above, and Ge is ion implanted to the extension regions and the contact regions; and, a MISFET requiring a decrease of the junction leakage current is adapted to have a structure in which the silicide layer is not formed to the gate electrodes and the contact regions and Ge is not ion implanted to the extension regions and the contact regions as in the memory cell selecting MISFET Qs described above. This can decrease the consumption of power and increase the operation speed.

Embodiment 4

In this embodiment, the feature is directed to an example in which the drain current Ids is intentionally increased in the MISFET by film stress.

FIG. 28 is a schematic cross sectional view showing a complementary MISFET mounted on a semiconductor device representing Embodiment 4; and FIG. 29 to FIG. 33 are schematic cross sectional views showing steps in the manufacture of the semiconductor device of Embodiment 4. In FIG. 28, an n-type MISFET is shown on the left, while a p-type MISFET is shown on the right.

The n-type and p-type MISFET in Embodiment 4 basically have the same constitution as that in Embodiment 1 described above and are different therefrom with respect to the following features.

That is, a side wall spacer 22 that generates a tensile strength to the channel forming region of the n-type MISFET is disposed to the side wall of the gate electrode 6 of the n-type MISFET, while a side wall spacer 23 that does not substantially generate the tensile stress to the channel forming region of the p-type MISFET is disposed to the side wall of the gate electrode 6 of the p-type MISFET. The side wall spacers 22 and 23 are formed of an identical insulating film, but the film stress that generates the tensile stress to the channel forming region is moderated in the side wall spacer 23. Manufacture of the semiconductor device of Embodiment 4 will be described with reference to FIG. 29 to FIG. 33.

After conducting the process up to the step of forming the contact regions (semiconductor regions 8, 9) of the n-type and p-type MISFET by using the same process as that used in Embodiment 1, as described above (refer to FIG. 5 and FIG. 6), an insulating film that generates a stress to the main surface of the silicon substrate 1, for example, a silicon nitride film 21 is formed over the entire main surface of the silicon substrate 1 including the area above the device forming regions 1n and 1p, as shown in FIG. 29, by a plasma CVD process. In the silicon nitride film 21, the stress to be generated to the main surface of the silicon substrate 1 can be controlled by changing the condition of formation (reaction gas, pressure, temperature, and radio frequency power). In this embodiment, the silicon nitride film 21 is formed so as to generate a tensile stress to the main surface of the silicon substrate 1 by lowering the high frequency power to 350 to 400 W during film deposition.

Then, anisotropic etching such as RIE is applied to the silicon nitride film 21 to form side wall spacers (22, 23) to the side walls of the gate electrodes 6 above the device forming regions 1n and 1p, as shown in FIG. 30. In the formation of the side wall spacers (22, 23), the thickness and the etching time for the silicon nitride film 21 are determined such that the thickness of the side wall spacer along the direction of the gate length is, for example, about 50 to 70 nm. In this process, since the side wall spacers 22 and 23 are formed by etching the silicon nitride film 21 that generates the tensile stress to the main surface of the silicon substrate 1, both of the side wall spacers 22 and 23 have a film stress that generates a tensile stress to the channel forming regions below the gate electrodes 6.

Then, as shown in FIG. 31, impurities, for example, As are ion implanted from the main surface of the silicon substrate 1 to the inside of the device forming region 1n, specifically, to a portion of the p-well region 4 where the gate electrode 6 is not formed, in a state of selectively covering the device forming region 1p of the main surface of the silicon substrate 1 by a mask M3. By the As ion implantation, a pair of n-semiconductor regions (contact regions) 12 are formed so as to be aligned with the side wall spacer 22 in the device forming region 1n of the silicon substrate 1. In this embodiment, As is ion implanted under the same conditions as those for Embodiment 1 described above.

Then, after removing the mask M3, as shown in FIG. 32, impurities, for example, $BF_2$ (boron difluoride) are ion implanted from the main surface of the silicon substrate 1 to the inside of the device forming region 1p, specifically, to the portion of the n-well region 3 where the gate electrode 6 is not formed, in a state of selectively covering the device forming region 1n of the main surface of the silicon substrate 1 by a mask M4. By $BF_2$ ion implantation, a pair of p-semiconductor regions (contact regions) 13 are formed in the device forming region of the silicon substrate 1 so as to be aligned with the side wall spacer 23. In this embodiment, $BF_2$ is ion implanted under the same conditions as those for Embodiment 1 described above.

Then, as shown in FIG. 33, a group IV element, for example, Ge is ion implanted to the side wall spacer 23 above the device forming region 1p by using the mask M4 in a state of selectively covering the device forming region 1n of the main surface of the silicon substrate 1 by the mask M4 to destroy the crystallinity in the side wall spacer 23. In this process, since the film stress of the side wall spacer 23 is moderated, the tensile stress in the direction of the gate electrode (direction of drain current) generated in the channel region of the p-type MISFET by the film stress of the side wall spacer 23 can be moderated or eliminated.

Further, since Ge is ion implanted also to the contact region of the p-type MISFET, the Ge concentration is higher in the contact region of the p-type MISFET than in the contact region of the n-type MISFET.

Then, impurities (As, $BF_2$) ion implanted in the step of forming the extension regions (semiconductor regions 8, 9) and the step of forming the contact regions (semiconductor regions 12, 13) are activated by a heat treatment. The heat treatment is applied under the same conditions as those in Embodiment 1 described above.

In this step, since Ge ions implanted before the step of forming the extension regions (refer to FIG. 4) and Ge ions implanted in the step of destroying the crystallinity of the side wall spacer 23 (refer to FIG. 33) are contained in the contact region (semiconductor region 13) of the p-type MISFET, activation of the impurities in the contact region of the p-type MISFET is further improved and the amount of unreacted impurities not bonded with the silicon layer in the contact region is decreased.

Then, as shown in FIG. 24, silicide layers 15 and 16 are formed on the surface of the contact regions (semiconductor regions 12, 13) and the surface of the gate electrodes 6, as shown in FIG. 24, by the same method as used in Embodiment 1 described above.

As described above, since the film stress of the side wall spacer 23 is moderated by forming the silicon nitride film 21 that generates the tensile strength to the main surface of the silicon substrate 1 so as to cover the gate electrode 6 formed in the device forming region 1n of the main surface of the silicon substrate 1 and the gate electrode 6 formed in the device forming region 1p of the main surface of the silicon substrate 1, then applying anisotropic etching to the silicon nitride film 21 to form the side wall spacer 22 to the side wall of the gate electrode 6 above the device forming region 1n and the side wall spacer 23 to the side wall of the gate electrode 6 above the device forming region 1p and then ion implanting Ge to the side wall spacer 23 in a state of masking the device forming region 1n of the main surface of the silicon substrate 1 to destroy the crystallinity in the side wall spacer 23, the tensile stress in the direction of the gate length (direction of drain current) generated in the channel forming region of the p-type MISFET by the film stress of the side wall spacer 23 can be moderated or eliminated. As a result, the drain current in the n-type MISFET can be increased by the film stress of the side wall spacer 22, and a decrease in the drain current of the p-type MISFET can be suppressed.

Further, in the step of destroying the crystallinity in the side wall spacer 23 (refer to FIG. 33), since Ge is ion implanted also to the contact region of the p-type MISFET, impurities are further activated in the contact region of the p-type MISFET and the amount of unreacted impurities not bonded with silicon in the contact region is decreased in the heat treatment step of activating the impurities, coagulation of CoSi (coagulation of refractory metal) in the siliciding reaction can be suppressed further.

Further, since the drain current in the n-type MISFET can be increased and the decrease of the drain current in the p-type MISFET can be suppressed by the film stress of the side wall spacer 22 without increasing the number of mask forming steps by conducting the ion implantation of impurities in the step of forming the contact region of the p-MISFET (refer to FIG. 32) and Ge ion implantation in the step of destroying the crystallinity in the side wall spacer 23 (refer to FIG. 33) by using the identical mask M4, the number of manufacturing steps can be reduced.

Further, drain current can be increased both in the n-type and the p-type MISFET by the combination of reduction of the resistance in the extension regions of the MISFET by the Ge ion implantation and moderation of the film stress of the side wall spacer 23 by the ion implantation Ge, as in Embodiment 4.

In Embodiment 4, while the description was directed to an example of conducting the step of ion implanting Ge to the side wall spacer 23 to destroy the crystallinity in the side wall spacer 23 (refer to FIG. 33) after the step of forming the contact region of the p-type MISFET (refer to FIG. 32), the step of destroying the crystallinity in the side wall spacer 23 may also be conducted after the step of forming the side wall spacers (22, 23) and before the step of forming the refractory metal film (cobalt film 14 in this embodiment) for forming the silicide layer (refer to FIG. 12).

Further, in Embodiment 4, while the description was directed to an example of combining the reduction of the resistance in the extension regions of a MISFET by Ge ion implantation and moderation of the film stress of the side wall spacer 23 by Ge ion implantation, moderation of the film stress of the side wall spacer 23 by Ge ion implantation may be conducted solely.

Embodiment 5

While an example of increasing the drain current in the n-type MISFET by the film stress has been described for Embodiment 4 above, the description of this Embodiment will be directed to an example of increasing the drain current in the p-type MISFET by film stress.

FIG. 34 to FIG. 38 are schematic cross sectional views showing sequential steps in the manufacture of a semiconductor device representing Embodiment 5.

After conducting the process till the step of forming the contact regions (semiconductor regions 8, 9) of the n-type and p-type MISFET by using the same process as that in Embodiment 1 described above (refer to FIG. 5 and FIG. 6), an insulating film that generates a stress to the main surface of the silicon substrate 1, for example, a silicon nitride film 24 is formed over the entire main surface of the silicon substrate 1 including the area above the device forming regions 1n and 1p, as shown in FIG. 34, by a plasma CVD process. In forming the silicon nitride film 24, the stress to be generated to the main surface of the silicon substrate 1 can be controlled by changing the condition of formation (reaction gas, pressure, temperature, and radio frequency power). In this embodiment, the silicon nitride film 24 is formed so as to generate a compressive stress to the main surface of the silicon substrate 1 by increasing the high frequency power to 600 to 700 W during film deposition.

Then, anisotropic etching such as RIE is applied to the silicon nitride film 24 to form side wall spacers (25, 26) to the side walls of the gate electrodes 6 above the device forming regions 1n and 1p, as shown in FIG. 35. In the formation of the side wall spacers (25, 26), the thickness and the etching time for the silicon nitride film 24 are determined such that the thickness of the side wall spacer along the direction of the gate length is, for example, about 50 to 70 nm. In this process, since the side wall spacers 25 and 26 are formed by etching the silicon nitride film 24 that generates the compressive stress to the main surface of the silicon substrate 1, both of the side wall spacers 25 and 26 have a film stress that generates a compressive stress to the channel forming regions below the gate electrodes 6.

Then, as shown in FIG. 36, impurities, for example, As are ion implanted from the main surface of the silicon substrate 1 to the inside of the device forming region 1n, specifically, to a portion of the p-well region 4 where the gate electrode 6 is not formed, in a state of selectively covering the device forming region 1p of the main surface of the silicon substrate 1 by a mask M3. By the As ion implantation, a pair of n-semiconductor regions (contact regions) 12 are formed so as to be aligned with the side wall spacer 22 in the device forming region 1n of the silicon substrate 1. In this embodiment, As is ion implanted under the same conditions as those for Embodiment 1 described above.

Then, as shown in FIG. 37, a group IV element, for example, Ge is ion implanted to the side wall spacer 25 above the device forming region 1n by using the mask M3 in a state of selectively covering the device forming region 1p of the main surface of the silicon substrate 1 by the mask M3 to destroy the crystallinity in the side wall spacer 25. In this process, since the film stress of the side wall spacer 25 is moderated, the compressive stress in the direction of the gate electrode (direction of drain current) generated in the channel region of the n-type MISFET by the film stress of the side wall spacer 25 can be moderated or eliminated.

Further, since Ge is ion implanted also to the contact region of the n-type MISFET, the Ge concentration is higher in the contact region of the n-type MISFET than in the contact region of the p-type MISFET.

Then, after removing the mask M3, as shown in FIG. 38, impurities, for example, $BF_2$ (boron difluoride) are ion implanted from the main surface of the silicon substrate 1 to the inside of the device forming region 1p, specifically, to a portion of the n-well region 3 where the gate electrode 6 is not formed, in a state of selectively covering the device forming region 1n of the main surface of the silicon substrate 1 by a mask M4. By $BF_2$ ion implantation, a pair of p-semiconductor regions (contact regions) 13 are formed in the device forming region of the silicon substrate 1 so as to be aligned with the side wall spacer 23. In this embodiment, $BF_2$ is ion implanted under the same conditions as those for Embodiment 1 described above.

Then, impurities (As, $BF_2$) ion implanted in the step of forming the extension regions (semiconductor regions 8, 9) and the step of forming the contact regions (semiconductor regions 12, 13) are activated by heat treatment. The heat treatment is applied under the same conditions as those in the Embodiment 1 described above.

In this step, since Ge ions implanted before the step of forming the extension region (refer to FIG. 4) and Ge ions implanted in the step of destroying the crystallinity in the side wall spacer 25 (refer to FIG. 37) are contained in the contact region (semiconductor region 12) of the p-type MISFET, activation of the impurities in the contact region of the n-type MISFET is further improved and the amount of unreacted impurities not bonded with the silicon layer in the contact region is decreased.

Then, as shown in FIG. 24, silicide layers 15 and 16 are formed on the surface of the contact regions (semiconductor regions 12, 13) and the surface of the gate electrodes 6 by the same method as used in Embodiment 1 described above.

As described above, since the film stress of the side wall spacer 25 is moderated by forming the silicon nitride film 24 that generates the compressive strength to the main surface of the silicon substrate 1 so as to cover the gate electrode 6 formed in the device forming region 1n of the main surface of the silicon substrate 1 and the gate electrode 6 formed in the device forming region 1p of the main surface of the silicon substrate 1, then applying anisotropic etching to the silicon nitride film 24 to form the side wall spacer 25 to the side wall of the gate electrode 6 above the device forming region 1n and the side wall spacer 26 to the side wall of the gate electrode 6 above the device forming region 1p and then ion implanting Ge to the side wall spacer 25 in a state of masking the device forming region 1p of the main surface of the silicon substrate 1 to destroy the crystallinity of the side wall spacer 25, the compressive stress in the direction of the gate length (direction of drain current) generated in the channel forming region of the n-type MISFET by the film stress of the side wall spacer 25 can be moderated or eliminated. As a result, the drain current in the p-type MISFET can be increased by the film stress of the side wall spacer 26, and a decrease of the drain current in the n-type MISFET can be suppressed.

Further, in the step of destroying the crystallinity of the side wall spacer 25 (refer to FIG. 37), since Ge is ion implanted also to the contact region of the n-type MISFET, impurities are further activated in the contact region of the n-type MISFET and the amount of unreacted impurities not bonded with silicon in the contact region is decreased in the heat treatment step of activating the impurities, so that coagulation of Co (coagulation of refractory metal) in the siliciding reaction can be suppressed further.

Further, since the drain current in the p-type MISFET can be increased and the decrease of the drain current in the n-type MISFET can be suppressed by the film stress of the side wall spacer 26 without increasing the number of mask forming steps by conducting the ion implantation of impurities in the step of forming the contact region of the n-MISFET (refer to FIG. 36) and Ge ion implantation in the step of destroying the crystallinity of the side wall spacer 25 (refer to FIG. 37) using the identical mask M3, the number of manufacturing steps can be reduced.

Further, the drain current can be increased both in the n-type and the p-type MISFET by the combination of lowering the resistance in the extension region of the MISFET by the Ge ion implantation and moderation of the film stress of the side wall spacer 23 by Ge ion implantation Ge as in Embodiment 5.

In Embodiment 5, while the description was directed to an example of conducting the step of ion implanting Ge to the side wall spacer 25 to destroy the crystallinity in the side wall spacer 25 (refer to FIG. 37) after the step of forming the contact region of the n-type MISFET (refer to FIG. 36), the step of destroying the crystallinity in the side wall spacer 25 may also be conducted after the step of forming the side wall spacers (25, 26) and before the step of forming the refractory metal film (cobalt film 14 in this embodiment) for forming the silicide layer (refer to FIG. 12).

Further, in Embodiment 5, while the description was directed to an example of combining the lowering of the resistance in the extension region of MISFET by Ge ion implantation and moderation of the film stress of the side wall spacer 25 by Ge ion implantation, moderation of the film stress of the side wall spacer 25 by Ge ion implantation may be conducted solely.

Further, in Embodiments 4 and 5, while the description was directed to an example of changing the radio frequency power during film deposition thereby changing the film stress of the silicon nitride films (21, 24), the method of changing the film stress of the silicon nitride film can include the following methods.

[1] As method of changing the starting material gas, $SiH_4$ and $NH_3$ and $N_2$ are used for the formation of the silicon nitride film 21, and $SiH_4$ and $N_2$ are used while removing $NH_3$ for the formation of the silicon nitride film 24.

[2] As a method of changing the deposition temperature, the temperature upon forming the silicon nitride film 21 is increased so as to be higher than the temperature upon forming the silicon nitride film 24.

[3] As a method of changing the pressure increases the pressure upon deposition of the silicon nitride film 21 is increased so as to be higher than the pressure upon formation of the silicon nitride film 24.

Embodiment 6

As a method of increasing the drain current in a MISFET, it is also effective to lower the resistance of the gate electrode and suppress gate depletion. In the prior art, when it is intended to ion implant a great amount of impurities such as As (arsenic), P (phosphorus), B (boron), and $BF_2$ (boron difluoride) in order to reduce the polysilicon resistance, activation of the implanted impurities in the silicon film is insufficient and the effect is poor even when the concentration is increased, and a significant effect of the gate depletion was observed. Further, as a result of increasing the concentration, out diffusion and a configurational abnormality of the gate electrode were observed. The gate depletion is a phenomenon in which a portion of the gate electrode on the side of the gate insulating film increases the apparent thickness of the gate insulation film due to the increase in the resistance of the gate electrode. Accordingly, it is necessary to increase the activation of impurities in the silicon film and increase the concentration for the entire gate electrode.

In view of the above, in considering Embodiment 6, the description is directed to an example of suppressing the gate depletion and increasing the drain current Ids in a MISFET.

FIG. 39 to FIG. 43 are schematic cross sectional views showing sequential steps in the manufacture of a semiconductor device according to Embodiment 6.

After forming a device isolation region 2, a gate insulating film 5, etc. to the main surface of a silicon substrate 1 by using the same process as in Embodiment 1 described above, a silicon film (gate material) 6a not introduced with impurities that contribute to conduction is formed as a semiconductor film over the entire main surface of the silicon substrate 1 including the area above the gate insulating film 5 for the device forming regions 1n and 1p as shown in FIG. 39, by a CVD process. The silicon film 6a is formed, for example, to a thickness of about 100 to 250 nm. In this step, the silicon film 6a is in a state of polycrystal silicon (polysilicon).

Then, Ge (germanium) is ion implanted, for example, as a group IV element identical with the silicon film 6a, from above to the inside of the silicon film 6a as shown in FIG. 40. Considering the problem of the gate depletion described above, it is desirable to form an Si—Ge—X bonded region over the entire silicon film 6a.

It is necessary to form the Si—Ge—X bonded region particularly near the boundary between the silicon film 6a and the gate insulating film 5. However, in a case where the peak of the Ge concentration is set to a position deeper than the center for the silicon film 6a, Ge ions reach the gate insulating film 5 to form defects in the film and, accordingly, it may possibly result in degradation of the film quality. Therefore, the Ge is ion implanted such that the peak value of the Ge concentration distribution is located substantially at the center of the film or in the upper layer thereof along the direction of the thickness of the silicon film 6a so as not to damage the gate insulating film 5 below the silicon film 6a.

In Embodiment 6, Ge is ion implanted under the conditions at an acceleration energy of about 40 KeV and at a dose of about 1 to $2 \times 10^{15}$ atoms/cm$^2$ of more. In this process, the portion of the silicon film 6a near the center or the upper layer thereof becomes amorphous.

In this process, the condition upon Ge ion implantation to the silicon film 6a is determined such that the acceleration energy is higher compared with the condition upon Ge ion implantation to the extension regions (semiconductor regions 8, 9). This is because Ge ions have to be implanted to a position that is deeper than the extension regions (semiconductor regions 8, 9) since the thickness of the silicon film 6a is large. In a case of implanting Ge ions in the extension regions (semiconductor regions 8, 9) as in Embodiment 1 (FIG. 4), if it is intended to implant the Ge ions simultaneously to the gate electrode (silicon film 6a), since the acceleration energy is low, the Si—Ge—X bonded region is formed only on the surface of the silicon film 6a and the Si—Ge—X bonded region can not be formed over the entire silicon film 6a. That is, by setting the acceleration energy for the Ge ion implantation to the silicon film 6a so that it is greater than the acceleration energy for the Ge ion implantation to the extension regions (semiconductor regions 8, 9), the peak position for the maximum Ge concentration in the direction of the depth from the surface of the silicon film 6a can be set to a position deeper than the peak position for the maximum Ge concentration in the direction of depth from the surface of the extension regions (semiconductor regions 8, 9). This can form the Si—Ge—X bonded region for the entire silicon film 6a over the entire silicon film 6a. Since the extension region is the semiconductor substrate made of silicon and the gate electrode comprises a polycrystal silicon film, the Gaussian distribution of Ge concentration upon ion implantation exhibits a substantially equal value.

Further, also for the dose, since it is necessary to enlarge the film thickness in which Ge is distributed in the gate electrode (silicon film 6a), a greater dose is set for the gate electrode (silicon film 6a). Further, for the extension regions (semiconductor regions 8, 9), in a case where the dose of Ge ions is increased since they have to be implanted to a level shallower than As, B or $BF_2$ to be implanted subsequently, Se—Ge is formed at a position deeper than As, B or $BF_2$ and an extremely shallow junction can not be attained. That is, the dose in a case of implanting Ge ions to the silicon film 6a is set to be larger than the dose in a case of implanting Ge ions to the extension regions (semiconductor regions 8, 9).

By determining the condition for implanting Ge ions to the gate electrode (silicon film 6a) as described above, since the impurity activation can be improved and the concentration can be increased over the entire gate electrode, an increase of the resistance by the gate depletion can be prevented.

Then, as shown in FIG. 41, phosphorus (P) is ion implanted, for example, as impurities for decreasing the resistance value to the silicon film 6a on the device forming region 1n from above in a state of selectively covering the silicon film 6a on the device forming region 1p by a mask M6. In this Embodiment 6, P ion implantation is conducted under the conditions at an acceleration energy of about 10–20 KeV and at a dose of about 2 to $8 \times 10^{15}$ atoms/cm². As the mask M6, a photoresist mask formed, for example, by photolithography is used.

Then, after removing the mask M6, as shown in FIG. 42, boron (B) is ion implanted, for example, as impurities for decreasing the resistance value to the silicon film 6a on the device forming region 1p from above in a state of selectively covering the silicon film 6a on the device forming region 1n by a mask M6. In this Embodiment 6, B ion implantation is conducted under the conditions at an acceleration energy of about 5–10 KeV and at a dose of about 1 to $2 \times 10^{15}$ atoms/cm². As the mask M7, a photoresist mask formed, for example, by photolithography is used.

Then, after removing the mask M7, the silicon film 6a is patterned to form gate electrodes 6, as shown in FIG. 43, on the gate insulating film 5 of the device forming regions 1n and 1 p.

Then, impurities ion implanted to the gate electrode 6 (silicon film 6a) (P, B in Embodiment 6) are activated by heat treatment. The heat treatment is applied under the conditions, for example, at 900° C. for 30 sec.

In this process, the impurities in the gate electrode 6 diffuse over the entire gate electrode to lower the resistance of the gate electrode 6.

Further, since Ge as the group IV element identical with the gate electrode 6 is ion implanted to the gate electrode (silicon film 6a), a Si—Ge—X (X: P, B) bond is formed to improve the activation of the impurities in the gate electrode 6 (silicon film 6a) more than in the case of a Si—X bond alone to increase the concentration of impurities contributing to the conduction (the amount of unreacted impurities not bonded with Si is decreased). Since this can reduce the resistance of the gate electrode 6 and suppress the gate depletion, the drain current Ids in the n-type and p-type MISFET can be increased (current driving performance can be improved).

Further, the amorphous portion in the gate electrode formed by Ge ion implantation is recovered into original polycrystal.

Subsequently, the same step as in Embodiment 1 is applied to form the n-type and p-type MISFET.

The step of activating impurities introduced to the silicon film 6a by heat treatment may be conducted before the step of patterning the silicon film 6a to form the gate electrodes 6, or it may be conducted in the step identical with the step of activating the impurities introduced in the step of forming the semiconductor regions (8, 9, 12, 13) by heat treatment.

The Ge ions may be implanted to the silicon film 6a either after the step of ion implanting impurities for reducing the resistance value to the silicon film 6a or after the step of patterning the silicon film 6a to form the gate electrode so long as it is after the step of forming the silicon film 6a and before the step of activating the impurities introduced to the silicon film 6a by the heat treatment.

Embodiment 7

In considering Embodiment 7, the description will be directed to an example of effectively increasing the drain current in a MISFET by Ge ion implantation.

FIG. 44 to FIG. 49 are schematic cross sectional views showing sequential steps in the manufacture of a semiconductor device according to Embodiment 7.

After forming device isolation regions 2, gate insulating films 5, gate electrodes 6, etc. to the main surface of the silicon substrate 1 by using the same process as in Embodiment 1 described above, Ge (germanium) is ion implanted, for example, as the IV group element from the main surface of the silicon substrate to the inside of the device forming regions 1n and 1p thereof, specifically, to portions of the p-well region 4 and the n-well region 3 where the gate electrodes 6 are not formed before the step of forming extension regions of the n-type and p-type MISFET, as shown in FIG. 44. By the Ge ion implantation, an amorphous layer 7 is formed to the device forming regions 1n and 1p of the main surface of the silicon substrate 1 so as to be aligned with the gate electrodes 6. The Ge are ion implanted to a level shallower than the ion implanted depth of the impurities in the step of forming the extension regions of the n-type and p-type MISFET. In Embodiment 6, Ge ions are implanted under the same conditions as those for the Embodiment 1 described above.

Then, as shown in FIG. 45, impurities, for example, As are ion implanted from the main surface of the silicon substrate 1 to the inside of the device forming region 1n, specifically, to a portion of the p-well region 4 where the gate electrode 6 is not formed in a state of selectively covering the device forming region 1p of the main surface of the silicon substrate 1 by a mask M1. By As ion implantation, a pair of n-semiconductor regions (extension regions) 8 are formed so as to be aligned with the gate electrode in the device forming region 1n of the main surface of the silicon substrate 1. In this Embodiment 6, As is ion implanted under the same conditions as those for Embodiment 1 described above.

Then after removing the mask M1, as shown in FIG. 46, impurities, for example, B (boron) or $BF_2$ (boron difluoride) are ion implanted from the main surface of the silicon substrate 1 to the inside of the device forming region 1p, specifically, to a portion of the n-well region 3 where the gate electrode 6 is not formed in a state of selectively covering the device forming region 1n of the main surface of the silicon substrate 1 by a mask M2. By B or $BF_2$ ion implantation, a pair of p-semiconductor regions (extension regions) 9 are formed in the device forming region 1p of the silicon substrate 1 so as to be aligned with the gate electrode 6. In this embodiment, B is ion implanted under the conditions, for example, at an acceleration energy of about 0.2 to 1 KeV and at a dose of about $1 \times 10^{14}$ to $2 \times 10^{15}$ atoms/cm$^2$, and $BF_2$ is ion implanted under the conditions, for example, at an acceleration energy of about 1 to 10 KeV and at a dose of $1 \times 10^{14}$ to $2 \times 10^{15}$ atoms/cm$^2$.

Then, after removing the mask M2, a heat treatment at a low temperature (annealing) is applied to the silicon substrate 1 for the purpose of activating B (boron) or $BF_2$ (boron difluoride) ions implanted mainly in the step of forming the p-semiconductor region 9. The heat treatment is conducted under the conditions, for example, at a temperature of about 700° C. for a heating time of about 60 sec.

In this process, the amorphous layer 7 in the silicon substrate 1 formed by Ge ion implantation is recovered into original single crystals, as shown in FIG. 47. Further, the amorphous portion in the silicon substrate 1 formed by ion implantation of impurities (As, B, $BF_2$) is also recovered into original single crystals, although not completely.

Further, in this process, since Ge as the group IV element identical with that of silicon substrate 1 is ion implanted previously to the device forming regions 1n and 1p to a level shallower than the ion implantation depth of impurities (As, B) in the step of forming the semiconductor regions (8, 9), a Si—Ge—X (X: As, B) bond is formed, and activation of impurities in the silicon substrate 1 is improved more than in the case of a Si—X bond alone, and the concentration of the impurities contributing to the conduction is increased (amount of unreacted impurities not bonded with the Si is decreased). Particularly, the concentration of impurities on the surface of the silicon substrate 1 can be increased. As a result, the resistance of the extension regions (semiconductor regions 8, 9) of the n-type and p-type MISFET, particularly, the resistance on the surface is lowered.

While activation proceeds even at a low temperature, diffusion scarcely proceeds for B (boron) or $BF_2$ (boron difluoride). Activation of B or $BF_2$ can be improved more by low temperature annealing and subsequent annealing at high temperature for a short time compared with a case of annealing at high temperature for a short time. Since activation of B and As in the device forming region 1n scarcely proceeds during low temperature annealing, addition of low temperature annealing scarcely gives undesired effects on the device forming region 1n. Then, with the object of removing organic and inorganic contaminants and obstacles, the silicon substrate 1 is subjected to cleaning. In the cleaning step, the present inventors have found the following problems. That is, in RCA cleaning using ammonia or aqueous hydrogen peroxide as has been used so far, the Si—Ge—X bond region formed on the surface of the extension regions (semiconductor regions, 8, 9) may possibly be scraped off simultaneously with removal of the contaminants or obstacles on the silicon substrate 1. It has been found that this occurs particularly in a case where the concentration of ammonia in the cleaning solution is high. Accordingly, it is necessary to use an RCA cleaning solution with an ammonia concentration in the cleaning solution that is diluted as thin as possible in order to remove the contaminants and obstacles while scraping the Si—Ge—X bond region as little as possible in the process. More preferably, cleaning is conducted by not using RCA cleaning with ammonia and aqueous hydrogen peroxide, but by using an SPM cleaning solution or the like containing aqueous sulfuric acid solution, diluted hydrofluoric acid (HF) and aqueous hydrochloric acid, not containing ammonia.

According to the study of the present inventors, an etch rate to SiGe by RCA cleaning containing ammonia and SPM cleaning not containing ammonia tends to produce a difference of about several tens mm/min compared with an etch rate to Si. That is, RCA cleaning has a greater tendency to scrape the Si—Ge—X bond region compared with SPM cleaning.

With a view toward removal of the obstacles and contaminants, the RCA cleaning has a higher effect than the SPM cleaning. Accordingly, for the cleaning conducted in a state before formation of the Si—Ge—X bond, for example, after the CMP step as shown in FIG. 3 for Embodiment 1, use of the RCA cleaning is more effective since a gate insulating film of preferred film quality can be formed in the subsequent formation of the gate insulating film 5. On the contrary, in a case of conducting cleaning in a state of exposing the extension regions (semiconductor regions 8, 9) forming the Si—Ge—X bond after Ge ion implantation, since there is a concern for scraping the Si—Ge—X bond region upon removal of the contaminants or obstacles, it is necessary for effecting cleaning with a cleaning solution having an ammonia concentration lower than that of the RCA cleaning solution, and, more preferably, by using an SPM cleaning solution or the like, not containing ammonia.

Then, by the same method as in Embodiment 1 described above, side wall spacers 11, and a pair of n-semiconductor region 12 and p-semiconductor region 13 serving as the contact region are formed, as shown in FIG. 48.

Then, impurities (As, B, $BF_2$) ion implanted in the step of forming the n-semiconductor region 8, the step of forming the p-semiconductor region 9, the step of forming the n-semiconductor region 12, and the step of forming the p-semiconductor region 13 are activated by heat treatment. The heat treatment is conducted under the conditions at a higher temperature and for a shorter time than those for the low temperature heat treatment upon forming the extension regions (semiconductor regions 8, 9) described above. Specifically, it is conducted under the same conditions as those for Example 1 (temperature at 1000° C., heating time for 1 sec). By applying the heat treatment at low temperature (first heat treatment) and heat treatment at higher temperature for shorter time (second heat treatment), activation of B or $BF_2$ can be improved more compared with a case of using only high temperature and short time annealing.

Subsequently, the same step as in Embodiment 1 described above is applied to form the n-type and p-type MISFET.

Since scraping of the Si—Ge—X bond region at the surface of the extension region can be suppressed by activating the impurities ion implanted in the step of forming the extension regions (semiconductor regions 8, 9) by a heat treatment (refer to FIG. 47) and then conducting cleaning to the silicon substrate 1 by using a cleaning solution having a reduced ammonia concentration, particularly, by using an aqueous sulfuric acid solution, diluted hydrofluoric acid (HF) and aqueous hydrogen chloride solution, the drain current in MISFET can be increased effectively by Ge ion implantation.

The cleaning step is conducted not only between the steps described for Embodiment 7, but also between various other steps. Accordingly, in a case of forming the Si-G—X bond and then exposing the Si—Ge—X bond region or in a case of removing spontaneous oxide films on the Si—Ge—X bond region, etc, cleaning therefor is preferably conducted by using a cleaning solution with a reduced concentration of ammonia, particularly, by using an aqueous sulfuric acid solution, diluted hydrofluoric acid (HF) and aqueous hydrogen chloride solution. For example, in Embodiment 1 described above, a cleaning step is applied after the step of activating the impurities ion implanted in the step of forming the semiconductor regions (8, 9, 12, 13) by heat treatment (refer to FIG. 11) and before the step of forming a refractory metal film (for example, Co film) for silicidation on the surface of the gate electrode 6 and the semiconductor regions (12, 13)(refer to FIG. 12). Also, in the cleaning between such steps, since scraping of the Si-G—X bond region at the surface of the contact region can be suppressed by using a cleaning solution having a reduced concentration of ammonia, particularly, by using an aqueous sulfuric acid solution, diluted hydrofluoric acid (HF) and aqueous hydrogen chloride solution, coagulation of metal semiconductor reaction (for example, CoSi) caused by unreacted impurities can be suppressed effectively.

Further, in Embodiment 1, a cleaning step is conducted after the step of forming the n-semiconductor region 8 as the extension region (refer to FIG. 5) and before the step of forming the p-type semiconductor region 9 as the extension region, and after the step of forming the p-semiconductor region 9 as the extension region and before the step of forming the side wall spacer 11 (refer to FIG. 7 and FIG. 8). Also, the cleaning between such steps is conducted preferably by using a cleaning solution at a reduced ammonia concentration, particularly, by using an aqueous sulfuric acid solution, a diluted hydrofluoric acid (HF) and an aqueous hydrogen chloride solution.

Further, a cleaning solution having a reduced ammonia concentration than that of the RCA cleaning solution, particularly, an SPM cleaning solution (aqueous sulfuric acid solution, diluted hydrofluoric acid (HF) and aqueous hydrogen chloride solution) can be applied also to Embodiments 1 to 6 described above to obtain similar effects.

In a case of using laser annealing in the step of activating the impurities of the semiconductor region by heat treatment after forming the side wall spacer 11, the rate of activation is increased more in a case of using B (boron) than in a case of using $BF_2$ in the step of forming the extension region of the p-type MISFET.

Further, the laser annealing is applicable also to Embodiments 1 to 6 described above to obtain similar effects.

While the invention made by the present inventors has been described specifically with reference to the embodiments thereof, the invention is not restricted only to the embodiments, but it will be apparent that they may be changed variously within a range not departing the scope thereof.

The invention claimed is:

1. A method of manufacturing a semiconductor device including a field effect transistor comprising the steps of:
    forming a gate electrode by way of a gate insulating film above a main surface of a semiconductor substrate;
    ion implanting first impurities from the main surface of the semiconductor substrate to inside thereof to form a first semiconductor region that is aligned with the gate electrode;
    after the step of forming the gate electrode, ion implanting a group IV element to a level shallower than the implantation depth of the impurities in the step of forming the first semiconductor region from the main surface of the semiconductor substrate to inside thereof,
    forming a side wall spacer to the side wall of the gate electrode after forming the first semiconductor region;
    ion implanting second impurities to the main surface of the semiconductor substrate to form a second semiconductor region so as to be aligned with the side wall spacer,
    wherein the ion implantation for the group IV element is conducted to a level shallower than an implantation depth of the second impurities in the step of forming the second semiconductor region, and
    forming a refractory metal film on the second semiconductor region, then applying a heat treatment for reacting silicon of the second semiconductor region and the metal of the refractory metal film to form a metal semiconductor reaction layer on the second semiconductor region.

2. A method of manufacturing a semiconductor device according claim 1,
    wherein the step of ion implanting the group IV element is a step of forming an amorphous layer at a depth from the main surface of the semiconductor substrate which is shallower than the first semiconductor region.

3. A method of manufacturing a semiconductor device according claim 1, further comprising a step of:
    activating, by a heat treatment, first impurities ion implanted in the step of forming the first semiconductor region after the step of implanting the group IV element and after the step of forming the first semiconductor region.

4. A method of manufacturing a semiconductor device according claim 1,
    wherein the group IV element is Ge ion.

5. A method of manufacturing a semiconductor device according claim 1, further comprising the steps of:
    applying a first heat treatment after the step of forming the first semiconductor region; and
    applying a second heat treatment after the step of forming the second semiconductor region,
    wherein the second heat treatment is conducted at higher temperature for a shorter time than in the first heat treatment.

6. A method of manufacturing a semiconductor device according claim 1, further comprising a step of:
    conducting laser annealing after the step of forming the second semiconductor region,
    wherein the first impurities implanted to the first semiconductor region are boron.

7. A method of manufacturing a semiconductor device according claim 1, further comprising a step of:
    activating the first and the second ion implanted impurities by a heat treatment after forming the second semiconductor region.

8. A method of manufacturing a semiconductor device according to claim 1 comprising a step of:
  ion implanting a second group IV element from the main surface to inside of the semiconductor substrate after the step of forming the side wall spacer and before the step of forming the refractory metal film.

9. A method of manufacturing a semiconductor device including an n-channel conductivity type field effect transistor formed in a first region of a main surface of a semiconductor substrate and a p-channel conductivity type field effect transistor formed in a second region different from the first region of the main surface of the semiconductor substrate, the method comprising the steps of:
  forming a first gate electrode by way of a gate insulating film above the first region of the main surface of the semiconductor substrate and a second gate electrode by way of the gate insulating film above the second region;
  ion implanting first impurities to the first region in a state of selectively masking the second region to form a first semiconductor region which is aligned with the first gate electrode;
  ion implanting second impurities to the second region in a state of selectively masking the first region to form a second semiconductor region which is aligned with the second gate electrode;
  forming side wall spacers to the side walls of the first and the second gate electrodes respectively;
  ion implanting third impurities to the first region in a state of selectively masking the second region to form a third semiconductor region of a conductivity type identical with that of the first semiconductor region and aligned with the side wall spacer on the side wall of the first gate electrode;
  ion implanting fourth impurities to the second region in a state of selectively masking the first region to form a fourth semiconductor region of a conductivity type identical with that of the second semiconductor region and aligned with the side wall spacer on the side wall of the second gate electrode; and further
  after the step of forming the first and the second gate electrodes, ion implanting a group IV element to the first and the second regions to a level shallower than an implantation depth of the respective impurities in the steps of forming the first and the second semiconductor regions.

10. A method of manufacturing a semiconductor device including an n-channel conductivity type field effect transistor formed in a first region of a main surface of a semiconductor substrate and a p-channel conductivity type field effect transistor formed in a second region different from the first region, the method comprising the steps of:
  forming a first gate electrode by way of a gate insulating film above the first region and a second gate electrode by way of a gate insulating film above the second region;
  ion implanting first impurities to the first region in a state of selectively covering the second region with a first mask to form a first semiconductor region which is aligned with the first gate electrode;
  ion implanting second impurities to the second region in a state of selectively covering the first region with a second mask to form a second semiconductor region which is aligned with the second gate electrode;
  forming side wall spacers to the side walls of the first and the second gate electrodes, respectively;
  ion implanting third impurities to the first region in a state of selectively masking the second region to form a third semiconductor region of a conductivity type identical with that of the first semiconductor region and aligned with the side wall spacer on the side wall of the first gate electrode;
  ion implanting fourth impurities to the second region in a state of selectively masking the first region to form a fourth semiconductor region of a conductivity type identical with that of the second semiconductor region and aligned with the side wall spacer on the side wall of the second gate electrode; further
  before ion implantation of the first impurities, ion implanting a group IV element to the first regions to a level shallower than an implantation depth of the first impurities in a state of selectively covering the second region with the first mask; and
  before ion implantation of the second impurities, ion implanting an IV group element to the second region to a level shallower than an implantation depth of the second impurities in a state of selectively covering the first region with the second mask.

11. A method of manufacturing a semiconductor device including an n-channel conductivity type field effect transistor formed in a first region of a main surface of a semiconductor substrate and a p-channel conductivity type field effect transistor formed in a second region different from the first region of the main surface of the semiconductor substrate, the method comprising the steps of:
  forming an insulating film having a stress so as to cover the first gate electrode formed on the first region and a second gate electrode formed on the second region;
  applying anisotropic etching to the insulating film to form a first side wall spacer to the side wall of the first gate electrode and to form a second side wall spacer to the side wall of the second gate electrode; and
  ion implanting a IV group element to the second region in a state of masking the first region to destroy the crystallinity of the second side wall spacer.

12. A method of manufacturing a semiconductor device according to claim 11,
  wherein stress present in the insulating film is a tensile stress and a magnitude of the tensile stress of the first side wall spacer is larger than a magnitude of the tensile stress of the second side wall spacer after the step of ion implanting the group IV element.

13. A method of manufacturing a semiconductor device according to claim 11,
  wherein stress present in the insulating film is a compressive stress and a magnitude of the compressive stress of the first side wall spacer is larger than a magnitude of the compressive stress of the second side wall spacer after the step of ion implanting the group IV element.

14. A method of manufacturing a semiconductor device according to claim 11, further comprising a step of:
  ion implanting impurities to the second region in a state of covering the first region with a mask after the step of forming the first and the second side wall spacers, to form a semiconductor region which is aligned with the second side wall spacer,
  wherein the step of ion implanting the group IV element is conducted using the mask.

15. A method of manufacturing a semiconductor device according to claim 14,
  wherein the ion implantation step for the IV group element is conducted before the ion implantation step for impurities.

16. A method of manufacturing a semiconductor device comprising the steps of:

(a) forming grooves in a semiconductor substrate;
(b) depositing an insulating film on the semiconductor substrate so as to bury an inside of the grooves;
(c) planarizing the semiconductor substrate so as to leave the insulating film in the grooves;
(d) cleaning a surface of the semiconductor substrate after the step (c) described above;
(e) forming a gate insulating film on the semiconductor substrate;
(f) forming a gate electrode on the gate insulating film;
(g) implanting a group IV element into the semiconductor substrate
(h) implanting impurities into the semiconductor substrate; and
(i) cleaning the surface of the semiconductor substrate after the steps (g) and (h),
wherein the cleaning in the step (i) is conducted by using a cleaning solution having a reduced concentration of ammonia as compared to that used for the cleaning in the step (d).

17. A method of manufacturing a semiconductor device according claim 16,
wherein cleaning at the step (i) is conducted by using a cleaning solution having at least one of an aqueous sulfuric acid solution, diluted hydrofluoric acid and aqueous hydrogen chloride solution.

18. A method of manufacturing a semiconductor device according claim 16,
wherein the IV group element is germanium and the impurities are boron, boron difluoride or arsenic.

* * * * *